(12) United States Patent
Na et al.

(10) Patent No.: US 12,080,798 B2
(45) Date of Patent: Sep. 3, 2024

(54) SEMICONDUCTOR DEVICES AND METHODS FOR MANUFACTURING THE SAME

(71) Applicant: Samsung Electronics Co., Ltd., Suwon-si (KR)

(72) Inventors: Chae Ho Na, Changwon-si (KR); Sung Soo Kim, Hwaseong-si (KR); Sun Ki Min, Seoul (KR); Dong Hyun Roh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 460 days.

(21) Appl. No.: 17/667,608

(22) Filed: Feb. 9, 2022

(65) Prior Publication Data
US 2022/0393030 A1    Dec. 8, 2022

(30) Foreign Application Priority Data
Jun. 2, 2021    (KR) .................. 10-2021-0071267

(51) Int. Cl.
*H01L 29/78*    (2006.01)
*H01L 29/417*    (2006.01)

(52) U.S. Cl.
CPC .... *H01L 29/7851* (2013.01); *H01L 29/41791* (2013.01)

(58) Field of Classification Search
CPC ..... H01L 21/823418; H01L 21/823431; H01L 21/823481; H01L 21/823814; H01L 21/823821; H01L 21/823878; H01L 21/845; H01L 27/0886; H01L 27/0924; H01L 27/1211; H01L 29/0649; H01L 29/41791; H01L 29/66795; H01L 29/785; H01L 29/7851; H01L 29/7853; H01L 29/7855; H01L 2029/7858
See application file for complete search history.

(56) References Cited

U.S. PATENT DOCUMENTS

| | | |
|---|---|---|
| 9,385,191 B2 | 7/2016 | Wu et al. |
| 9,443,769 B2 * | 9/2016 | Wang .................. H01L 29/7842 |
| 10,121,675 B2 | 11/2018 | Lee et al. |
| 10,497,628 B2 * | 12/2019 | Chu ................ H01L 21/823878 |
| 10,626,495 B2 | 4/2020 | Cheng et al. |
| 10,854,605 B2 * | 12/2020 | Chiang .......... H01L 21/823821 |
| 10,903,324 B2 | 1/2021 | Noh et al. |
| 10,930,564 B2 | 2/2021 | Wu et al. |

(Continued)

*Primary Examiner* — David C Spalla
(74) *Attorney, Agent, or Firm* — Myers Bigel, P.A.

(57) ABSTRACT

Semiconductor devices and methods of forming the same are provided. The semiconductor devices may include a first fin-type pattern and a second fin-type pattern on a substrate, a first epitaxial pattern on the first fin-type pattern, a second epitaxial pattern on the second fin-type pattern, and a lower field insulating film on the substrate and extends on a sidewall of the first fin-type pattern and a sidewall of the second fin-type pattern, wherein the lower field insulating film includes a protrusion protruding in a third direction. The protrusion of the lower field insulating film may be between the first fin-type pattern and the second fin-type pattern, and a vertical level of a top surface of the protrusion of the lower field insulating film increases and then decreases with increasing distance from the sidewall of the first fin-type pattern.

20 Claims, 43 Drawing Sheets

(56) References Cited

U.S. PATENT DOCUMENTS

| | | | |
|---|---|---|---|
| 2016/0148998 A1* | 5/2016 | Wu | H01L 27/0924 257/369 |
| 2017/0278845 A1* | 9/2017 | Tung | H01L 29/1054 |
| 2021/0013322 A1 | 1/2021 | Xie et al. | |
| 2021/0257261 A1* | 8/2021 | Chu | H01L 29/0847 |
| 2022/0278002 A1* | 9/2022 | Huang | H01L 29/78618 |

* cited by examiner

SEMICONDUCTOR DEVICES AND METHODS FOR MANUFACTURING THE SAME

CROSS-REFERENCE TO RELATED APPLICATION

This application claims priority under 35 U.S.C. 119 to Korean Patent Application No. 10-2021-0071267 filed on Jun. 2, 2021 in the Korean Intellectual Property Office, the disclosure of which is incorporated by reference in its entirety.

BACKGROUND

The present disclosure relates to a semiconductor device and a method for manufacturing the same.

Semiconductor devices may include a multi-gate transistor that includes a multi-channel active pattern (or a silicon body) in a shape of a fin or a nanowire and a gate formed on a surface of the multi-channel active pattern to increase the integration density.

It may be easy to scale down a multi-gate transistor due to its three-dimensional channel. Further, current control capability of a multi-gate transistor may be improved without increasing a gate length. In addition, a multi-gate transistor may effectively suppress SCE (short channel effect) in which a potential of a channel area is affected by drain voltage.

SUMMARY

According to some embodiments of the present invention, semiconductor devices with improved reliability and performance are provided.

According to some embodiments of of the present invention, methods for manufacturing a semiconductor device with improved reliability and performance are provided.

According to some embodiments of the present invention, semiconductor devices may include a first fin-type pattern disposed on a substrate and extending in a first direction, a second fin-type pattern disposed on the substrate, wherein the second fin-type pattern is spaced apart from the first fin-type pattern in a second direction, and extends in the first direction, a first epitaxial pattern disposed on and connected to the first fin-type pattern, a second epitaxial pattern disposed on and connected to the second fin-type pattern, wherein the second epitaxial pattern is spaced apart from the first epitaxial pattern, a lower field insulating film disposed on the substrate so as to extend on (e.g., cover) a sidewall of the first fin-type pattern and a sidewall of the second fin-type pattern, wherein the lower field insulating film includes a protrusion protruding in a third direction, a lower epitaxial etch stop film extending along a top surface of the lower field insulating film, a sidewall of the first epitaxial pattern, and a sidewall of the second epitaxial pattern, an upper field insulating film disposed on the lower epitaxial etch stop film so as to extend on (e.g., cover) a portion of the sidewall of the first epitaxial pattern and a portion of the sidewall of the second epitaxial pattern, an upper epitaxial etch stop film disposed on the upper field insulating film so as to extend along a top surface of the upper field insulating film, and a source/drain contact disposed on and connected to the first epitaxial pattern and the second epitaxial pattern, wherein the protrusion of the lower field insulating film is disposed between the first fin-type pattern and the second fin-type pattern, wherein a vertical level of a top surface of the protrusion of the lower field insulating film increases and then decreases as the protrusion extends away from the sidewall of the first fin-type pattern. In some embodiments, the vertical level of the top surface of the protrusion of the lower field insulating film may increase and then decrease with increasing distance from the sidewall of the first fin-type pattern.

According to some embodiments of the present invention, semiconductor devices may include a first fin-type pattern disposed on a substrate and extending in a first direction, a second fin-type pattern disposed on the substrate, wherein the second fin-type pattern is spaced apart from the first fin-type pattern in a second direction, and extends in the first direction, a first epitaxial pattern disposed on and connected to the first fin-type pattern, a second epitaxial pattern disposed on and connected to the second fin-type pattern, wherein the second epitaxial pattern is spaced apart from the first epitaxial pattern, a lower field insulating film disposed on the substrate so as to extend on (e.g., cover) a sidewall of the first fin-type pattern and a sidewall of the second fin-type pattern, a lower epitaxial etch stop film extending along a top surface of the lower field insulating film, a sidewall of the first epitaxial pattern, and a sidewall of the second epitaxial pattern, a first epitaxial inserted liner disposed between the first epitaxial pattern and the lower epitaxial etch stop film and extending along the sidewall of the first epitaxial pattern, a second epitaxial inserted liner disposed between the second epitaxial pattern and the lower epitaxial etch stop film and extending along the sidewall of the second epitaxial pattern, wherein a thickness of the second epitaxial inserted liner is different from a thickness of the first epitaxial inserted liner, an upper field insulating film disposed on the lower epitaxial etch stop film so as to extend on (e.g., cover) a portion of the sidewall of the first epitaxial pattern and a portion of the sidewall of the second epitaxial pattern, an upper epitaxial etch stop film disposed on the upper field insulating film so as to extend along and on a top surface of the upper field insulating film, and a first source/drain contact disposed on and connected to the first epitaxial pattern, and a second source/drain contact disposed on and connected to the second epitaxial pattern.

According to some embodiments of the present invention, semiconductor devices may include a first fin-type pattern disposed in a pMOS area of a substrate, and extending in a first direction, wherein the first fin-type pattern is defined by a first fin trench, a second fin-type pattern disposed in an nMOS area of the substrate, and spaced apart from the first fin-type pattern in a second direction, wherein the second fin-type pattern extends in the first direction, and is defined by a second fin trench, a first epitaxial pattern disposed on and connected to the first fin-type pattern, a second epitaxial pattern disposed on and connected to the second fin-type pattern, wherein the second epitaxial pattern is spaced apart from the first epitaxial pattern, a lower field insulating film disposed on the substrate so as to extend on (e.g., cover) a sidewall of the first fin-type pattern and a sidewall of the second fin-type pattern, wherein the lower field insulating film includes a protrusion protruding in a third direction, wherein the protrusion of the lower field insulating film is disposed between the first fin-type pattern and the second fin-type pattern, a lower epitaxial etch stop film extending along a top surface of the lower field insulating film, a sidewall of the first epitaxial pattern, and a sidewall of the second epitaxial pattern, an upper field insulating film disposed on the lower epitaxial etch stop film so as to extend on (e.g., cover) a portion of the sidewall of the first epitaxial pattern and a portion of the sidewall of the second epitaxial pattern, an upper epitaxial etch stop film disposed on the upper field insulating film so as to extend along and on a top surface of the upper field insulating film, and a source/drain contact disposed on and connected to the first epitaxial pattern and the second epitaxial pattern, wherein the source/drain contact includes a first portion overlapping the first epitaxial pattern in a vertical direction and a second portion overlapping the second epitaxial pattern in a vertical direction (e.g., the third direction), wherein a vertical dimension from a bottom surface of the first fin trench to a bottom surface of the first portion of the source/drain contact in an area overlapping the first fin-type pattern is greater than a vertical dimension from a bottom surface of the second fin trench to a bottom surface of the second portion of the source/drain contact in an area overlapping the second fin-type pattern. In some embodiments, the source/drain contact may include a third portion overlapping the first fin-type pattern in the third direction and a fourth portion overlapping the second fin-type pattern in a vertical direction, and a distance in the third direction from the bottom surface of the first fin trench to a bottom surface of the third portion of the source/drain contact may be greater than a distance in the third direction from the bottom surface of the second fin trench to a bottom surface of the fourth portion of the source/drain contact.

According to some embodiments of the present invention, semiconductor devices may include a first epitaxial pattern and a second epitaxial pattern disposed in a first area of a substrate, wherein the first epitaxial pattern and the second epitaxial pattern are spaced apart from each other by a first spacing, a third epitaxial pattern and a fourth epitaxial pattern disposed in a second area of the substrate, wherein the third epitaxial pattern and the fourth epitaxial pattern are spaced apart from each other by a second spacing, a first lower field insulating film disposed in the first area of the substrate and including a first protrusion protruding in a thickness direction of the substrate, a second lower field insulating film disposed in the second area of the substrate and including a second protrusion protruding in the thickness direction of the substrate, a first lower epitaxial etch stop film extending along a top surface of the first lower field insulating film, a second lower epitaxial etch stop film extending along a top surface of the second lower field insulating film, a first upper field insulating film disposed on the first lower epitaxial etch stop film so as to extend on (e.g., cover) a portion of a sidewall of the first epitaxial pattern and a portion of a sidewall of the second epitaxial pattern, a second upper field insulating film disposed on the second lower epitaxial etch stop film so as to extend on (e.g., cover) a portion of a sidewall of the third epitaxial pattern and a portion of a sidewall of the fourth epitaxial pattern, a first upper epitaxial etch stop film extending along a top surface of the first upper field insulating film, the sidewall of the first epitaxial pattern, and the sidewall of the second epitaxial pattern, and contacting the first upper field insulating film, a second upper etch stop film extending along a top surface of the second upper field insulating film, the sidewall of the third epitaxial pattern, and the sidewall of the fourth epitaxial pattern, and contacting the second upper field insulating film, a first source/drain contact connected to the first epitaxial pattern and the second epitaxial pattern; and a second source/drain contact connected to the third epitaxial pattern and the fourth epitaxial pattern, wherein each of the first epitaxial pattern and the second epitaxial pattern includes a facet intersecting point at which increase in a width thereof as each of the first epitaxial pattern and the second epitaxial pattern extends away from the substrate is transitioned to decrease in the width thereof as each of the first epitaxial pattern and the second epitaxial pattern extends away from the substrate, wherein the first spacing is smaller than the second spacing, wherein a depth from the facet intersecting point of the first epitaxial pattern to the top surface of the first upper field insulating film is smaller than the depth from the facet intersecting point of the second epitaxial pattern to the top surface of the second upper field insulating film. In some embodiments, the facet intersecting point may be a point at which a lower sidewall and an upper sidewall thereof converge outwardly, and a distance in the thickness direction of the substrate from the facet intersecting point of the first epitaxial pattern to the top surface of the first upper field insulating film may be smaller than a distance in the thickness direction of the substrate from the facet intersecting point of the second epitaxial pattern to the top surface of the second upper field insulating film.

According to some embodiments of the present invention, methods for manufacturing a semiconductor device may include forming, on a substrate, a first fin-type pattern and a second fin-type pattern, such that each of the first fin-type pattern and the second fin-type pattern protrudes upward beyond a top surface of the lower field insulating film, etching a portion of the first fin-type pattern, and then forming a first epitaxial pattern connected to the first fin-type pattern, etching a portion of the second fin-type pattern, and then forming a second epitaxial pattern connected to the second fin-type pattern, forming a lower epitaxial etch stop film along the top surface of the lower field insulating film, a profile of the first epitaxial pattern, and a profile of the second epitaxial pattern, forming, on the lower epitaxial etch stop film, an upper field insulating film extending on (e.g., covering) a portion of the lower epitaxial etch stop film, forming an upper epitaxial etch stop film along a top surface of the upper field insulating film and a remainder profile of the lower epitaxial etch stop film, and forming a source/drain contact such that the source/drain contact extends through the upper epitaxial etch stop film and the lower epitaxial etch stop film and is connected to the first epitaxial pattern and the second epitaxial pattern, wherein after the first epitaxial pattern and the second epitaxial pattern are formed, the lower field insulating film includes a protrusion protruding in a thickness direction of the substrate.

Purposes according to the present invention are not limited to the above-mentioned purpose. Other purposes and advantages according to the present invention that are not mentioned may be understood based on following descriptions and may be more clearly understood based on example embodiments according to the present invention. Further, it will be easily understood that the purposes and advantages according to the present invention may be realized using means shown in the claims and combinations thereof.

BRIEF DESCRIPTION OF DRAWINGS

The above and other aspects and features of the present invention will become more apparent by describing in detail example embodiments thereof with reference to the attached drawings, in which.

DETAILED DESCRIPTION

Figure 1:
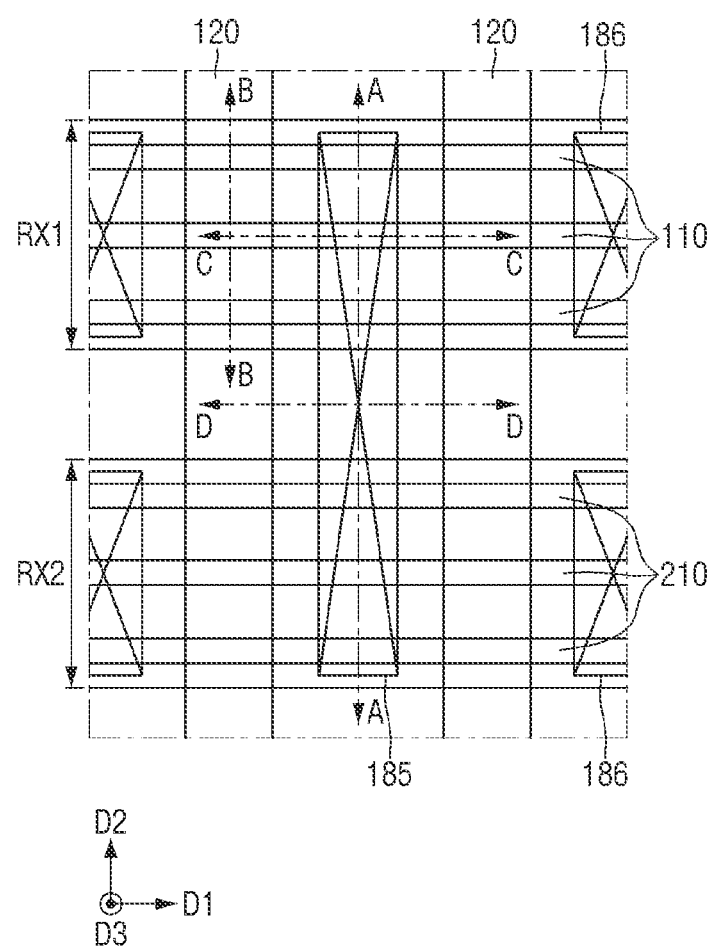
FIGS. 1, 2, 3, 4, 5 and 6 are diagrams illustrating a semiconductor device according to some embodiments of the present invention.

For simplicity and clarity of illustration, elements in the drawings are not necessarily drawn to scale. The same reference numbers in different drawings represent the same or similar elements, and as such perform similar functionality. Further, descriptions and details of well-known steps and elements may be omitted for simplicity of the description. Furthermore, in the following detailed description of the present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention. Examples of various embodiments are illustrated and described further below. It will be understood that the description herein is not intended to limit the claims to the specific embodiments described. On the contrary, it is intended to cover alternatives, modifications, and equivalents as may be included within the scope of the present invention as defined by the appended claims.

A shape, a size, a ratio, an angle, a number, etc. disclosed in the drawings are provided as examples and illustrative, and the present invention is not limited thereto.

The terminology used herein is for the purpose of describing particular embodiments only and is not intended to limit the present invention. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, operations, elements, and/or components, but do not preclude the presence or addition of one or more other features, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present invention.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on (e.g., physically contact), connected to (e.g., physically connected and/or electrically connected), or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter, and another layer, film, region, plate, or the like is not disposed between the former and the latter. Further, as used herein, when a layer, film, region, plate, or the like may be disposed "below" or "under" another layer, film, region, plate, or the like, the former may directly contact the latter or another layer, film, region, plate, or the like may be disposed between the former and the latter. As used herein, when a layer, film, region, plate, or the like is directly disposed "below" or "under" another layer, film, region, plate, or the like, the former directly contacts the latter, and another layer, film, region, plate, or the like is not disposed between the former and the latter.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present invention may be partially or entirely combined with each other and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction D1", "second direction D2" and "third direction D3" should not be interpreted only to have a geometric relationship in which the first direction, the second direction, and the third direction are perpendicular to each other. The "first direction D1", "second direction D2" and "third direction D3" may be interpreted to have a broader direction within a range in which components herein may work functionally.

As used herein, an element or region that is "covering" or "surrounding" or "filling" another element or region may completely or partially cover or surround or fill the other element or region.

Hereinafter, example embodiments of the present invention will be described with reference to the drawings.

In the drawings of semiconductor devices according to some embodiments of the present invention, a fin-type transistor (FinFET) including a channel area of a fin-type pattern shape, a transistor including a nanowire or a nanosheet, a MBCFET™ (a Multi-Bridge Channel Field Effect Transistor) or a vertical transistor (a vertical FET) is shown by way of example. The present invention is not limited thereto. In some embodiments, semiconductor devices may include a tunneling transistor (a tunneling FET,) or a 3D transistor. In some embodiments, semiconductor devices may include a planar transistor. In addition, the technical idea of the present invention may be applied to transistors (2D material based FETs) based on a 2D material and a heterostructure thereof.

Further, semiconductor devices according to some embodiments of the present invention may include a bipolar junction transistor, a lateral double diffusion transistor (LDMOS) and/or the like.

FIG. 1 to FIG. 6 are diagrams illustrating a semiconductor device according to some embodiments of the present invention. For convenience of description, interlayer insulating films 191, 192, and 193 and line structures 205 and 215 are not shown in FIG. 1.

For reference, FIG. 1 is a layout diagram illustrating a semiconductor device according to some embodiments. FIG. 2, FIG. 4 to FIG. 6 are cross-sectional views taken along lines A-A, B-B, C-C and D-D of FIG. 1, respectively. FIG. 3 is an enlarged view of a portion P of FIG. 2.

Referring to FIG. 1 to FIG. 6, the semiconductor device according to some embodiments may include a first fin-type pattern 110, a second fin-type pattern 210, a first lower field insulating film 105, a first upper field insulating film 106, a first gate electrode 120, a first epitaxial pattern 150, a second epitaxial pattern 250, a first lower epitaxial etch stop film 194, a first upper epitaxial etch stop film 195, and a first connective source/drain contact 185. As used herein, "fin-type pattern" and "fin-shaped pattern" may be used interchangeably.

The substrate 100 may be made of bulk silicon or SOI (silicon-on-insulator). In some embodiments, the substrate 100 may be embodied as a silicon substrate or may be made of a material other than silicon, such as silicon germanium, SGOI (silicon germanium on insulator), indium antimonide, lead telluride, indium arsenide, indium phosphide, gallium arsenide and/or gallium antimonide, but may not limited thereto.

The first fin-type pattern 110 may be disposed on the substrate 100. The first fin-type pattern 110 may be formed in a first active area RX1 of the substrate 100. The first fin-type pattern 110 may extend in an elongate manner along a first direction D1. In some embodiments, the first fin-type pattern 110 may extend longitudinally in the first direction D1 as illustrated in FIG. 1. The first fin-type pattern 110 may be defined by a first fin trench FT1 extending in the first direction D1. The first fin trench FT1 may define a sidewall 110sw of the first fin-type pattern. As used herein, "an element A extends in a direction X" (or similar language) may mean that the element A extends longitudinally in the direction X.

The second fin-type pattern 210 may be disposed on the substrate 100. The second fin-type pattern 210 may be formed in a second active area RX2 of the substrate 100. The second fin-type pattern 210 may extend in an elongate manner along the first direction D1. In some embodiments, the second fin-type pattern 210 may extend longitudinally in the first direction D1 as illustrated in FIG. 1. The second fin-type pattern 210 may be defined by a second fin trench FT2 extending in the first direction D1. The second fin trench FT2 may define a sidewall 210sw of the second fin-type pattern. The second fin-type pattern 210 may be spaced apart from the first fin-type pattern 110 in the second direction D2. In this connection, the first direction D1 may intersect the second direction D2 and a third direction D3. Further, the second direction D2 may intersect with the third direction D3. The third direction D3 may be a direction substantially perpendicular to a top surface of the substrate 100 or may be a thickness direction of the substrate 100. In some embodiments, both the first direction D1 and the second direction D2 may be parallel to the top surface of the substrate 100.

The first active area RX1 and the second active area RX2 may be defined by a deep trench DT deeper than the first fin trench FT1 and the second fin trench FT2. For example, the deep trench DT may extend in an elongate manner in the first direction D1. The deep trench DT may be formed between the first fin-type pattern 110 and the second fin-type pattern 210. In the semiconductor device according to some embodiments, the deep trench DT may distinguish the first active area RX1 and the second active area RX2 from each other.

In some embodiments, one of the first active area RX1 and the second active area RX2 may be an NMOS constituting area, and the other may be a PMOS constituting area.

In some embodiments, each of the first active area RX1 and the second active area RX2 may be a PMOS constituting area. In some embodiments, each of the first active area RX1 and the second active area RX2 may be a NMOS constituting area.

In some embodiments, the first active area RX1 may be an NMOS constituting area, and the second active area RX2 may be a PMOS constituting area.

Each of the first fin-type pattern 110 and the second fin-type pattern 210 may be a portion of the substrate 100 or may include an epitaxial layer grown from the substrate 100. Each of the first fin-type pattern 110 and the second fin-type pattern 210 may include, for example, silicon and/or germanium as an elemental semiconductor material. In some embodiments, each of the first fin-type pattern 110 and the second fin-type pattern 210 may include a compound semiconductor, for example, a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto. The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other. In some embodiments, the first fin-type pattern 110 and the second fin-type pattern 210 may include the same material. In some embodiments, the first fin-type pattern 110 and the second fin-type pattern 210 may include different materials.

Although FIG. 1 shows that the number of the first fin-type patterns 110 disposed in the first active area RX1 is the same as the number of the second fin-type patterns 210 disposed in the second active area RX2, the present invention is not limited thereto. Further, although FIG. 1 shows that each of the number of the first fin-type patterns 110 disposed in the first active area RX1 and the number of the second fin-type patterns 210 disposed in the second active area RX2 is three, the present invention is not limited thereto.

The first lower field insulating film 105 may be formed on the substrate 100. The first lower field insulating film 105 may fill the deep trench DT. The first lower field insulating film 105 may fill a portion of the first fin trench FT1 and a portion of the second fin trench FT2.

The first lower field insulating film 105 may be disposed around the first fin-type pattern 110 and the second fin-type pattern 210. The first lower field insulating film 105 may cover at least a portion of a sidewall of the first fin-type pattern 110 and at least a portion of a sidewall of the second fin-type pattern 210. Each of a portion of the first fin-type pattern 110 and a portion of the second fin-type pattern 210 may protrude upward beyond a top surface of the first lower field insulating film 105.

The first lower field insulating film 105 may fill a portion of the first fin trench FT1, a portion of the second fin trench FT2, and the deep trench DT. For example, the first lower field insulating film 105 may be formed on a portion of the substrate 100 overlapping the first gate electrode 120 in the third direction D3. Further, the first lower field insulating film 105 may be further formed on a portion of the substrate 100 between the first gate electrodes 120. The first lower field insulating film 105 may be disposed between the first fin-type patterns 110 adjacent to each other in the second direction D2 and between the second fin-type patterns 210 adjacent to each other in the second direction D2. As used herein, "an element A overlapping an element B in a direction X" (or similar language) means that there is at least one line that extends in the direction X and intersects both the elements A and B.

The first lower field insulating film 105 may include a first protrusion 105PP protruding in the third direction D3. The first lower field insulating film 105 may include a first area 105R1 and a second area 105R2 respectively disposed on both opposing sides of the first protrusion 105PP of the first lower field insulating film. The first protrusion 105PP of the first lower field insulating film may be disposed between the first fin-type pattern 110 and the second fin-type pattern 210. The first protrusion 105PP of the first lower field insulating film may be disposed in a position overlapping a bottom surface of the deep trench DT in the third direction D3.

A top surface 105us of the first lower field insulating film may include a portion having a concave shape and a portion having a convex shape. Each of a top surface 105R1_us of a first area of the first lower field insulating film and a top surface 105R2_us of a second area of the first lower field insulating film may have a concave shape. A top surface 105PP_us of the first protrusion 105PP of the first lower field insulating film may have a convex shape.

The top surface 105R1_us of the first area of the first lower field insulating film may be gradually away from the sidewall 110sw of the first fin-type pattern as a vertical level of the top surface 105R1_us of the first area 105R1 of the first lower field insulating film is lowered. As the top surface 105PP_us of the first protrusion 105PP of the first lower field insulating film 105 extends away from the sidewall 110sw of the first fin-type pattern, a vertical level of the top surface 105PP_us of the first protrusion 105PP of the first lower field insulating film 105 may increase and then decrease. As the top surface 105R2_us of the second area 105R2 of the first lower field insulating film extends away from the sidewall 210sw of the second fin-type pattern, a vertical level of the top surface 105R2_us of the second area 105R2 of the first lower field insulating film may be lowered. For example, the change in the vertical level of the top surface 105PP_us of the first protrusion of the first lower field insulating film may be measured based on a bottom surface of each of the first and second fin trenches FT1 and FT2 or a bottom surface of the deep trench DT. As used herein, "a vertical level of a surface A" may refer to a height of the surface A above the bottom surface of the deep trench DT in the third direction D3.

Figure 2:
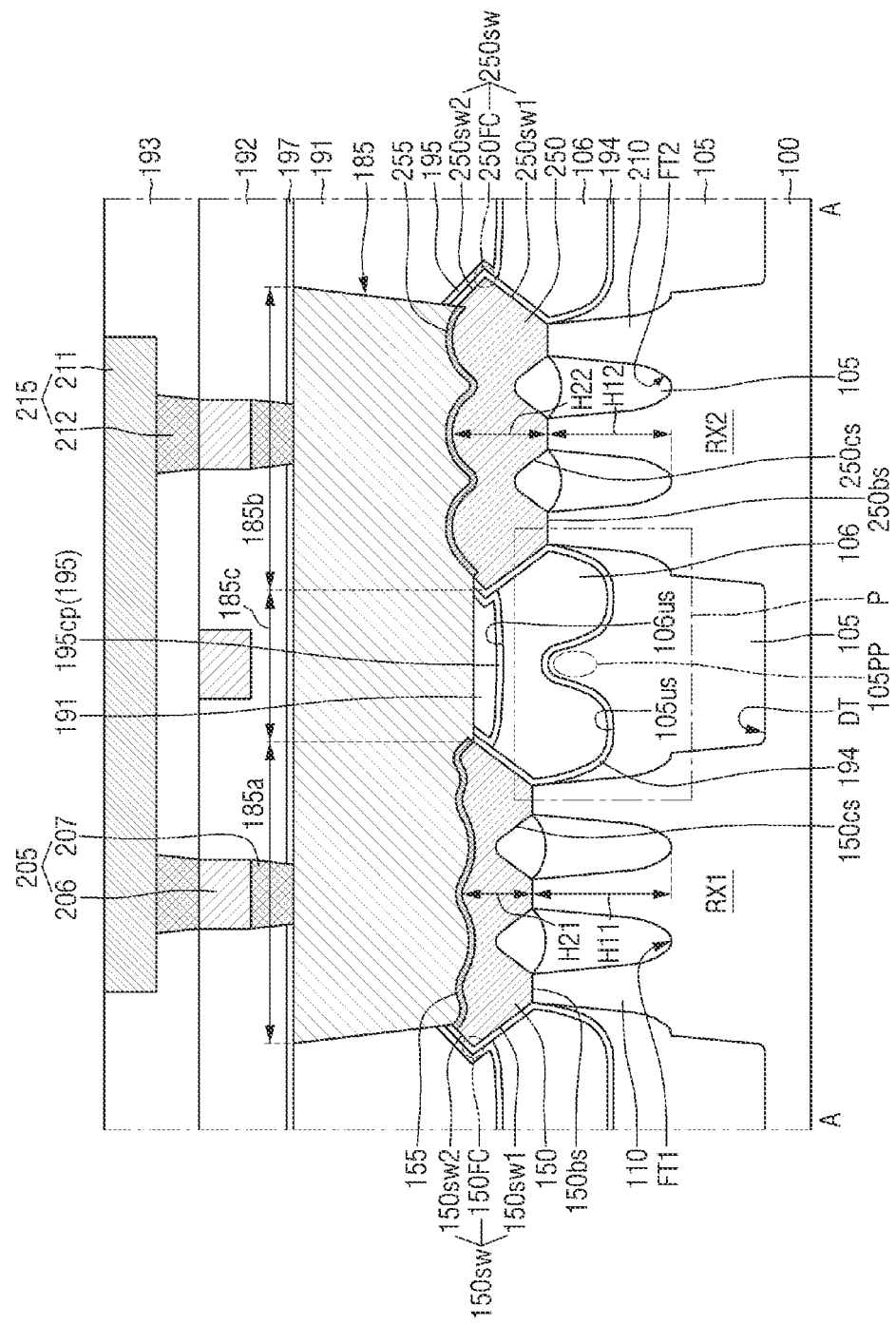
Figure 3:
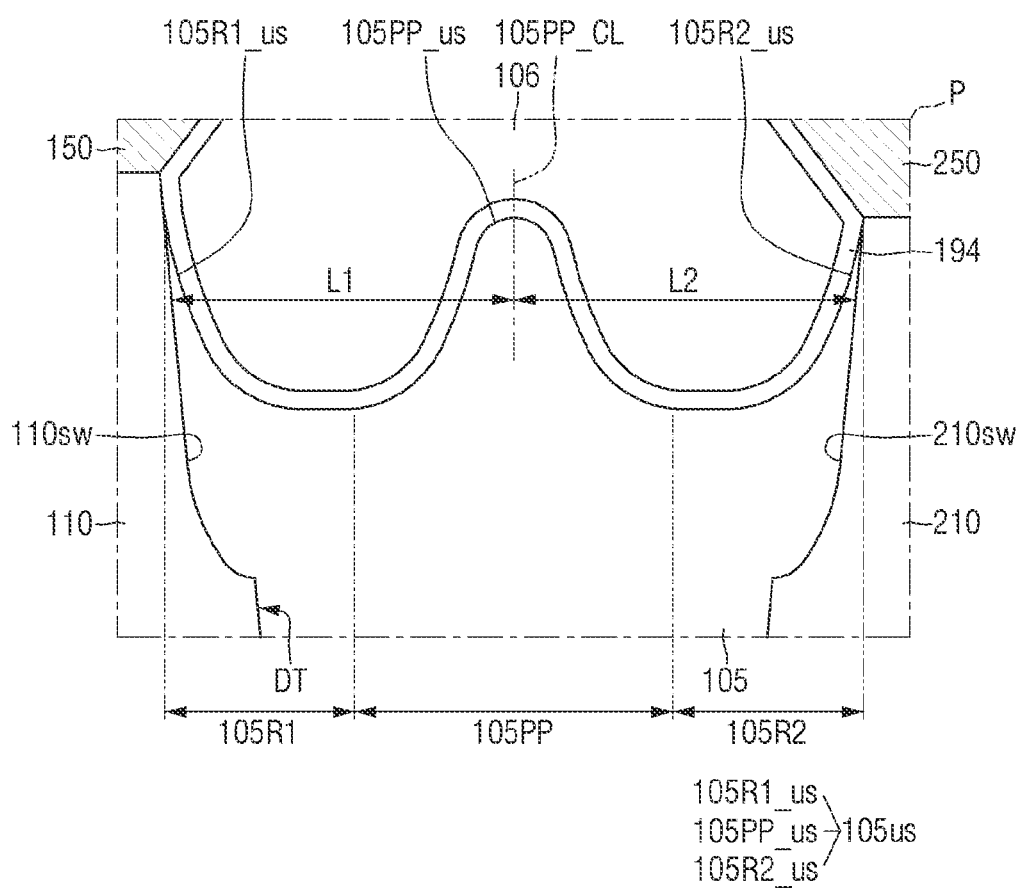

In some embodiments, a height of the top surface 105R1_us of the first area 105R1 of the first lower field insulating film 105 from the bottom surface of the deep trench DT in the third direction D3 may decrease as a distance from the sidewall 110sw of the first fin-type pattern 110 increases, and a height of the top surface 105R2_us of the second area 105R2 of the first lower field insulating film 105 from the bottom surface of the deep trench DT in the third direction D3 may decrease as a distance from the sidewall 210sw of the second fin-type pattern 210 increases as illustrated in FIG. 2. In some embodiments, a height of the top surface 105PP_us of the first protrusion 105PP of the first lower field insulating film 105 from the bottom surface of the deep trench DT in the third direction D3 may increase and then decrease as a distance from the sidewall 110sw of the first fin-type pattern 110 increase as illustrated in FIG. 2.

The first protrusion 105PP of the first lower field insulating film may have a width central line 105PP_CL. The width central line 105PP_CL of the first protrusion may pass through a topmost portion (e.g., a topmost end) of the top surface 105PP_us of the first protrusion 105PP of the first lower field insulating film. The topmost portion of the top surface 105PP_us of the first protrusion 105PP of the first lower field insulating film may be the highest point in the vertical level of the top surface 105PP_us of the first protrusion 105PP of the first lower field insulating film. The width central line 105PP_CL of the first protrusion may be parallel to the third direction D3. When the topmost portion of the top surface 105PP_us of the first protrusion 105PP of the first lower field insulating film is flat, the width central line 105PP_CL of the first protrusion may pass through a center point of the topmost portion of the top surface 105PP_us of the first protrusion 105PP of the first lower field insulating film.

In the semiconductor device according to some embodiments, a spacing L1 between the width central line 105PP_CL of the first protrusion and the sidewall 110sw of the first fin-type pattern may be equal to a spacing L2 between the width central line 105PP_CL of the first protrusion and the sidewall 210sw of the second fin-type pattern. As used herein, the term "spacing" may be interchangeable with "distance."

The first lower epitaxial etch stop film 194 may be disposed on the first lower field insulating film 105. The first lower epitaxial etch stop film 194 may extend along the top surface 105us of the first lower field insulating film 105. Description of the first lower epitaxial etch stop film 194 will be detailed later.

The first upper field insulating film 106 may be disposed on the first lower epitaxial etch stop film 194. The first upper field insulating film 106 may be formed on a portion of the substrate 100 between the first gate electrodes 120. However, the first upper field insulating film 106 may not be formed on a portion of the substrate 100 overlapping the first gate electrode 120 in the third direction D3.

The first lower field insulating film 105 and the first upper field insulating film 106 may be disposed on both opposing sides of the first active area RX1 in which the first fin-type pattern 110 is formed. Further, the first lower field insulating film 105 and the first upper field insulating film 106 may be disposed on both opposing sides of the second active area RX2 in which the second fin-type pattern 210 is formed. However, following descriptions will focus on each of the first lower field insulating film 105 and the first upper field insulating film 106 located between the first active area RX1 and the second active area RX2.

Each of the first lower field insulating film 105 and the first upper field insulating film 106 may include, for example, an oxide-based material, a nitride-based material, an oxynitride-based material, or a combination thereof. Hereinafter, an example in which each of the first lower field insulating film 105 and the first upper field insulating film 106 includes an oxide-based insulating material will be described.

In some embodiments, a concentration of fluorine (F) contained in the first upper field insulating film 106 may be greater than a concentration of fluorine (F) contained in the first lower field insulating film 105. For example, the first lower field insulating film 105 may not contain fluorine, and the first upper field insulating film 106 may contain fluorine.

When the first upper field insulating film 106 contains fluorine, the concentration of fluorine therein may decrease as the film 106 extends away from the first lower epitaxial etch stop film 194. In some embodiments, both the first upper field insulating film 106 and the first lower field insulating film 105 may not contain fluorine (F).

The first gate electrode 120 may be disposed on the first lower field insulating film 105. The first gate electrode 120 may not be disposed on the first upper field insulating film 106. The first gate electrode 120 may extend in the second direction D2. Adjacent first gate electrodes 120 may be spaced apart from each other in the first direction D1.

The first gate electrode 120 may intersect each of the first fin-type pattern 110 and the second fin-type pattern 210. The first gate electrode 120 may be disposed on a portion of each of the first fin-type pattern 110 and the second fin-type pattern 210. The first gate electrode 120 may cover a portion each of the first fin-type pattern 110 and the second fin-type pattern 210 protruding upward beyond a top surface of the first lower field insulating film 105.

The first gate electrode 120 may include, for example, at least one of titanium nitride (TiN), tantalum carbide (TaC), tantalum nitride (TaN), titanium silicon nitride (TiSiN), tantalum silicon nitride (TaSiN), or tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof.

Unlike the drawing, the first gate electrode 120 may include a first portion intersecting the first fin-type pattern 110 and a second portion intersecting the second fin-type pattern 210. In such a case, a gate division pattern for dividing the first gate electrode 120 into the two portions may be disposed between the first portion of the first gate electrode 120 and the second portion of the first gate electrode 120.

A portion of the first upper field insulating film 106 between the first gate electrodes 120 adjacent in the second direction D2 may protrude in the third direction D3 beyond a bottom surface of the first gate electrode 120. A vertical level of a portion of the top surface 106us of the first upper field insulating film disposed between the first gate electrodes 120 based on the top surface of the substrate 100 may be higher than that of the bottom surface of the first gate electrode 120 based on the top surface of the substrate 100. As used herein, "a surface or level V is higher than a surface or level W" (or similar language) means that the surface or level W is closer than the surface or level V to the substrate 100.

Figure 4:
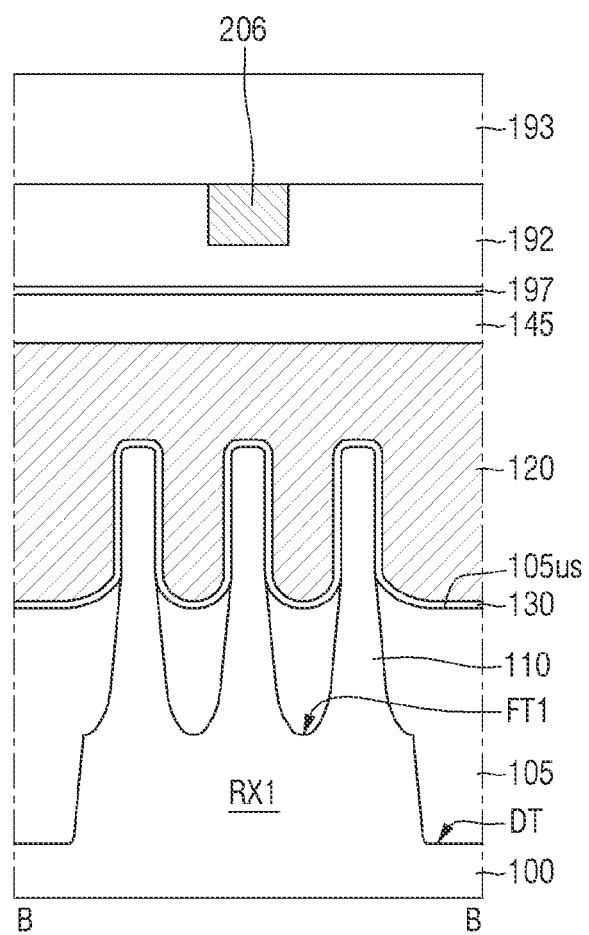

For example, the first protrusion 105PP of the first lower field insulating film 105 may be formed in a process of forming the first epitaxial pattern 150 and the second epitaxial pattern 250. In FIG. 2 and FIG. 4, the first protrusion 105PP of the first lower field insulating film is not disposed in area overlapping the first gate electrode 120 in the third direction D3.

A gate spacer 140 may be disposed on a sidewall of the first gate electrode 120. The gate spacer 140 may extend in the second direction D2. The gate spacer 140 may include, for example, at least one of silicon nitride (SiN), silicon oxynitride (SiON), silicon oxide (SiO$_2$), silicon oxycarbonitride (SiOCN), silicon boron nitride (SiBN), silicon boron oxynitride (SiOBN), silicon oxycarbide (SiOC), and combinations thereof.

The gate insulating film 130 may extend along a sidewall and a bottom surface of the first gate electrode 120. The gate insulating film 130 may be disposed between the first gate electrode 120 and the first fin-type pattern 110, between the first gate electrode 120 and the second fin-type pattern 210, and between the first gate electrode 120 and the first lower field insulating film 105. The gate insulating film 130 may be disposed between the first gate electrode 120 and the gate spacer 140. Because the first gate electrode 120 does not overlap the first upper field insulating film 106 in the third direction D3, the gate insulating film 130 may be disposed between the first gate electrode 120 and the first lower field insulating film 105.

The gate insulating film 130 may include silicon oxide, silicon oxynitride, silicon nitride, or a high dielectric constant material having a higher dielectric constant than that of silicon oxide. The high dielectric constant material may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some embodiments may include an NC (negative capacitance) FET using a negative capacitor. For example, the gate insulating film 130 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on which ferroelectric material the ferroelectric material film includes.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain 3 to 8 at % (atomic %) of aluminum. In this connection, a content of the dopant may be a content of aluminum based on a sum of hafnium and aluminum.

When the dopant is silicon (Si), the ferroelectric material film may contain 2 to 10 at % of silicon. When the dopant is yttrium (Y), the ferroelectric material film may contain 2 to 10 at % yttrium. When the dopant is gadolinium (Gd), the ferroelectric material film may contain 1 to 7 at % gadolinium. When the dopant is zirconium (Zr), the ferroelectric material film may contain 50 to 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide, the present invention is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of 0.5 to 10 nm, the present invention is not limited thereto. Because a critical thickness exhibiting the ferroelectric properties may be vary based on a type of the ferroelectric material, the thickness of the ferroelectric material film may vary depending on the type of the ferroelectric material.

In some embodiments, the gate insulating film 130 may include one ferroelectric material film. In some embodiments, the gate insulating film 130 may include a plurality of ferroelectric material films spaced apart from each other. The gate insulating film 130 may have a stack structure in which a plurality of ferroelectric material films and a plurality of paraelectric material films are alternately stacked with each other.

A gate capping pattern 145 may be disposed on a top surface of the first gate electrode 120 and a top surface of the gate spacer 140. The gate capping pattern 145 may include, for example, at least one of silicon nitride (SiN), silicon oxynitride (SiON), silicon oxide (SiO$_2$), silicon carbonitride (SiCN), silicon oxycarbonitride (SiOCN), and combinations thereof. Unlike the drawings, the gate capping pattern 145 may be disposed between the gate spacers 140. In such a case, a top surface of the gate capping pattern 145 may be coplanar with a top surface of the gate spacer 140.

The first epitaxial pattern 150 may be disposed on the first fin-type pattern 110. The first epitaxial pattern 150 may be disposed between the first gate electrodes 120 adjacent to each other in the first direction D1. The first epitaxial pattern 150 may be connected to the first fin-type pattern 110. The first epitaxial pattern 150 may be disposed in the first active area RX1.

The second epitaxial pattern 250 may be disposed on the second fin-type pattern 210. The second epitaxial pattern 250 may be disposed between the first gate electrodes 120 adjacent to each other in the first direction D1. The second epitaxial pattern 250 may be connected to the second fin-type pattern 210. The second epitaxial pattern 250 may be disposed in the second active area RX2. The second epitaxial pattern 250 is spaced apart from the first epitaxial pattern 150 in the second direction D2. That is, the second epitaxial pattern 250 is not directly connected to the first epitaxial pattern 150.

Because the first epitaxial pattern 150 is connected to a plurality of first fin-type patterns 110, while the second epitaxial pattern 250 is connected to a plurality of second fin-type patterns 210, each of the first epitaxial pattern 150 and the second epitaxial pattern 250 may be a shared epitaxial pattern.

The first epitaxial pattern 150 and the second epitaxial pattern 250 may be respectively included in a source/drain of a transistor using the first fin-type pattern 110 and the second fin-type pattern 210 as a channel area.

The first epitaxial pattern 150 may include a bottom surface 150bs, a sidewall 150sw, and a connective surface 150cs. The first epitaxial pattern 150 may be connected to the first fin-type pattern 110 via the bottom surface 150bs of the first epitaxial pattern. The connective surface 150cs of the first epitaxial pattern may be disposed between and connected to portions the bottom surface 150bs of the first epitaxial pattern.

In some embodiments, the sidewall 150sw of the first epitaxial pattern may extend in the third direction D3. The sidewall 150sw of the first epitaxial pattern may be directly connected to the bottom surface 150bs of the first epitaxial pattern. The sidewall 150sw of the first epitaxial pattern may include a lower sidewall 150sw1, an upper sidewall 150sw2, and a facet intersecting point 150FC.

The lower sidewall 150sw1 of the first epitaxial pattern may be directly connected to the bottom surface 150bs of the first epitaxial pattern. The facet intersecting point 150FC of the first epitaxial pattern may refer to a point where the lower sidewall 150sw1 of the first epitaxial pattern and the upper sidewall 150sw2 of the first epitaxial pattern contact each other. A width of the first epitaxial pattern 150 in the second direction D2 in an area defined by the lower sidewall 150sw1 of the first epitaxial pattern may increase as the first epitaxial pattern 150 extends away from the substrate 100 (e.g., as a distance from the substrate 100 increases). A width of the first epitaxial pattern 150 in the second direction D2 in an area defined by the upper sidewall 150sw2 of the first epitaxial pattern may decrease as the first epitaxial pattern 150 extends away from the substrate 100 (e.g., as a distance from the substrate 100 increases). The facet intersecting point 150FC of the first epitaxial pattern may refer a point at which the increase in the width of the first epitaxial pattern 150 in the second direction D2 is transitioned to the decrease in the width of the first epitaxial pattern 150 in the second direction D2 as the first epitaxial pattern 150 extends away from the substrate 100 (e.g., as a distance from the substrate 100 increases). The facet intersecting point 150FC of the first epitaxial pattern 150 may refer to a point at which the lower sidewall 150sw1 and the upper sidewall 150sw2 of the first epitaxial pattern 150 converge outwardly as illustrated in FIG. 2. As illustrated in FIG. 2, in some embodiments, the facet intersecting point 150FC of the first epitaxial pattern 150 may protrude outwardly with respect to an center of the first epitaxial pattern 150 in the second direction D2.

The second epitaxial pattern 250 may include a bottom surface 250bs, a sidewall 250sw, and a connective surface 250cs. The second epitaxial pattern 250 may be connected to the second fin-type pattern 210 via the bottom surface 250bs of the second epitaxial pattern. The connective surface 250cs of the second epitaxial pattern may be disposed between and be connected to portions of the bottom surface 250bs of the second epitaxial pattern.

In some embodiments, the sidewall 250sw of the second epitaxial pattern may extend in the third direction D3. The sidewall 250sw of the second epitaxial pattern may be directly connected to the bottom surface 250bs of the second epitaxial pattern. The sidewall 250sw of the second epitaxial pattern may include a lower sidewall 250sw1, an upper sidewall 250sw2, and a facet intersecting point 250FC.

The lower sidewall 250sw1 of the second epitaxial pattern may be directly connected to the bottom surface 250bs of the second epitaxial pattern. The facet intersecting point 250FC of the second epitaxial pattern may refer to a point where the lower sidewall 250sw1 of the second epitaxial pattern and the upper sidewall 150sw2 of the second epitaxial pattern contact each other. A width of the second epitaxial pattern 250 in the second direction D2 in an area defined by the lower sidewalls 250sw1 of the second epitaxial pattern may increase as the second epitaxial pattern 250 extends away from the substrate 100 (e.g., as a distance from the substrate 100 increases). A width of the second epitaxial pattern 250 in the second direction D2 in an area defined by the upper sidewall 250sw2 of the second epitaxial pattern may decrease as the second epitaxial pattern 250 extends away from the substrate 100 (e.g., as a distance from the substrate 100 increases). The facet intersecting point 250FC of the second epitaxial pattern may refer to a point where the increase in the width of the second epitaxial pattern 250 in the second direction D2 is transitioned to the decrease as the second epitaxial pattern 250 extends away from the substrate 100 (e.g., as a distance from the substrate 100 increases). The facet intersecting point 250FC of the second epitaxial pattern may refer to a point at which the lower sidewall 250sw1 of the second epitaxial pattern and the upper sidewall 150sw2 of the second epitaxial pattern converge outwardly.

In some embodiments, a gap (e.g., an air gap) may be formed in each of a space between the first lower field insulating film 105 and the connective surface 150cs of the first epitaxial pattern and a space between the first lower field insulating film 105 and the connective surface 250cs of the second epitaxial pattern. In some embodiments, an insulating material may fill a space between the first lower field insulating film 105 and the connective surface 150cs of the first epitaxial pattern and a space between the first lower field insulating film 105 and the connective surface 250cs of the second epitaxial pattern. As used herein, "gap" may be, for example, any void or cavity, and may be a gap filled with air (e.g., an air gap), a gap filled with an inert gas or gases (e.g., an inert gas gap), a gap defining a vacuum (e.g., a vacuum gap), etc.

In FIG. 2 and FIG. 3, the first lower field insulating film 105 may cover a sidewall of the first fin-type pattern 110 and a sidewall of the second fin-type pattern 210. However, the first lower field insulating film 105 may not cover the sidewall 150sw of the first epitaxial pattern and the sidewall 250sw of the second epitaxial pattern.

The first lower epitaxial etch stop film 194 may extend along the top surface 105us of the first lower field insulating film, a portion of the sidewall 150sw of the first epitaxial pattern, and a portion of the sidewall 250sw of the second epitaxial pattern. The first lower epitaxial etch stop film 194 may cover at least a portion of the lower sidewall 150sw1 of the first epitaxial pattern and at least a portion of the lower sidewall 250sw1 of the second epitaxial pattern. In the semiconductor device according to some embodiments, the first lower epitaxial etch stop film 194 may cover a portion of the upper sidewall 150sw2 of the first epitaxial pattern and a portion of the upper sidewall 250sw2 of the second epitaxial pattern. In some embodiments, the first lower epitaxial etch stop film 194 may have a uniform thickness as illustrated in FIGS. 2 and 3.

The first upper field insulating film 106 may cover a portion of the sidewall 150sw of the first epitaxial pattern and a portion of the sidewall 250sw of the second epitaxial pattern. The first upper field insulating film 106 may cover at least a portion of the lower sidewall 150sw1 of the first epitaxial pattern and at least a portion of the lower sidewall 250sw1 of the second epitaxial pattern. In the semiconductor device according to some embodiments, the first upper field insulating film 106 does not cover the upper sidewall 150sw2 of the first epitaxial pattern and the upper sidewall 250sw2 of the second epitaxial pattern.

For example, a vertical level of the top surface 106us of the first upper field insulating film 106 based on the top surface of the substrate 100 may be higher than that of each of the bottom surface 150bs of the first epitaxial pattern and the bottom surface 250bs of the second epitaxial pattern based on the top surface of the substrate 100. More specifically, the vertical level of the top surface 106us of the first upper field insulating film 106 disposed between the first epitaxial pattern 150 and the second epitaxial pattern 250 may be higher than that of each of the bottom surface 150bs of the first epitaxial pattern and the bottom surface 250bs of the second epitaxial pattern. In this connection, a top surface of the substrate 100 may be the bottom surface of the deep trench DT.

In the semiconductor device according to some embodiments, a vertical level of the top surface 106us of the first upper field insulating film may be lower than or equal to that of each of the facet intersecting point 150FC of the first epitaxial pattern and the facet intersecting point 250FC of the second epitaxial pattern. For example, the top surface 106us of the first upper field insulating film 106 disposed between the first epitaxial pattern 150 and the second epitaxial pattern 250 may have a concave shape. In some embodiments, the first upper field insulating film 106 may include the top surface 106us that is recessed toward the substrate 100 as illustrated in FIG. 2.

In the semiconductor device according to some embodiments, a vertical dimension H11 from a bottom surface of the first fin trench FT1 to the bottom surface 150bs of the first epitaxial pattern may be larger than a vertical dimension H12 from a bottom surface of the second fin trench FT2 to the bottom surface 250bs of the second epitaxial pattern. A vertical dimension from the bottom surface of the first fin trench FT1 to the facet intersecting point 150FC of the first epitaxial pattern may be different from a vertical dimension from the bottom surface of the second fin trench FT2 to the facet intersecting point 250FC of the second epitaxial pattern. For example, the vertical dimension from the bottom surface of the first fin trench FT1 to the facet intersecting point 150FC of the first epitaxial pattern may be larger than the vertical dimension from the bottom surface of the second fin trench FT2 to the facet intersecting point 250FC of the second epitaxial pattern. As used herein, "vertical dimension" may refer to a distance or a thickness in a vertical direction.

The first upper epitaxial etch stop film 195 may extend along the top surface 106us of the first upper field insulating film, the sidewall 150sw of the first epitaxial pattern, and the sidewall 250sw of the second epitaxial pattern. The first upper epitaxial etch stop film 195 may be in contact with the first upper field insulating film 106. For example, the first upper epitaxial etch stop film 195 may contact the top surface 106us of the first upper field insulating film. In some embodiments, the first upper epitaxial etch stop film 195 may have a uniform thickness as illustrated in FIG. 2.

A vertical level of the top surface 106us of the first upper field insulating film based on the top surface of the substrate 100 may be higher than that of each of the bottom surface 150bs of the first epitaxial pattern and the bottom surface 250bs of the second epitaxial pattern. A vertical level of the first upper epitaxial etch stop film 195 may be higher than that of each of the bottom surface 150bs of the first epitaxial pattern and the bottom surface 250bs of the second epitaxial pattern.

When the first upper field insulating film 106 covers a portion of the lower sidewall 150sw1 of the first epitaxial pattern and a portion of the lower sidewall 250sw1 of the second epitaxial pattern, the first upper epitaxial etch stop film 195 may extend along a portion of the lower sidewall 150sw1 of the first epitaxial pattern and a portion of the lower sidewall 250sw1 of the second epitaxial pattern. The first upper epitaxial etch stop film 195 may be in contact with a portion of the first lower epitaxial etch stop film 194 not covered with the first upper field insulating film 106.

In some embodiments, the first upper epitaxial etch stop film 195 may include a connective portion 195cp extending along the top surface 106us of the first upper field insulating film disposed between the first epitaxial pattern 150 and the second epitaxial pattern 250. When the first upper field insulating film 106 covers a portion of the lower sidewall 150sw1 of the first epitaxial pattern and a portion of the lower sidewall 250sw1 of the second epitaxial pattern, the connective portion 195cp of the first upper epitaxial etch stop film may include a portion extending along the sidewall 150sw of the first epitaxial pattern and the sidewall 250sw of the second epitaxial pattern, and a portion extending along a sidewall of the gate spacer 140. However, in following descriptions, the connective portion 195cp of the first upper epitaxial etch stop film may refer to only a portion in contact with the top surface 105us of the first field insulating film except for a portion extending along each of the sidewall 150sw of the first epitaxial pattern and the sidewall 250sw of the second epitaxial pattern, and a portion extending along the sidewall of the gate spacer 140.

In some embodiments, the first upper epitaxial etch stop film 195 between the first epitaxial pattern 150 and the second epitaxial pattern 250 may include the connective portion 195cp of the first upper epitaxial etch stop film extending along the top surface 106us of the first upper field insulating film and the sidewall 150sw of the first epitaxial pattern, a first extension extending along the sidewall 150sw of the first epitaxial pattern 150, and a second extension extending along the sidewall 250sw of the second epitaxial pattern 250. The connective portion 195cp of the first upper epitaxial etch stop film is directly connected to the first extension and the second extension.

Figure 6:
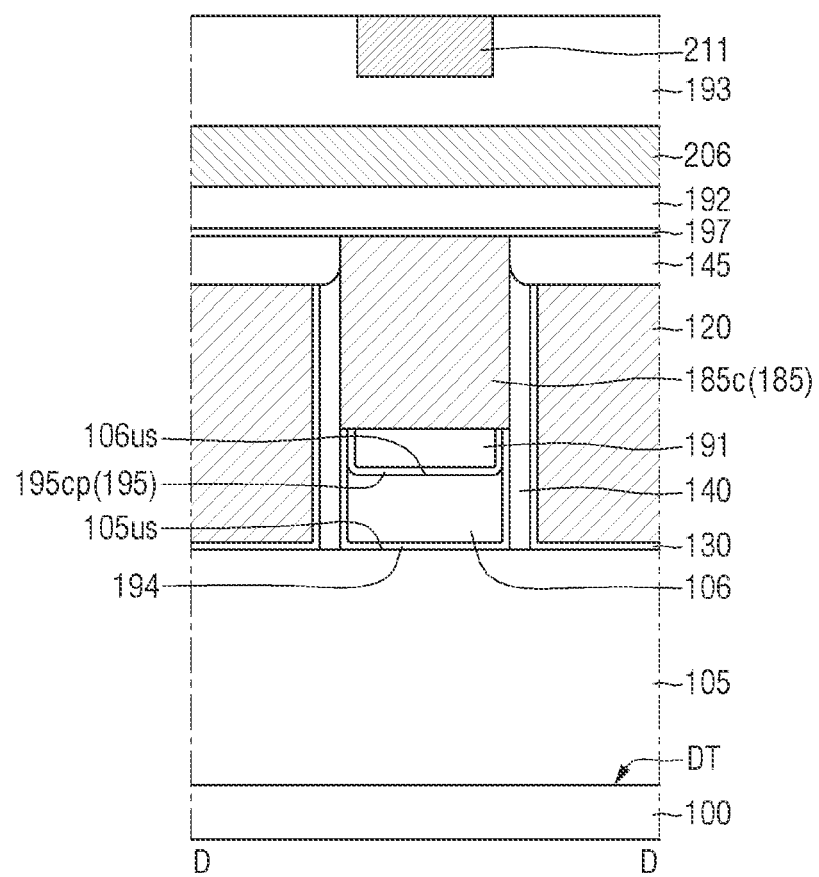

In FIG. 6, a vertical level of the top surface 106us of the first upper field insulating film disposed between the first gate electrodes 120 based on the top surface of the substrate 100 may be higher than that of a bottom surface of the first gate electrode 120 based on the top surface of the substrate 100, so that a vertical level of the first upper epitaxial etch stop film 195 may be higher than a vertical level of a bottom surface of the first gate electrode 120.

The first lower epitaxial etch stop film 194 may include, for example, at least one of silicon oxide (SiO$_2$), silicon nitride (SiN), silicon oxynitride (SiON), silicon oxycarbonitride (SiOCN), silicon boron nitride (SiBN), silicon boron oxynitride (SiOBN), silicon oxycarbide (SiOC), and combinations thereof. When the first lower epitaxial etch stop film 194 includes silicon oxide, nitrogen (N) may be present along a boundary of the first lower epitaxial etch stop film 194 and the first upper field insulating film 106. The nitrogen present along an interface between the first lower epitaxial etch stop film 194 and the first upper field insulating film 106 may be adsorbed in a process of forming the first upper field insulating film 106. When each of the first lower field insulating film 105 and the first lower epitaxial etch stop film 194 includes an oxide-based insulating material, the interface between the first lower field insulating film 105 and the first lower epitaxial etch stop film 194 may not be distinguished from each other and/or may not be visible. However, the interface between the first lower field insulating film 105 and the first upper field insulating film 106 may be distinguished based on the nitrogen (N) present along the boundary.

The first upper epitaxial etch stop film 195 may include a material having an etching selectivity with respect to the first interlayer insulating film 191 to be described later. The first upper epitaxial etch stop film 195 may include, for example, at least one of silicon nitride (SiN), silicon oxynitride (SiON), silicon oxycarbonitride (SiOCN), silicon boron nitride (SiBN), silicon boron oxynitride (SiOBN), silicon oxycarbide (SiOC), and combinations thereof.

For example, the first lower epitaxial etch stop film 194 may contain fluorine (F) which may be adsorbed in the process of forming the first upper field insulating film 106. A concentration of fluorine contained in the first lower epitaxial etch stop film 194 may be greater than a concentration of fluorine contained in the first upper epitaxial etch stop film 195. Further, a concentration of fluorine contained in the first lower epitaxial etch stop film 194 may be greater than a concentration of fluorine contained in the first upper field insulating film 106.

The first interlayer insulating film 191 may be disposed on the first upper epitaxial etch stop film 195. A top surface of the first interlayer insulating film 191 may be coplanar with a top surface of the gate capping pattern 145.

The first connective source/drain contact 185 may be disposed on each of the first epitaxial pattern 150 and the second epitaxial pattern 250. A first source/drain contact 186 may be disposed on one of the first epitaxial pattern 150 and the second epitaxial pattern 250. In other words, the first connective source/drain contact 185 may be connected to both the first epitaxial pattern 150 and the second epitaxial pattern 250. However, the first source/drain contact 186 may be connected to one of the first epitaxial pattern 150 and the second epitaxial pattern 250. Following description is based on the first connective source/drain contact 185.

A first silicide film 155 may be formed between the first connective source/drain contact 185 and the first epitaxial pattern 150. The second silicide film 255 may be formed between the first connective source/drain contact 185 and the second epitaxial pattern 250.

The first connective source/drain contact 185 may be formed on and along the first epitaxial pattern 150 and the second epitaxial pattern 250 and on and along a portion between the first epitaxial pattern 150 and the second epitaxial pattern 250. For example, the first connective source/drain contact 185 may include a first sub-contact portion 185a, a second sub-contact portion 185b, and a first contact connective portion 185c. The first sub-contact portion 185a may overlap the first epitaxial pattern 150 in the third direction D3 or the vertical direction. The second sub-contact portion 185b may overlap the second epitaxial pattern 250 in the third direction D3 or the vertical direction. The first contact connective portion 185c directly connects the first sub-contact portion 185a and the second sub-contact portion 185b to each other. The first contact connective portion 185c does not overlap each of the first epitaxial pattern 150 and the second epitaxial pattern 250 in the vertical direction.

For example, a bottom surface of the first contact connective portion 185c may be spaced apart from the connective portion 195cp of the first upper epitaxial etch stop film in the third direction D3. A portion of the first interlayer insulating film 191 may be interposed between the first contact connective portion 185c and the connective portion 195cp of the first upper epitaxial etch stop film. The first upper epitaxial etch stop film 195 between the first epitaxial pattern 150 and the second epitaxial pattern 250 may contact the first contact connective portion 185c, while a bottom surface of the first contact connective portion 185c does not directly contact the connective portion 195cp of the first upper epitaxial etch stop film.

Figure 5:
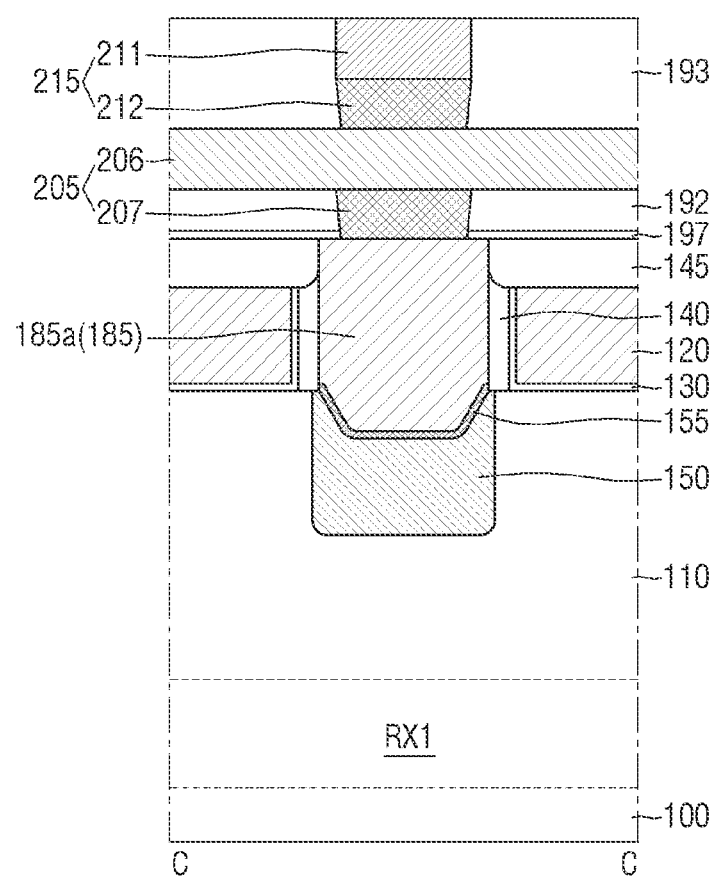

For example, a top surface of the first connective source/drain contact 185 may flush with the top surface of the first interlayer insulating film 191. Further, the top surface of the first connective source/drain contact 185 may be flush with the top surface of the gate capping pattern 145. In some embodiments, the top surface of the first connective source/drain contact 185 may be coplanar with the top surface of the first interlayer insulating film 191 as illustrated in FIG. 2, and the top surface of the first connective source/drain contact 185 may be coplanar with the top surface of the gate capping pattern 145 as illustrated in FIG. 5.

Each of the bottom surfaces of the first sub-contact portion 185a and the second sub-contact portion 185b are illustrated as having a wavy shape. The present invention is not limited thereto.

In the semiconductor device according to some embodiments, a vertical dimension H12+H22 from the bottom surface of the second fin trench FT2 to the bottom surface of the second sub-contact portion 185b in an area overlapping the second fin-type pattern 210 may be larger than a vertical dimension H11+H21 from the bottom surface of the first fin trench FT1 to the bottom surface of the first sub-contact portion 185a in an area overlapping the first fin-type pattern 110.

Because the vertical dimension H11 from the bottom surface of the first fin trench FT1 to the bottom surface 150bs of the first epitaxial pattern is larger than the vertical dimension H12 from the bottom surface of the second fin trench FT2 to the bottom surface 250bs of the second epitaxial pattern, a vertical dimension H22 from the bottom surface 250bs of the second epitaxial pattern to the bottom surface of the second sub-contact portion 185b in an area overlapping the second fin-type pattern 210 may be larger than a vertical dimension H21 from the bottom surface 150bs of the first epitaxial pattern to the bottom surface of the first sub-contact portion 185a in an area overlapping the first fin-type pattern 110. For example, the vertical dimension H21 from the bottom surface 150bs of the first epitaxial pattern to the bottom surface of the first sub-contact portion 185a may be measured at a center point of a width in the second direction D2 of the bottom surface 150bs of the first epitaxial pattern.

Each of the first connective source/drain contact 185 and the first source/drain contact 186 may include a conductive material, for example, at least one of a metal, a metal nitride, a metal carbonitride, a two-dimensional material, and a conductive semiconductor material. Although the first connective source/drain contact 185 is shown as a single film, this is only for convenience of illustration. The present invention is not limited thereto. In some embodiments, each of the first connective source/drain contact 185 and the first source/drain contact 186 may include a contact barrier film and a contact filling film filling a space defined by the contact barrier film. In some embodiments, each of the first connective source/drain contact 185 and the first source/drain contact 186 may be free of the contact barrier film and include only the contact filling film. Each of the first silicide film 155 and the second silicide film 255 may include, for example, a metal silicide material.

The second interlayer insulating film 192 may be disposed on the first interlayer insulating film 191. An upper etch stop film 197 may be disposed between the first interlayer insulating film 191 and the second interlayer insulating film 192. The upper etch stop film 197 may be disposed on the gate capping pattern 145 and the first connective source/drain contact 185. The upper etch stop film 197 may include a material having an etching selectivity with respect to the second interlayer insulating film 192. The upper etch stop film 197 may include, for example, at least one of silicon nitride (SiN), silicon oxynitride (SiON), silicon oxycarbonitride (SiOCN), silicon boron nitride (SiBN), silicon boron oxynitride (SiOBN), silicon oxycarbide (SiOC), aluminum oxide (A10), aluminum nitride (AlN) and aluminum oxycarbonate (AlOC) and combinations thereof. Unlike illustrated, the upper etch stop film 197 may not be formed.

The first line structure 205 may be formed in the second interlayer insulating film 192 and the upper etch stop film 197. The first line structure 205 may include a first electrical line 206 and a first via 207. The first electrical line 206 may be disposed at a first metal level. The first line structure 205 may include the first electrical line 206 connected to the first connective source/drain contact 185. The first connective source/drain contact 185 may be connected to two first electrical lines 206 disposed at a first metal level. The first electrical line 206 may be connected to the first connective source/drain contact 185 via the first via 207. The first electrical line 206 and the first via 207 may be formed using different manufacturing processes. An interface between the first electrical line 206 and the first via 207 may be defined and/or may be visible. Unlike the illustration, the first electrical line 206 and the first via 207 may have an integral or monolithic structure. In such a case, the boundary between the first electrical line 206 and the first via 207 may not be defined and/or may not be visible.

The third interlayer insulating film 193 may be disposed on the second interlayer insulating film 192. The third interlayer insulating film 193 may be disposed on the first line structure 205.

Each of the first interlayer insulating film 191, the second interlayer insulating film 192, and the third interlayer insulating film 193 may include, for example, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or combinations thereof. The present invention is not limited thereto.

The second line structure 215 may be formed in the third interlayer insulating film 193. The second line structure 215 may include a second electrical line 211 and a second via 212. The second electrical line 211 may be disposed at a second metal level higher than the first metal level.

The second line structure 210 may include the second electrical line 211 connected to the first electrical line 206. The second electrical line 211 may be connected to the first electrical line 206 via the second via 212. The second electrical line 211 and the second via 212 may be formed using different manufacturing processes. A boundary between the second electrical line 211 and the second via 212 may be defined and/or may be visible. Unlike the illustration, the second electrical line 211 and the second via 212 may have an integral or monolithic structure. In such a case, the boundary between the second electrical line 211 and the second via 212 may not be defined and/or may not be visible.

Each of the first electrical line 206, the first via 207, the second electrical line 211, and the second via 212 may include a conductive material, for example, at least one of a metal, a metal nitride, a metal carbonitride, a two-dimensional material, and a conductive semiconductor material.

Figure 7:
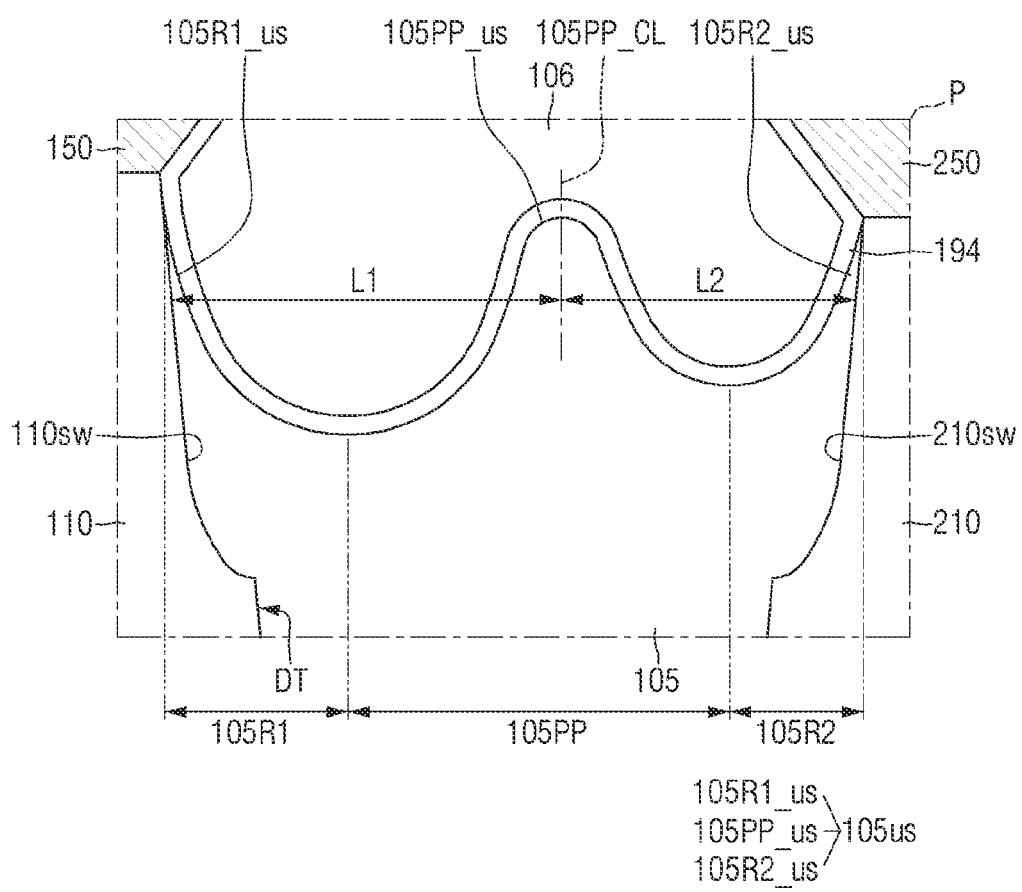
FIGS. 7 and 8 are diagrams illustrating semiconductor devices according to some embodiments of the present invention.
Figure 8:
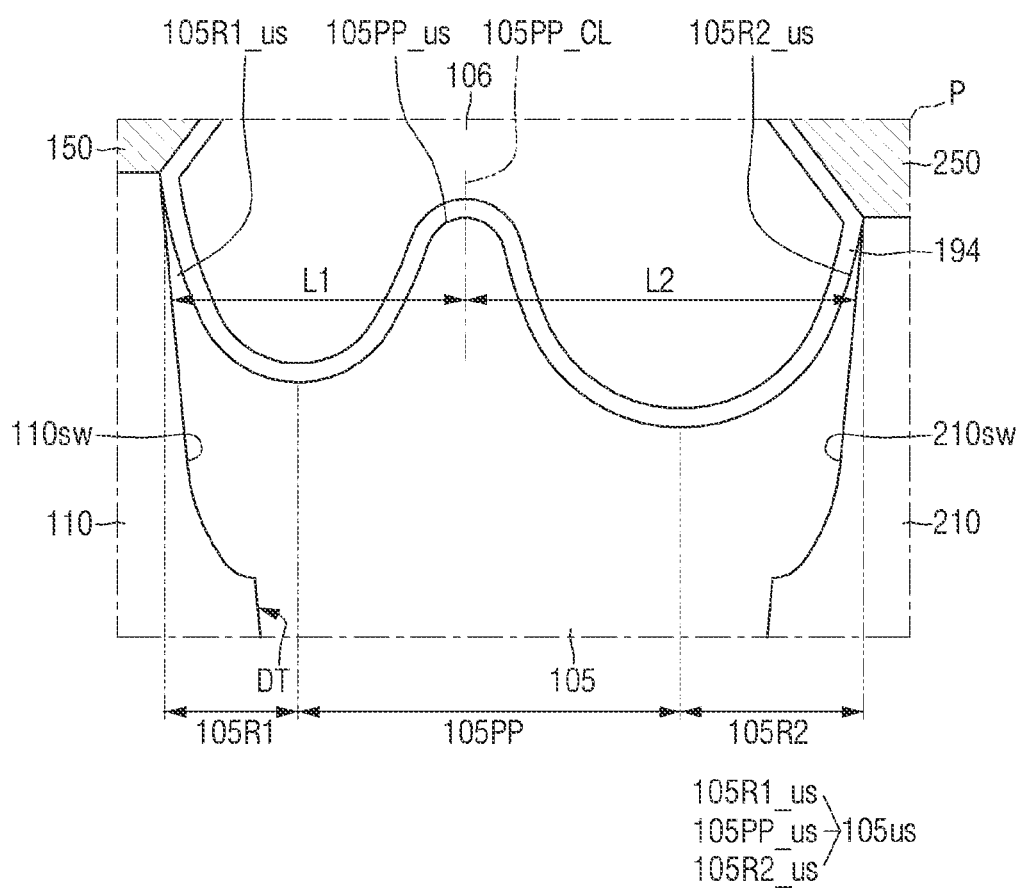

FIGS. 7 and 8 are diagrams illustrating semiconductor devices according to some embodiments of the present invention. For convenience of description, following descriptions may focus on differences different from the configurations described using FIGS. 1 to 6.

Referring to FIG. 7, in the semiconductor device according to some embodiments, the first protrusion 105PP of the first lower field insulating film may be closer to the second fin-type pattern 210 than the first fin-type pattern 110.

When the first active area RX1 acts as an NMOS constituting area and the second active area RX2 acts as a PMOS constituting area, the first protrusion 105PP of the first lower field insulating film may be closer to the PMOS constituting area. A spacing L1 between the width central line 105PP_CL of the first protrusion and the sidewall 110sw of the first fin-type pattern may be larger than a spacing L2 between the width central line 105PP_CL of the first protrusion and the sidewall 210sw of the second fin-type pattern.

Referring to FIG. 8, in the semiconductor device according to some embodiments, the first protrusion 105PP of the first lower field insulating film may be closer to the first fin-type pattern 110 than the second fin-type pattern 210.

When the first active area RX1 acts as an NMOS constituting area and the second active area RX2 acts as a PMOS constituting area, the first protrusion 105PP of the first lower field insulating film may be closer to the NMOS constituting area. The spacing L1 between the width central line 105PP_CL of the first protrusion and the sidewall 110sw of the first fin-type pattern may be smaller than the spacing L2 between the width central line 105PP_CL of the first protrusion and the sidewall 210sw of the second fin-type pattern.

Figure 9:
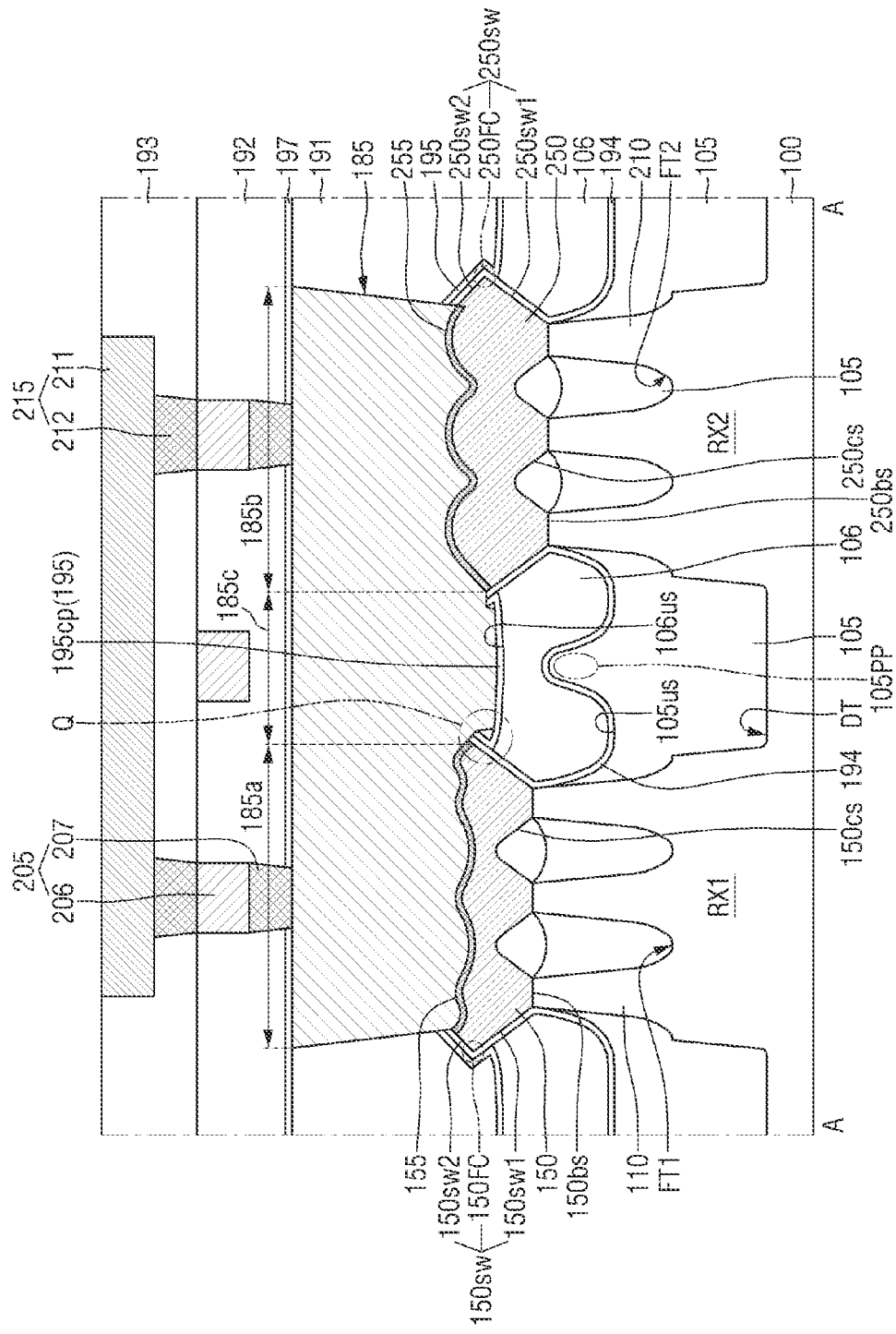
FIGS. 9, 10 and 11 are diagrams illustrating semiconductor devices according to some embodiments of the present invention.
Figure 10:
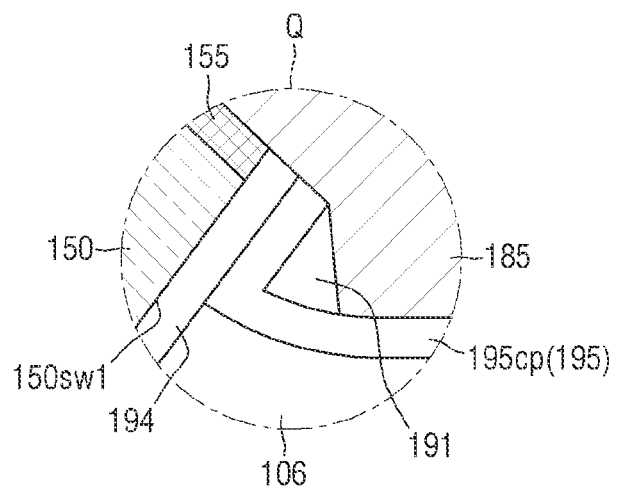
Figure 11:
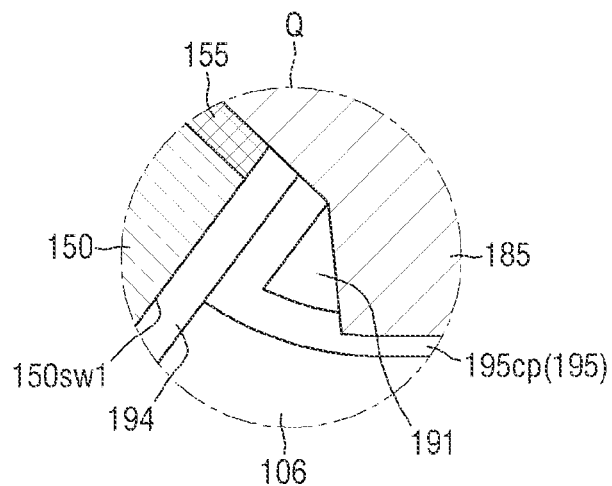
Figure 12:
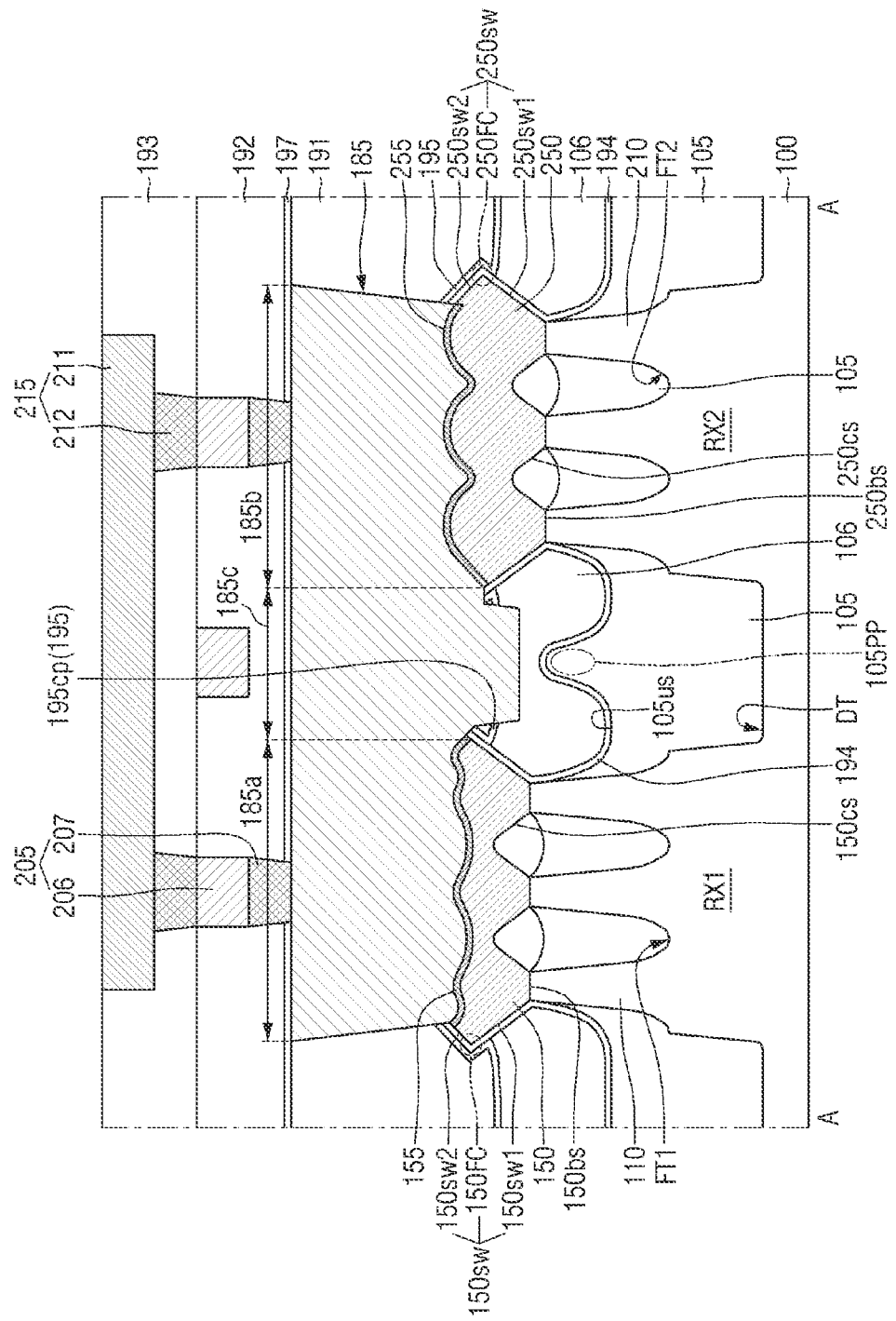
FIG. 12 and FIG. 13 are diagrams illustrating semiconductor devices according to some embodiments of the present invention.
Figure 13:
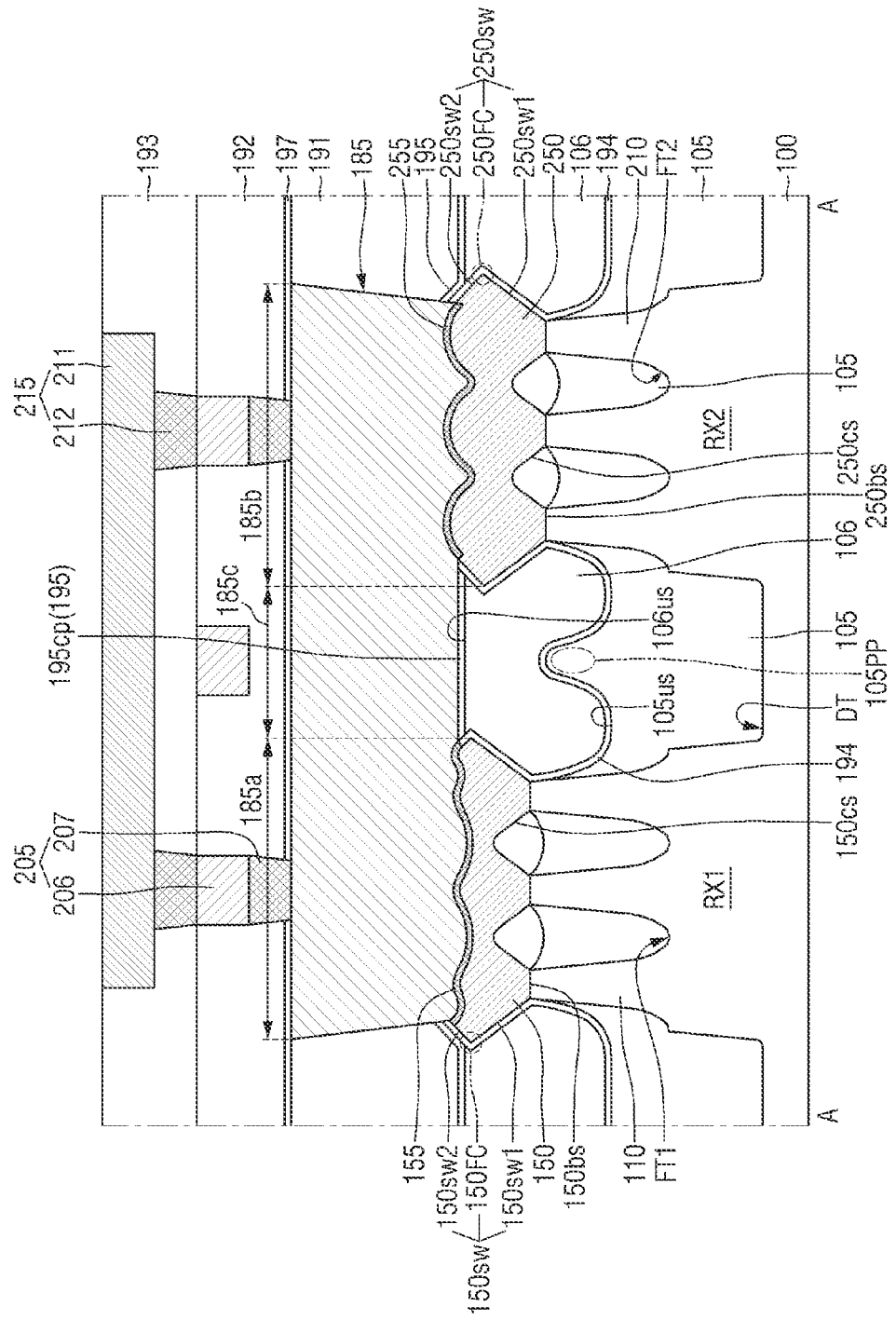

FIGS. 9, 10 and 11 are diagrams illustrating semiconductor devices according to some embodiments of the present invention. FIG. 12 and FIG. 13 are diagrams illustrating semiconductor devices according to some embodiments of the present invention. For convenience of description, following descriptions may focus on differences different from the configurations described using FIG. 1 to FIG. 6. For reference, FIG. 10 and FIG. 11 are enlarged views of a Q portion of FIG. 9 according to some embodiments of the present invention.

Referring to FIG. 9 to FIG. 11, in the semiconductor device according to some embodiments, a bottom surface of the first contact connective portion 185c may contact the connective portion 195cp of the first upper epitaxial etch stop film. The first interlayer insulating film 191 is not interposed between the bottom surface of the first contact connective portion 185c and the connective portion 195cp of the first upper epitaxial etch stop film.

Because the lower sidewall 150sw1 of the first epitaxial pattern has an inclined surface, a portion of the first interlayer insulating film 191 may be interposed between the first contact connective portion 185c and the sidewall 150sw of the first epitaxial pattern.

In some embodiments, the connective portion 195cp of the first upper epitaxial etch stop film is not etched in an area where the first contact connective portion 185c and the connective portion 195cp of the first upper epitaxial etch stop film contact each other as illustrated in FIG. 10.

In some embodiments, a portion of the connective portion 195cp of the first upper epitaxial etch stop film may be etched in an area where the first contact connective portion 185c and the connective portion 195cp of the first upper epitaxial etch stop film contact each other as illustrated in FIG. 11. However, the first contact connective portion 185c may not contact the first upper field insulating film 106. When the connective portion 195cp of the first upper epitaxial etch stop film includes a first area in contact with the first contact connective portion 185c and the second area not in contact therewith, a step may be formed between the first area of the connective portion 195cp of the first upper epitaxial etch stop film and the second area of the connective portion 195cp of the first upper epitaxial etch stop film.

Referring to FIG. 12, in the semiconductor device according to some embodiments, the first contact connective portion 185c may extend through the connective portion 195cp of the first upper epitaxial etch stop film.

The first contact connective portion 185c may be in direct contact with the first upper field insulating film 106. A portion of the first contact connective portion 185c may be inserted into the first upper field insulating film 106.

Referring to FIG. 13, in the semiconductor device according to some embodiments, a vertical level of the top surface 106us of the first upper field insulating film may be higher than that of each of the facet intersecting point 150FC of the first epitaxial pattern and/or the facet intersecting point 250FC of the second epitaxial pattern.

In some embodiments, the vertical level of the top surface 106us of the first upper field insulating film may be higher than that of each of the facet intersecting point 150FC of the first epitaxial pattern and the facet intersecting point 250FC of the second epitaxial pattern. The first upper field insulating film 106 may cover a portion of the upper sidewall 150sw2 of the first epitaxial pattern and a portion of the upper sidewall 250sw2 of the second epitaxial pattern.

In some embodiments, the vertical level of the top surface 106us of the first upper field insulating film may be higher than that of the facet intersecting point 250FC of the second epitaxial pattern and may be equal to or lower than that of the facet intersecting point 150FC of the first epitaxial pattern. The first upper field insulating film 106 may cover a portion of the upper sidewall 250sw2 of the second epitaxial pattern.

Figure 14:
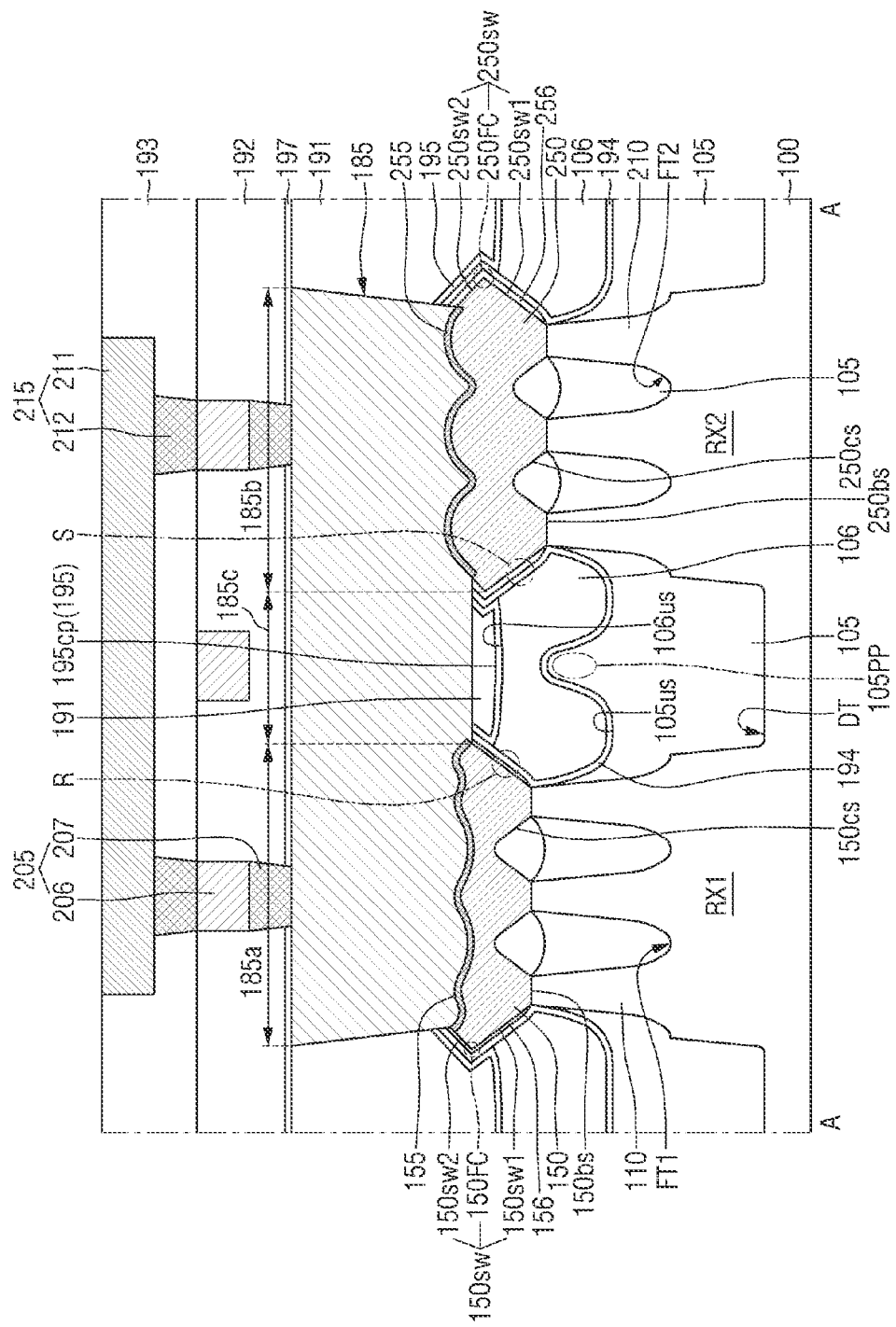
FIG. 14 and FIG. 15 are diagrams illustrating semiconductor devices according to some embodiments of the present invention.
Figure 15:
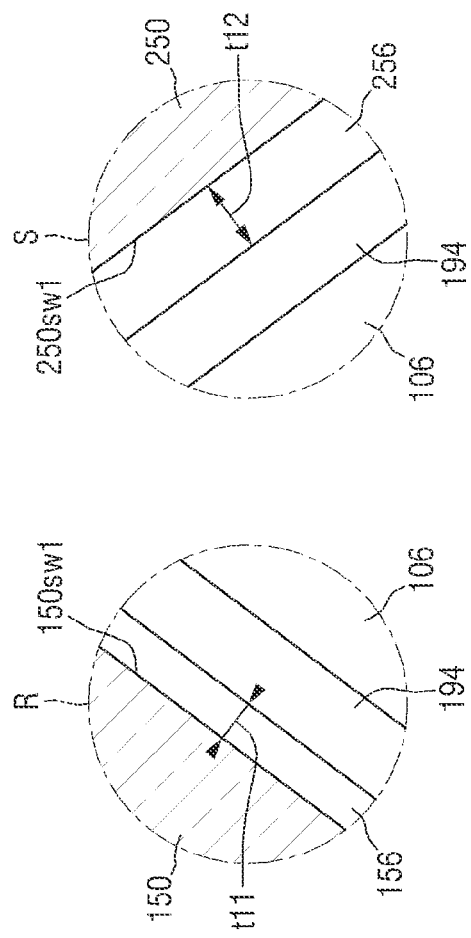

FIG. 14 and FIG. 15 are diagrams illustrating semiconductor devices according to some embodiments of the present invention. For convenience of description, following descriptions may focus on differences different from the configurations described using FIG. 1 to FIG. 6. For reference, FIG. 15 is an enlarged view of a R portion and a S portion of FIG. 14.

Referring to FIG. 14 and FIG. 15, the semiconductor device according to some embodiments may further include a first epitaxial inserted liner 156 disposed between the first epitaxial pattern 150 and the first lower epitaxial etch stop film 194, and a second epitaxial inserted liner 256 disposed between the second epitaxial pattern 250 and the first lower epitaxial etch stop film 194.

The first epitaxial inserted liner 156 may extend along the sidewall 150sw of the first epitaxial pattern. The first epitaxial inserted liner 156 may extend along the lower sidewall 150sw1 of the first epitaxial pattern. The first epitaxial inserted liner 156 may extend along at least a portion of the upper sidewall 150sw2 of the first epitaxial pattern.

The second epitaxial inserted liner 256 may extend along the sidewall 250sw of the second epitaxial pattern. The second epitaxial inserted liner 256 may extend along the lower sidewall 250sw1 of the second epitaxial pattern. The second epitaxial inserted liner 256 may extend along at least a portion of the upper sidewall 250sw2 of the second epitaxial pattern. The first epitaxial inserted liner 156 and the second epitaxial inserted liner 256 may be referred to as a first epitaxial liner 156 and a second epitaxial liner 256, respectively.

The first epitaxial inserted liner 156 may not extend along the connective surface 150cs of the first epitaxial pattern. The second epitaxial inserted liner 256 may not extend along the connective surface 250cs of the second epitaxial pattern.

For example, a thickness t11 of the first epitaxial inserted liner 156 may be different from a thickness t12 of the second epitaxial inserted liner 256. In some embodiments, when the first active area RX1 acts as an NMOS constituting area and the second active area RX2 acts as a PMOS constituting area, the thickness t11 of the first epitaxial inserted liner 156 may be smaller than the thickness t12 of the second epitaxial inserted liner 256. In some embodiments, when the first active area RX1 acts as a PMOS constituting area and the second active area RX2 acts as an NMOS constituting area, the thickness t11 of the first epitaxial inserted liner 156 may be smaller than the thickness t12 of the second epitaxial inserted liner 256.

Each of the first epitaxial inserted liner 156 and the second epitaxial inserted liner 256 may include, for example, an insulating material. Each of the first epitaxial inserted liner 156 and the second epitaxial inserted liner 256 may include a material different from a material of the first lower epitaxial etch stop film 194.

Figure 16:
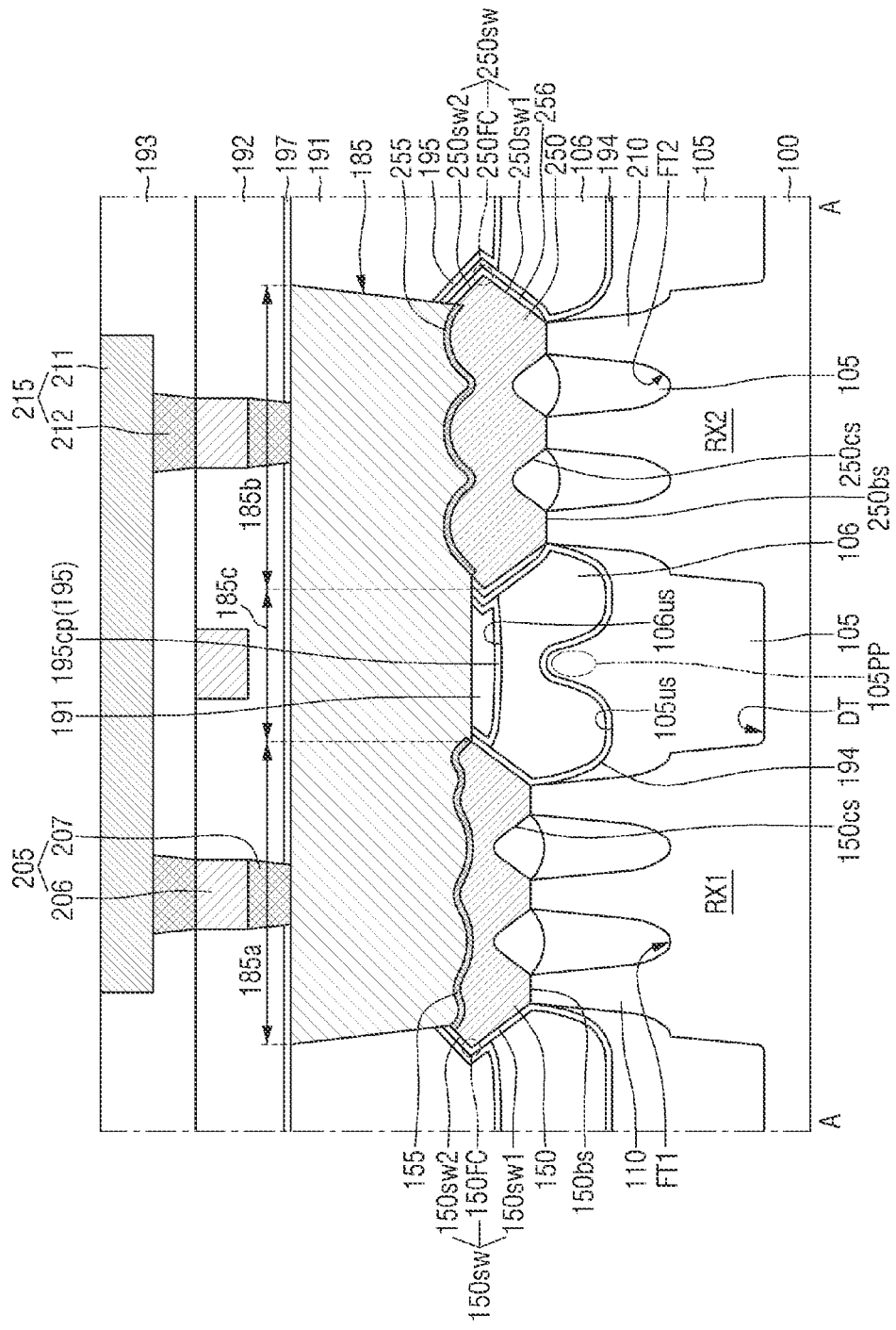
FIG. 16 is a diagram illustrating a semiconductor device according to some embodiments of the present invention.

FIG. 16 is a diagram illustrating a semiconductor device according to some embodiments of the present invention. For convenience of description, following descriptions may focus on differences different from the configurations described using FIG. 14 and FIG. 15.

Referring to FIG. 16, in the semiconductor device according to some embodiments, the first lower epitaxial etch stop film 194 may contact the sidewall 150sw of the first epitaxial pattern.

The first lower epitaxial etch stop film 194 may be in contact with the lower sidewall 150sw1 of the first epitaxial pattern. The first lower epitaxial etch stop film 194 may contact at least a portion of the upper sidewall 150sw2 of the first epitaxial pattern.

Figure 17:
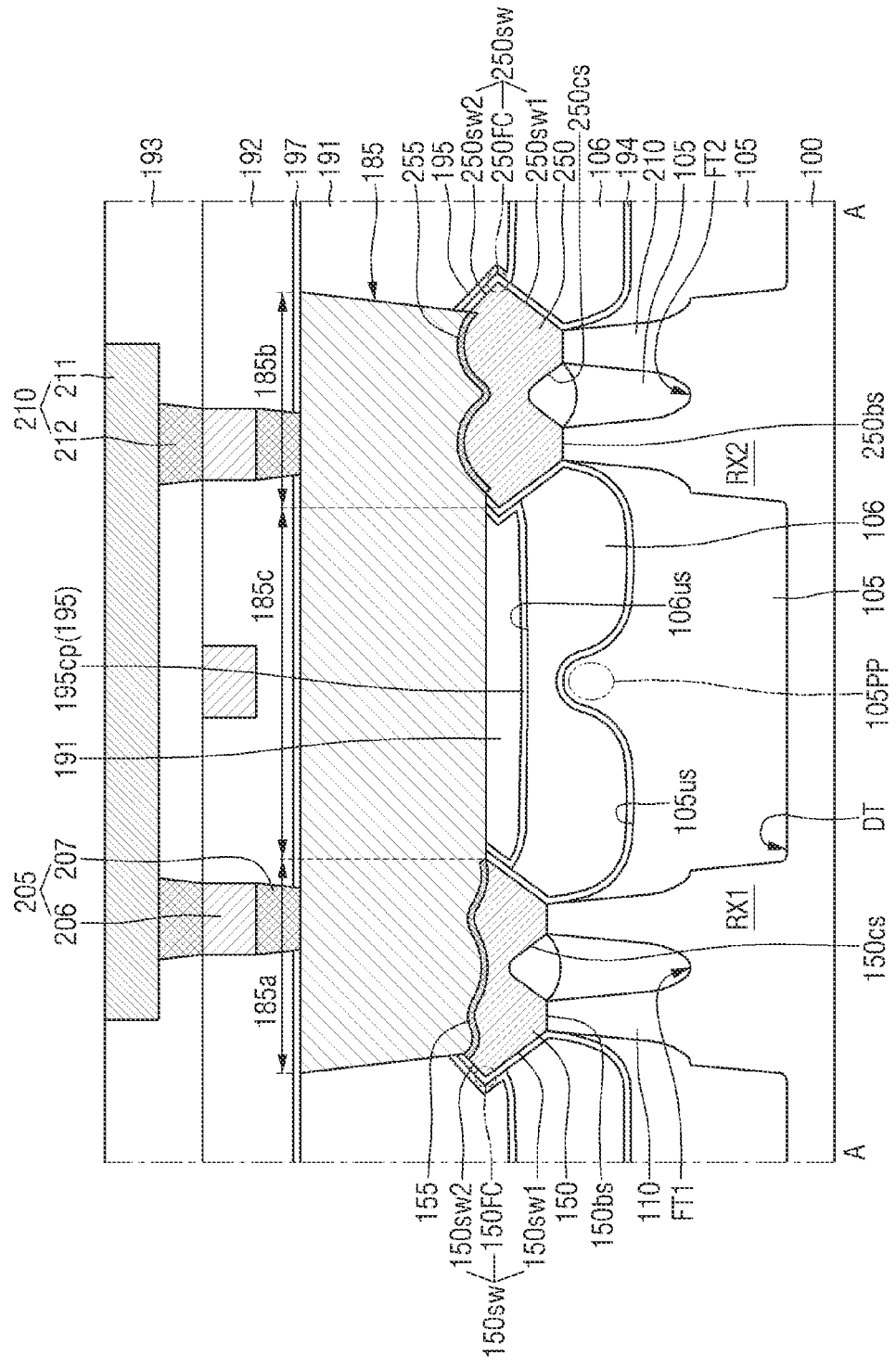
FIG. 17 and FIG. 18 are diagrams illustrating semiconductor devices according to some embodiments of the present invention.
Figure 18:
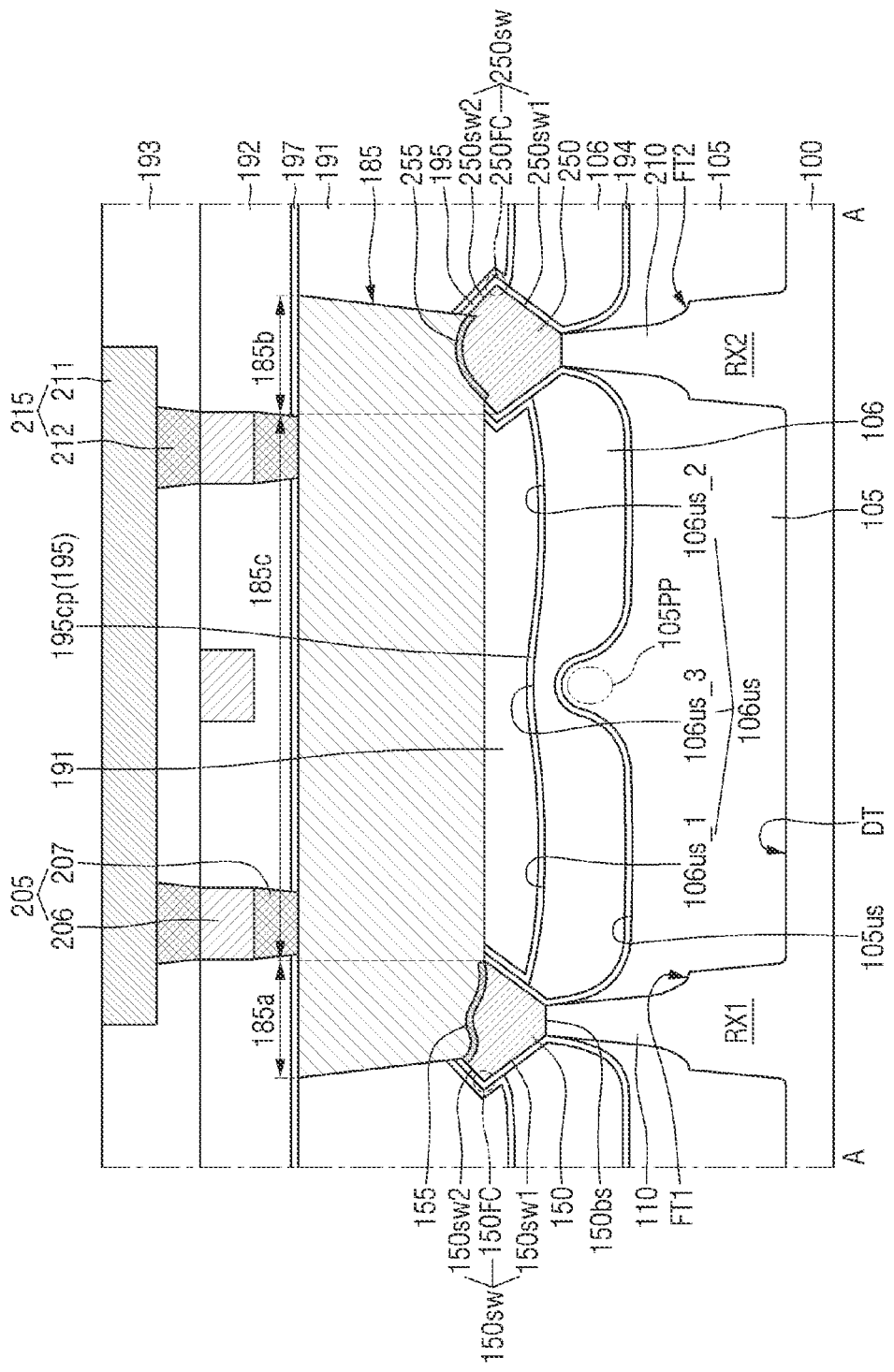

FIG. 17 and FIG. 18 are diagrams illustrating semiconductor devices according to some embodiments of the present invention. For convenience of description, following descriptions may focus on differences different from the configurations described using FIG. 1 to FIG. 6.

Referring to FIG. 17, in the semiconductor device according to some embodiments, two first fin-type patterns 110 may be disposed in the first active area RX1, while two second fin-type patterns 210 may be disposed in the second active area.

A width of the deep trench DT distinguishing the first active area RX1 and the second active area RX2 from each other is larger than a width of the deep trench DT in FIG. 2. Thus, a spacing between the first epitaxial pattern 150 and the second epitaxial pattern 250 spaced apart from each other in the second direction (D2 in FIG. 1) increases.

The top surface 106us of the first upper field insulating film disposed between the first epitaxial pattern 150 and the second epitaxial pattern 250 may have a concave shape. A vertical level of the top surface 106us of the first upper field insulating film based on the top surface of the substrate 100 may be higher than that of each of the bottom surface 150bs of the first epitaxial pattern and the bottom surface 250bs of the second epitaxial pattern based on the top surface of the substrate 100. The vertical level of the top surface 106us of the first upper field insulating film may be lower than that of each of the facet intersecting point 150FC of the first epitaxial pattern and the facet intersecting point 250FC of the second epitaxial pattern.

Referring to FIG. 18, in the semiconductor device according to some embodiments, one first fin-type pattern 110 may be disposed in the first active area RX1, while one second fin-type pattern 210 may be disposed in the second active area.

The top surface 106us of the first upper field insulating film disposed between the first epitaxial pattern 150 and the second epitaxial pattern 250 may have a W-shape. For example, the top surface 106us of the first upper field insulating film disposed between the first epitaxial pattern 150 and the second epitaxial pattern 250 may include a first portion 106us_1 and a second portion 106us_2 having a concave shape, and a third portion 106us_3 having a convex shape and disposed therebetween. The third portion 106us_3 of the top surface of the first upper field insulating film may be disposed between the first portion 105us_1 of the top surface of the first upper field insulating film and the second portion 106us_2 of the top surface of the first upper field insulating film.

Vertical levels of the first portion 106us_1 of the top surface of the first upper field insulating film and the second portion 106us_2 of the top surface of the first upper field insulating film based on the top surface of the substrate 100 may be higher than those of the bottom surface 150bs of the first epitaxial pattern and the bottom surface 250bs of the second epitaxial pattern based on the top surface of the substrate 100, respectively.

The first portion 106us_1 of the top surface of the first upper field insulating film and the second portion 106us_2 of the top surface of the first upper field insulating film are lower than the facet intersecting point 150FC of the first epitaxial pattern and the facet intersecting point 250FC of the second epitaxial pattern, respectively.

Unlike the drawing, in the semiconductor device described in FIG. 17, the top surface 106us of the first upper field insulating film disposed between the first epitaxial pattern 150 and the second epitaxial pattern 250 may have a W-shape similar to that in FIG. 18. Further, in the semiconductor device described in FIG. 18, the top surface 106us of the first upper field insulating film disposed between the first epitaxial pattern 150 and the second epitaxial pattern 250 may have a concave shape similar to that in FIG. 17.

Figure 19:
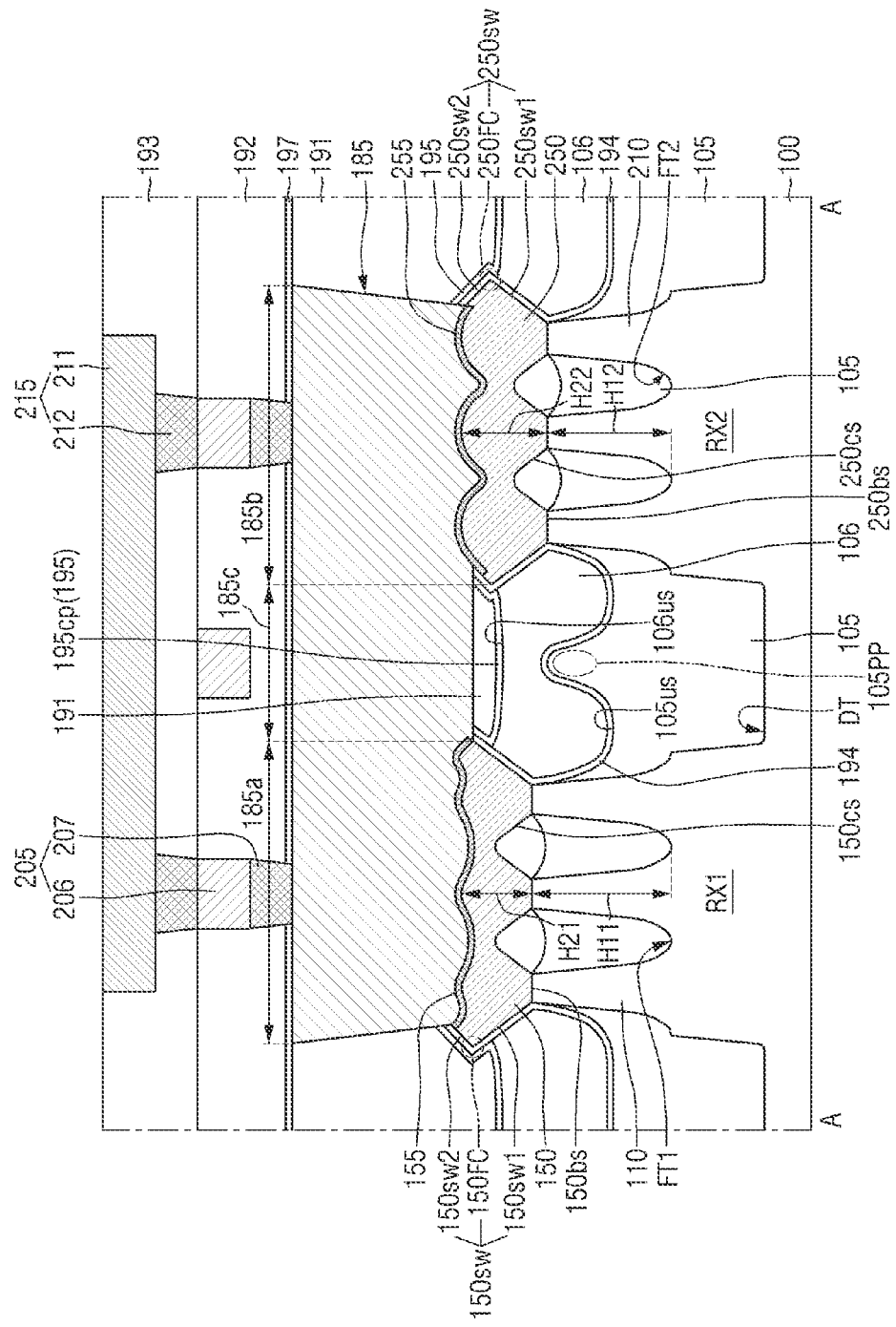
FIGS. 19, 20 and 21 are diagrams illustrating semiconductor devices according to some embodiments of the present invention.
Figure 20:
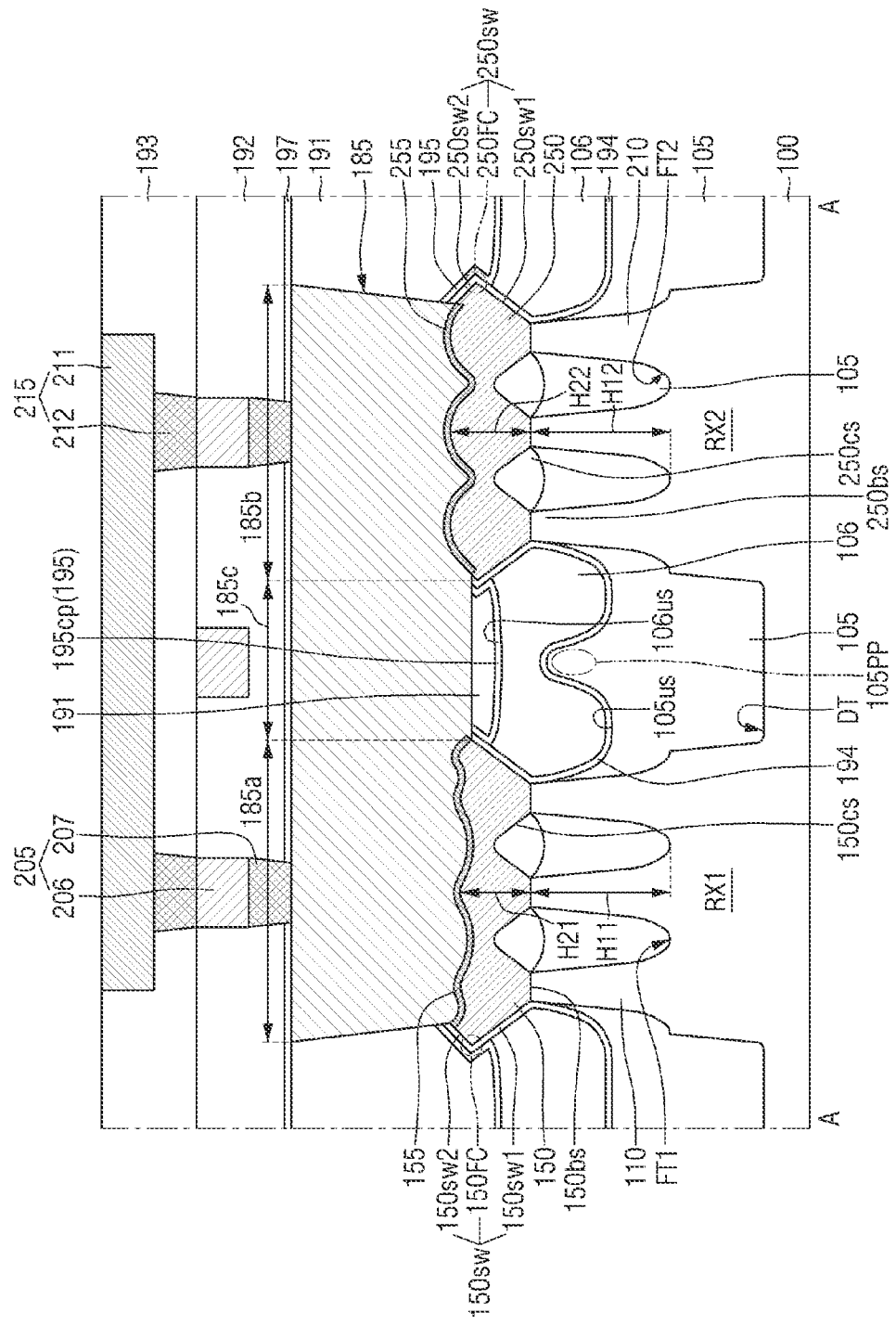
Figure 21:
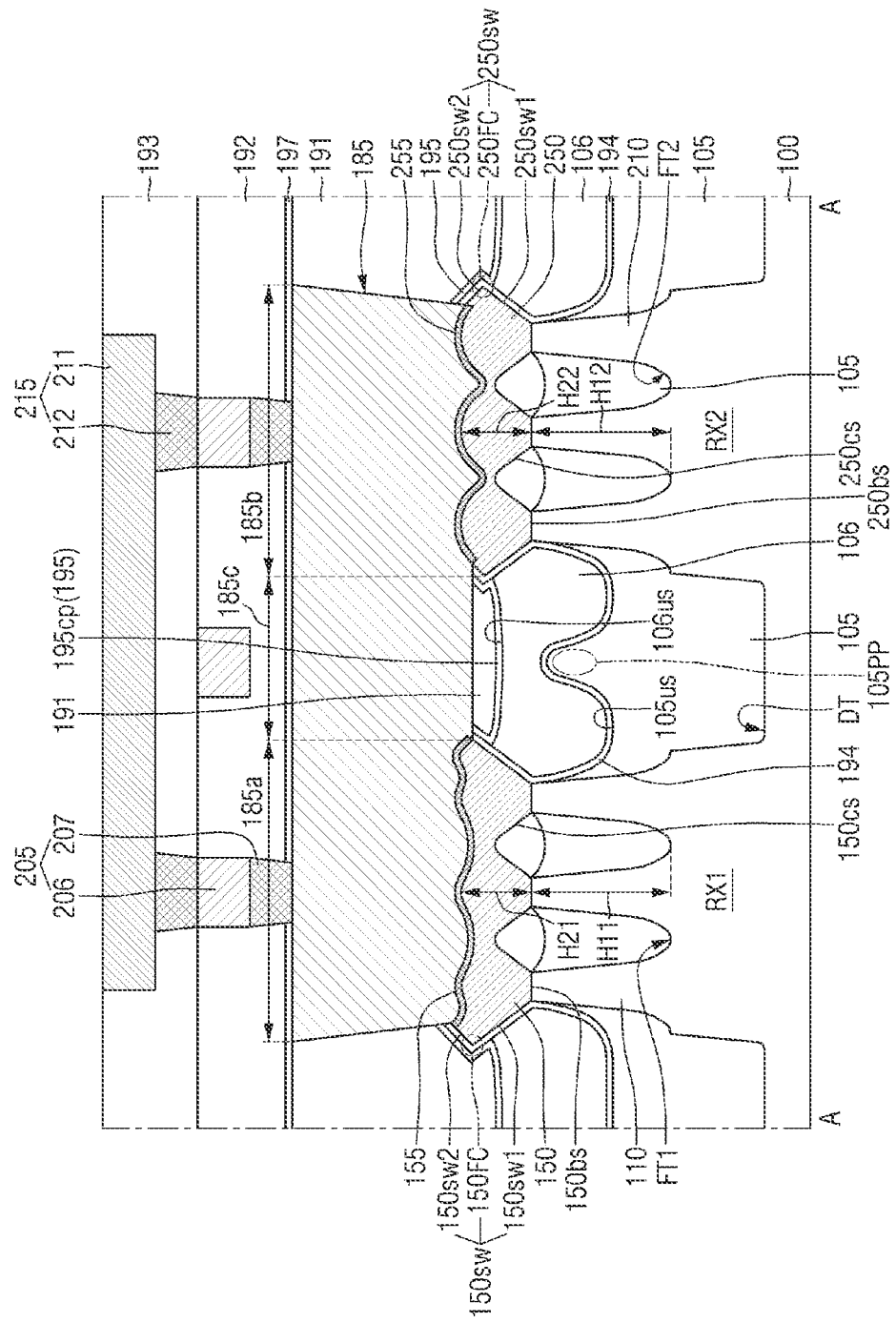

FIG. 19 to FIG. 21 are diagrams illustrating semiconductor devices according to some embodiments of the present invention. For convenience of description, following descriptions may focus on differences different from the configurations described using FIG. 1 to FIG. 6.

Referring to FIG. 19, in the semiconductor device according to some embodiments, the vertical dimension H12+H22 from the bottom surface of the second fin trench FT2 to the bottom surface of the second sub-contact portion 185b in an area overlapping the second fin-type pattern 210 may be equal to the vertical dimension H11+H21 from the bottom surface of the first fin trench FT1 to the bottom surface of the first sub-contact portion 185a in an area overlapping the first fin-type pattern 110.

The vertical dimension H11 from the bottom surface of the first fin trench FT1 to the bottom surface 150bs of the first epitaxial pattern may be larger than the vertical dimension H12 from the bottom surface of the second fin trench FT2 to the bottom surface 250bs of the second epitaxial pattern.

Referring to FIG. 20, in the semiconductor device according to some embodiments, the vertical dimension H11 from the bottom surface of the first fin trench FT1 to the bottom surface 150bs of the first epitaxial pattern may be equal to the vertical dimension H12 from the bottom surface of the second fin trench FT2 to the bottom surface 250bs of the second epitaxial pattern.

The vertical dimension H12+H22 from the bottom surface of the second fin trench FT2 to the bottom surface of the second sub-contact portion 185b in an area overlapping the second fin-type pattern 210 may be greater than the vertical dimension H11+H21 from the bottom surface of the first fin trench FT1 to the bottom surface of the first sub-contact portion 185a in an area overlapping the first fin-type pattern 110.

The vertical dimension H22 from the bottom surface 250bs of the second epitaxial pattern to the bottom surface of the second sub-contact portion 185b in an area overlapping the second fin-type pattern 210 may be larger than the vertical dimension H21 from the bottom surface 150bs of the first epitaxial pattern to the bottom surface of the first sub-contact portion 185a in an area overlapping the first fin-type pattern 110.

Referring to FIG. 21, in the semiconductor device according to some embodiments, the first active area RX1 and the second active area RX2 may be areas in which transistors having the same conductivity-type are formed, respectively. In some embodiments, each of the first active area RX1 and the second active area RX2 may be a PMOS constituting area. In some embodiments, each of the first active area RX1 and the second active area RX2 may be a NMOS constituting area.

A boundary of each of the first lower field insulating film 105 and the first upper field insulating film 106 may have a concave shape. A vertical dimension from the bottom surface of the first fin trench FT1 to the facet intersecting point 150FC of the first epitaxial pattern may be the same as a vertical dimension from the bottom surface of the second fin trench FT2 to the facet intersecting point 250FC of the second epitaxial pattern.

The vertical dimension H11 from the bottom surface of the first fin trench FT1 to the bottom surface 150bs of the first epitaxial pattern may be equal to the vertical dimension H12 from the bottom surface of the second fin trench FT2 to the bottom surface 250bs of the second epitaxial pattern.

The vertical dimension H12+H22 from the bottom surface of the second fin trench FT2 to the bottom surface of the second sub-contact portion 185b in an area overlapping the second fin-type pattern 210 may be equal to the vertical dimension H11+H21 from the bottom surface of the first fin trench FT1 to the bottom surface of the first sub-contact portion 185a in an area overlapping the first fin-type pattern 110.

FIG. 22 to FIG. 27 are diagrams illustrating semiconductor devices according to some embodiments, respectively. For convenience of description, following descriptions may focus on differences different from the configurations described using FIG. 1 to FIG. 6.

Figure 22:
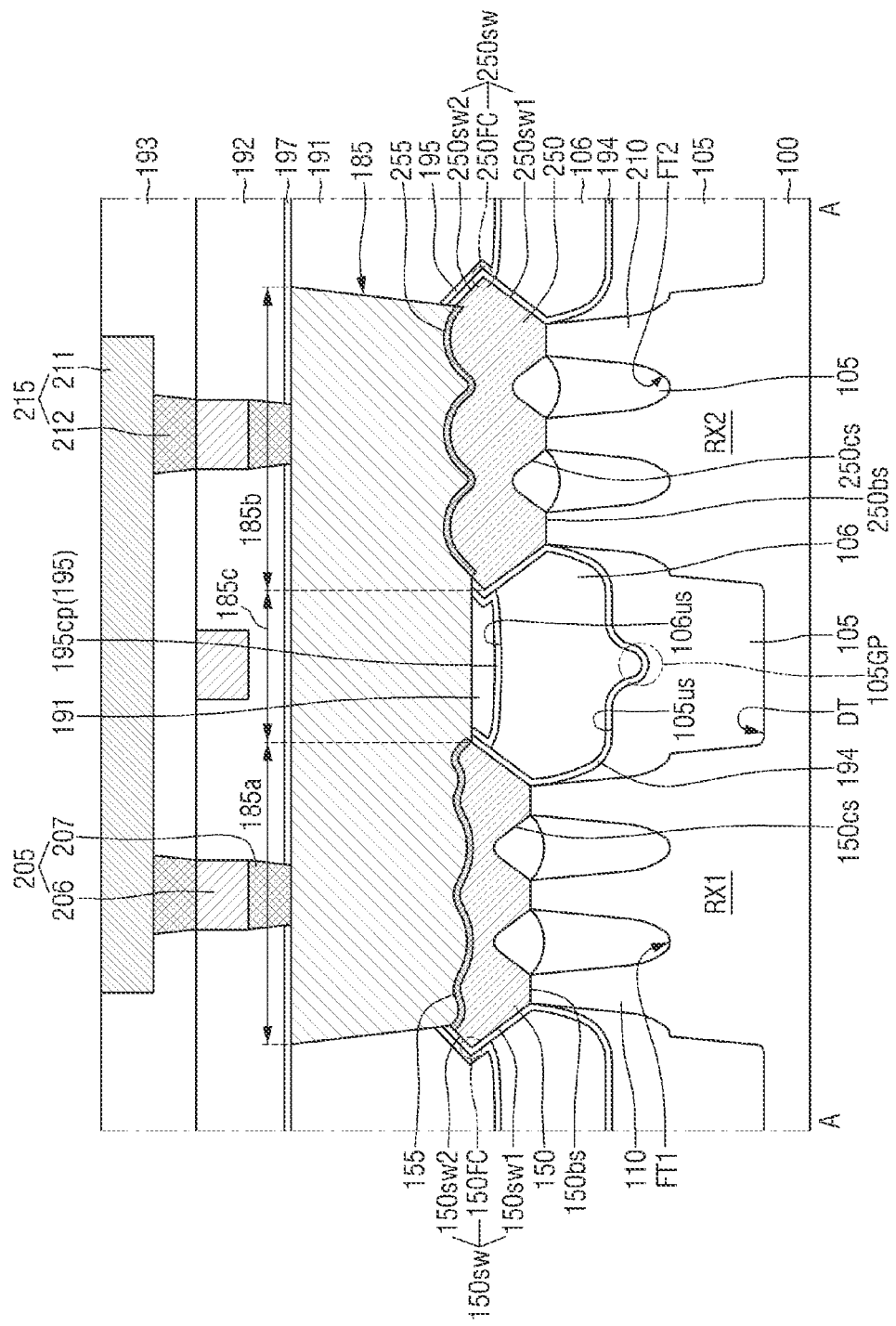
FIGS. 22, 23, 24, 25, 26 and 27 are diagrams illustrating semiconductor devices according to some embodiments of the present invention.

Referring to FIG. 22, in the semiconductor device according to some embodiments, the first lower field insulating film 105 between the first fin-type pattern 110 and the second fin-type pattern 210 may include a trench area 105GP.

As the first lower field insulating film 105 extends away from the first fin-type pattern 110, an inclination of the top surface 105us of the first lower field insulating film may increase and then decrease, and then increase again and then decrease. As the first lower field insulating film 105 starts from the lowest portion of the top surface 105us of the first lower field insulating film, and then extends away from the first fin-type pattern 110, the inclination of the top surface 105us of the first lower field insulating film may increase and then decrease, and then increase again and then decrease. In this connection, the "inclination" may be an absolute value regardless of a sign (positive or negative).

Figure 23:
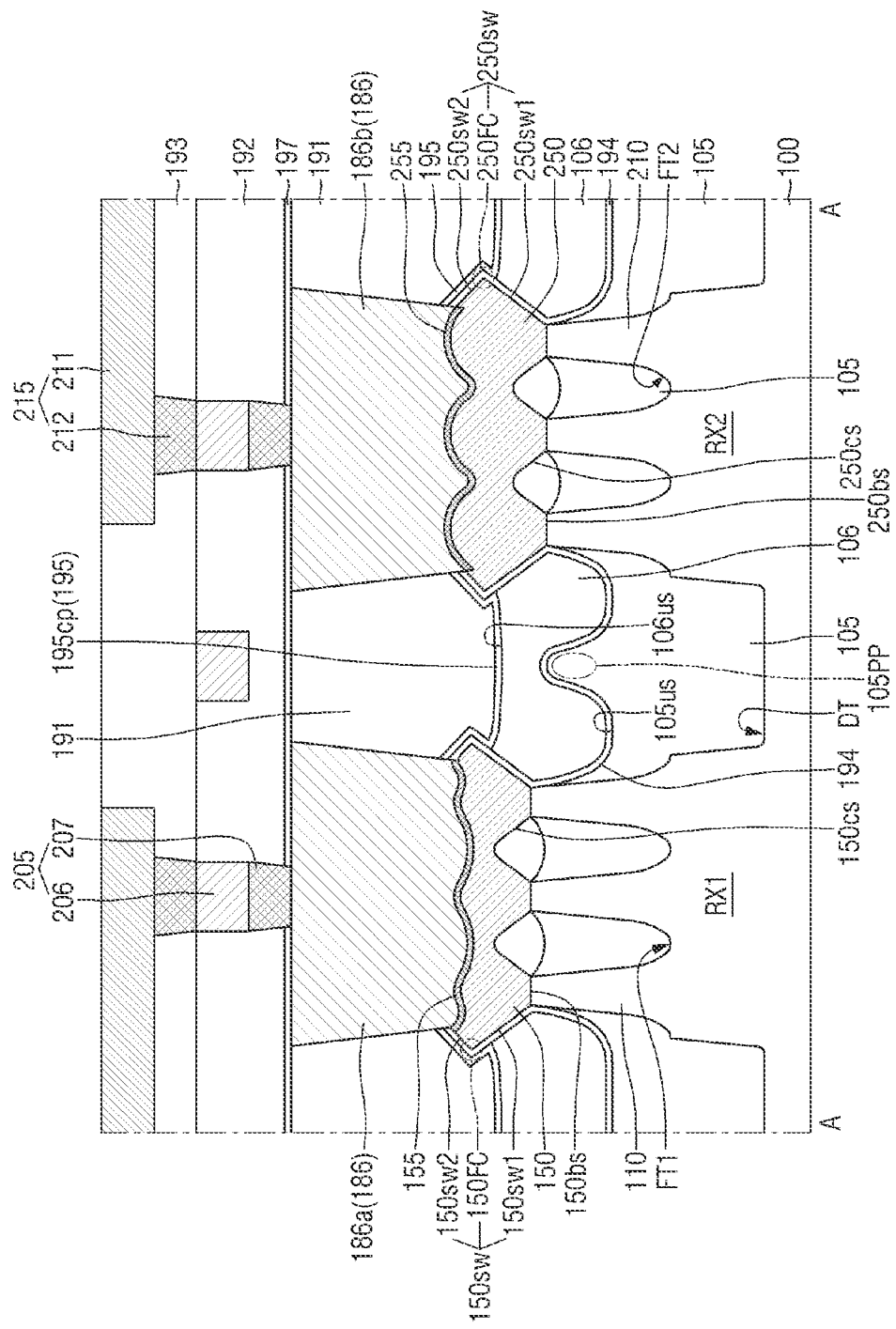

Referring to FIG. 23, the semiconductor device according to some embodiments may further include a first sub-source/drain contact 186a connected to the first epitaxial pattern 150 and a second sub-source/drain contact 186b connected to the second epitaxial pattern 250.

In the first interlayer insulating film 191, the first sub-source/drain contact 186a is not connected to the second sub-source/drain contact 186b. That is, the first sub-source/drain contact 186a and the second sub-source/drain contact 186b are not connected to each other via the first contact connective portion 185c shown in FIG. 2.

Figure 24:
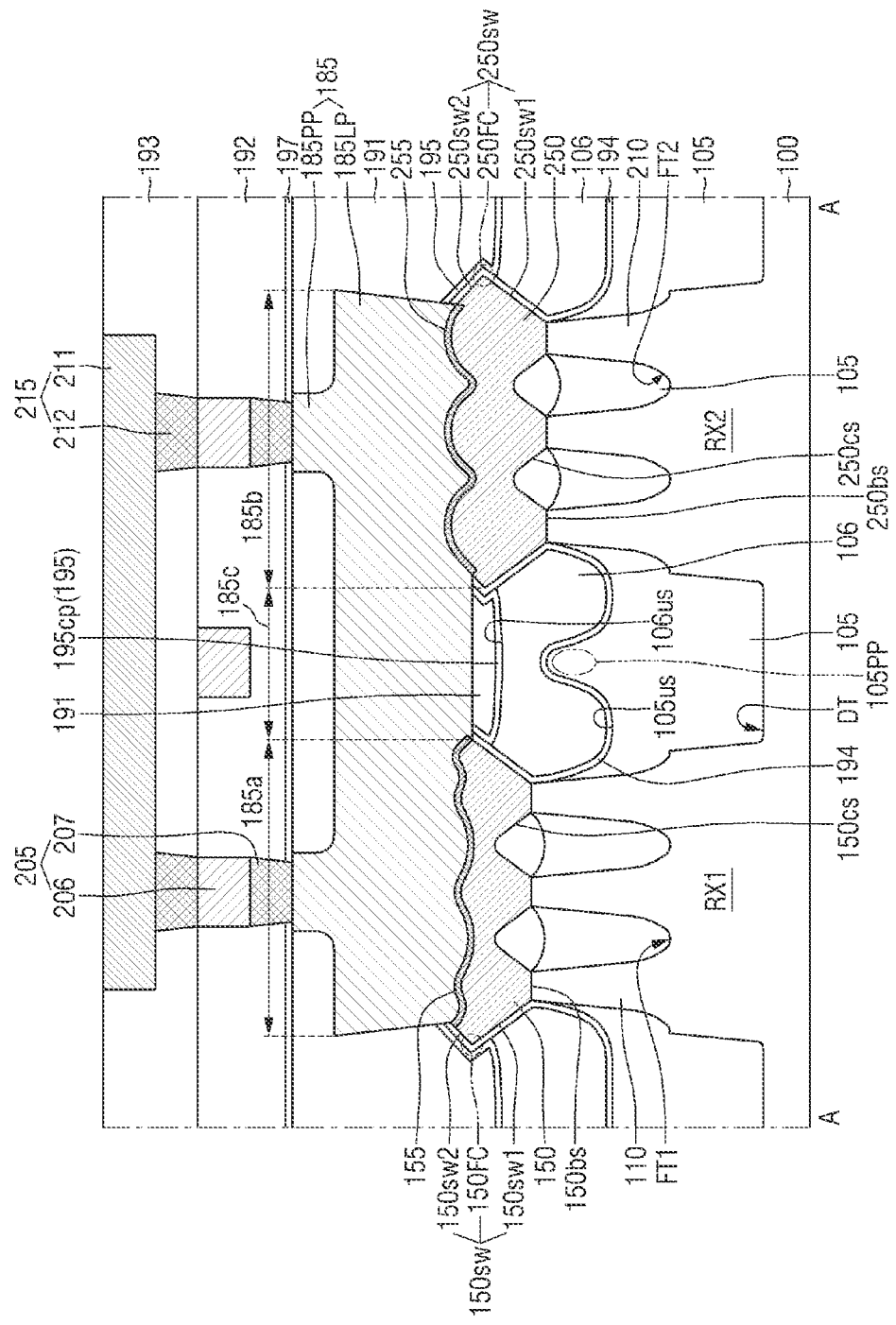
Figure 25:
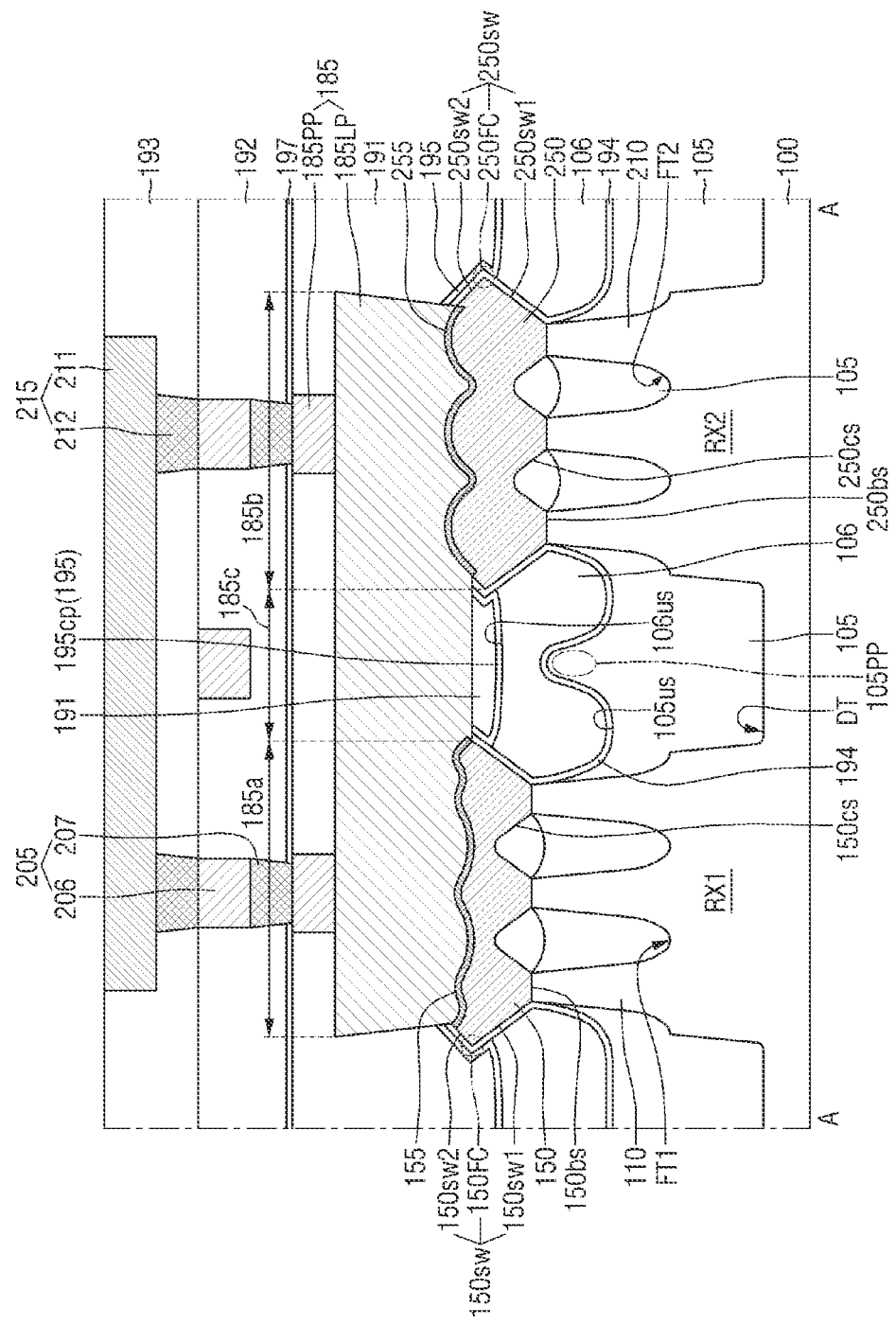

Referring to FIG. 24 and FIG. 25, in the semiconductor device according to some embodiments, the first connective source/drain contact 185 may include a line portion 185LP and a protruding portion 185PP.

The line portion 185LP of the first connective source/drain contact may be in a form of a bar extending in an elongate manner in the second direction D2. The line portion 185LP of the first connective source/drain contact connects the first epitaxial pattern 150 and the second epitaxial pattern 250 to each other. A vertical level of a top surface of the line portion 185LP of the first connective source/drain contact is lower than that of the top surface of the first interlayer insulating film 191. That is, the vertical level of the top surface of the line portion 185LP of the first connective source/drain contact is lower than that of the top surface of the gate capping pattern (e.g., 145 in FIG. 6).

The protruding portion 185PP of the first connective source/drain contact may protrude from the line portion 185LP of the first connective source/drain contact. The protruding portion 185PP of the first connective source/drain contact may be connected to the first line structure 205. A top surface of the protruding portion 185PP of the first connective source/drain contact may be coplanar with a top surface of the first interlayer insulating film 191. The top surface of the protruding portion 185PP of the first connective source/drain contact may be coplanar with the top surface of the gate capping pattern (e.g., 145 in FIG. 6). The first connective source/drain contact 185 may include a first protruding portion 185PP and a second protruding portion 185PP connected to the first electrical line 206.

In FIG. 24, the line portion 185LP of the first connective source/drain contact may be integral or monolithic with the first protruding portion 185PP of the first connective source/drain contact and the second protruding portion 185PP of the first connective source/drain contact. In a manufacturing process, a pre-structure of the first connective source/drain contact 185 may be formed and then a portion of the pre-structure may be removed. A top surface of the pre-structure of the first connective source/drain contact 185 may be coplanar with the top surface of the first interlayer insulating film 191. Thus, the protruding portion 185PP of the first connective source/drain contact and the line portion 185LP of the first connective source/drain contact may be formed.

In FIG. 25, the line portion 185LP of the first connective source/drain contact may be separate from and non-integral or non-monolithic with the first protruding portion 185PP of the first connective source/drain contact and the second protruding portion 185PP of the first connective source/drain contact. In a manufacturing process, the pre-structure of the first connective source/drain contact 185 may be formed, and then the pre-structure may be etched over an entire top surface thereof to lower a vertical level of the top surface of the pre-structure. Thus, the line portion 185LP of the first connective source/drain contact may be formed. Subsequently, the first protruding portion 185PP of the first connective source/drain contact and the second protruding portion 185PP of the first connective source/drain contact may be formed on the line portion 185LP of the first connective source/drain contact. Unlike the illustration, in some embodiments, the first protruding portion 185PP of the first connective source/drain contact may be directly connected to the first electrical line 206 without the first via 207.

Figure 26:
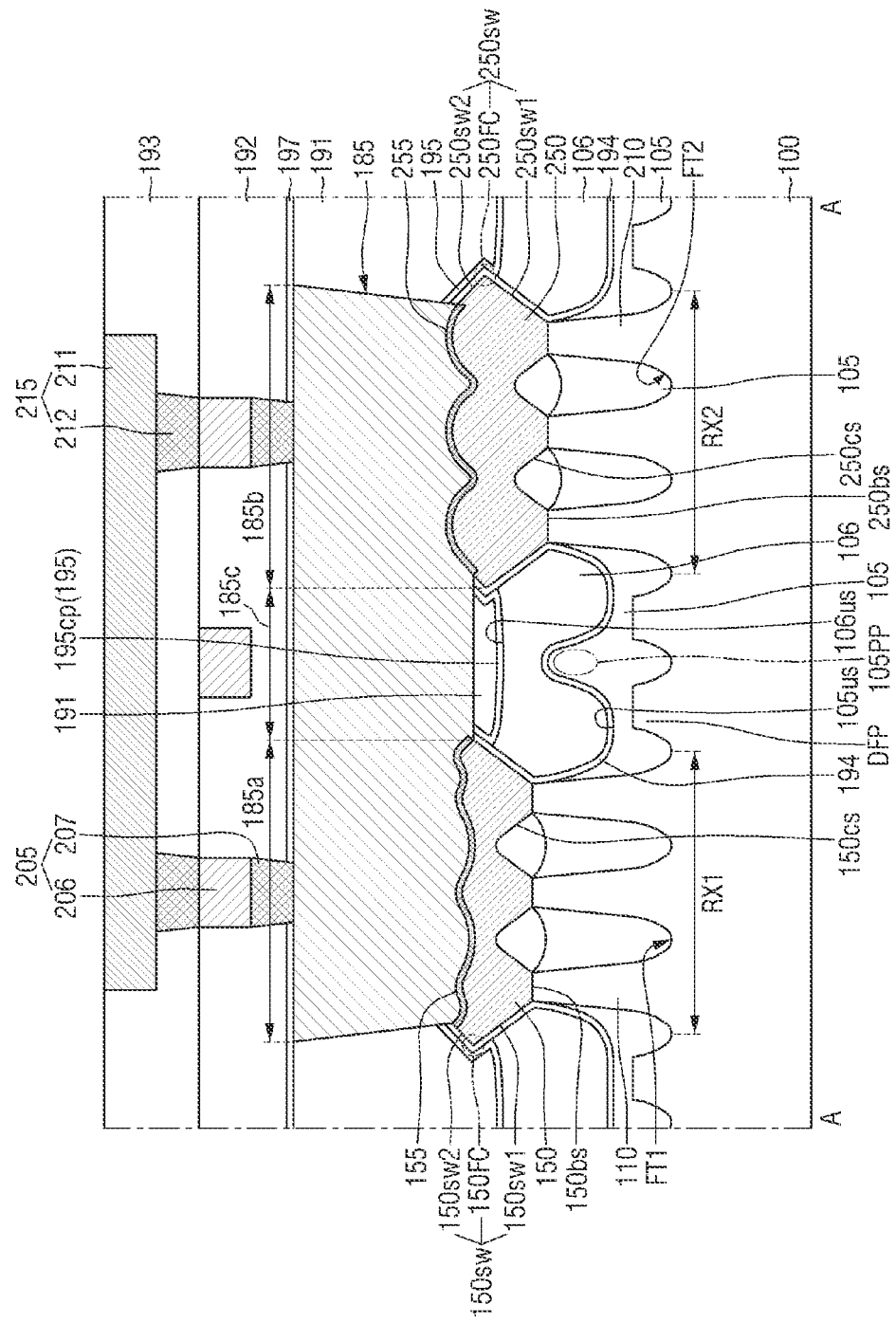

Referring to FIG. 26, in the semiconductor device according to some embodiments, the first active area RX1 and the second active area RX2 may be distinguished from each other via a dummy fin pattern DFP.

In other words, the dummy fin pattern DFP may be formed between the first active area RX1 and the second active area RX2. The dummy fin pattern DFP may include, for example, the same material as that of each of the first fin-type pattern 110 and the second fin-type pattern 210.

In some embodiments, an entirety of a top surface of the dummy fin pattern DFP may be covered with the first lower field insulating film 105. A vertical level of the top surface of the dummy fin pattern DFP is lower than that of the top surface 105us of the first lower field insulating film. In some embodiments, at least a portion of the top surface of the dummy fin pattern DFP may not be covered with the first lower field insulating film 105. Because the first lower epitaxial etch stop film 194 is formed along and on the top surface 105us of the first lower field insulating film, the first lower epitaxial etch stop film 194 may cover an entirety of the top surface of the dummy fin pattern DFP.

Figure 27:
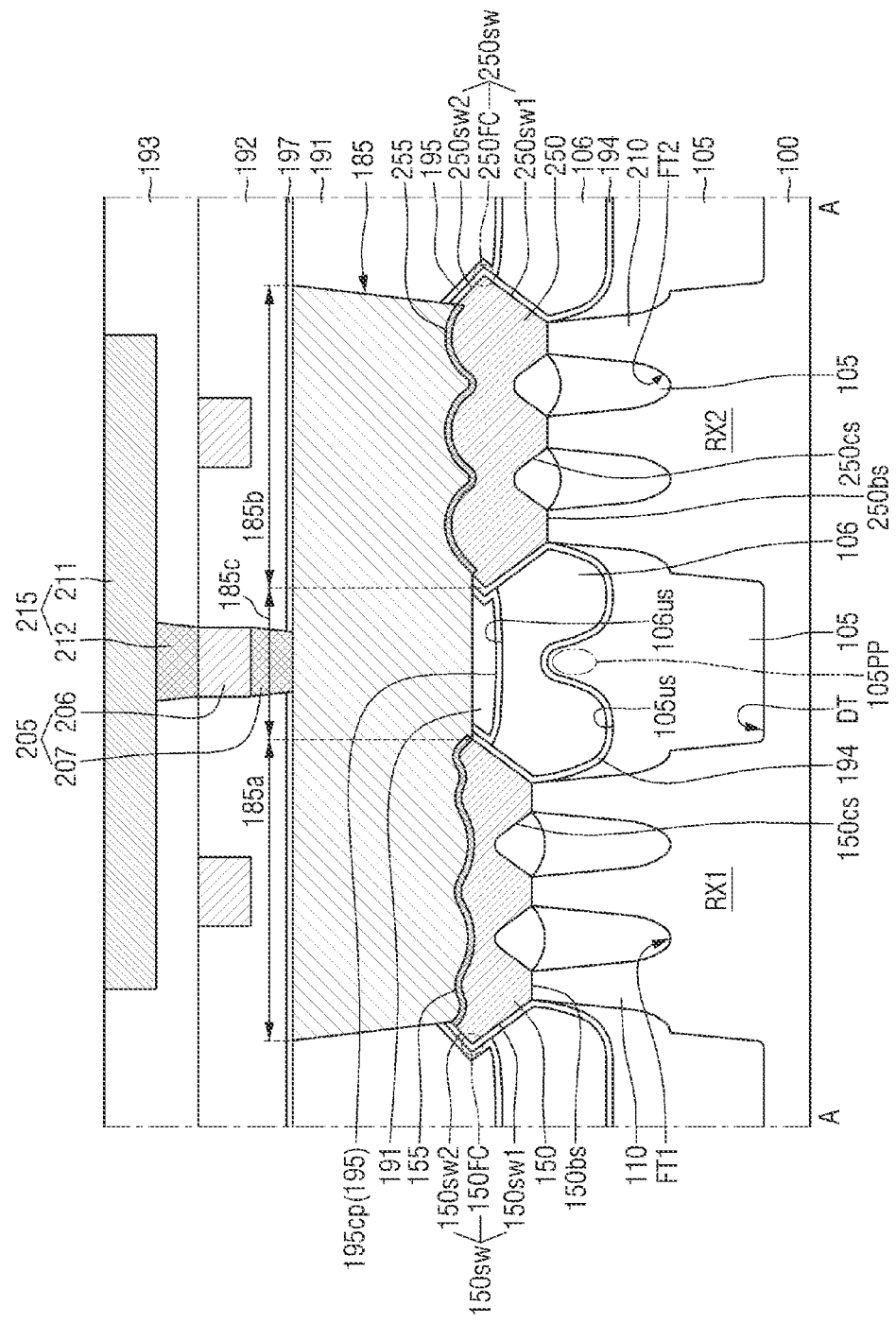

Referring to FIG. 27, in the semiconductor device according to some embodiments, the first connective source/drain contact 185 may be connected to one first electrical line 206.

For example, the first via 207 of the first line structure 205 may be connected to the first contact connective portion 185c.

Figure 28:
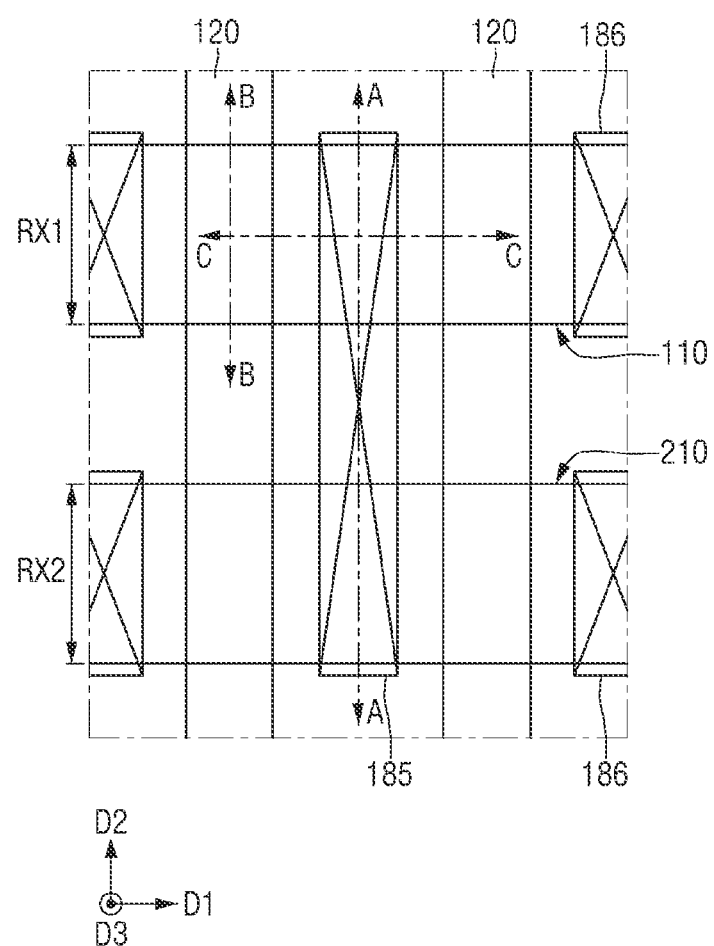
FIGS. 28, 29, 30, 31A and 31B are diagrams for illustrating semiconductor devices according to some embodiments, respectively.
Figure 29:
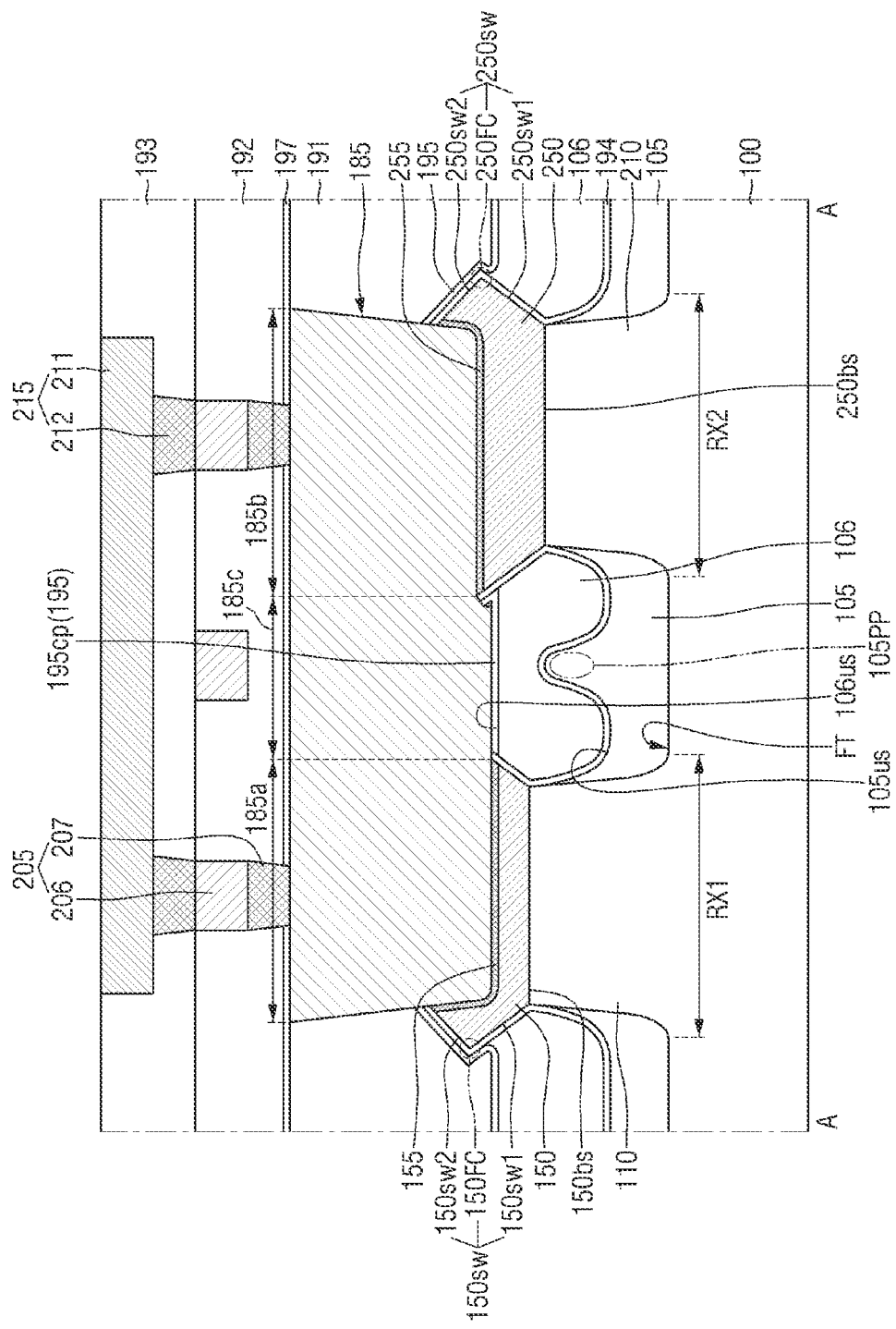
Figure 30:
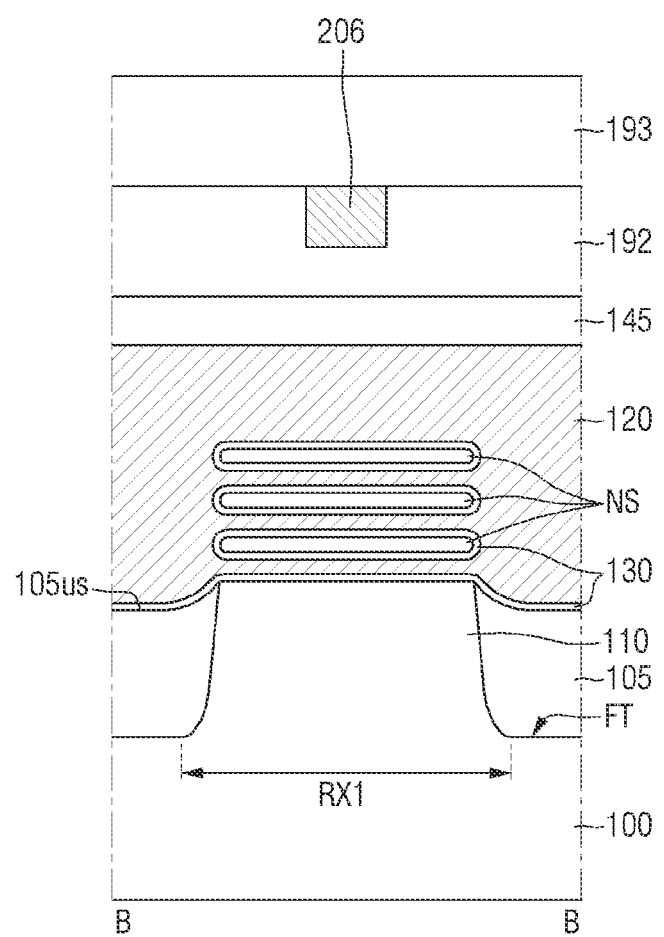
Figure 31A:
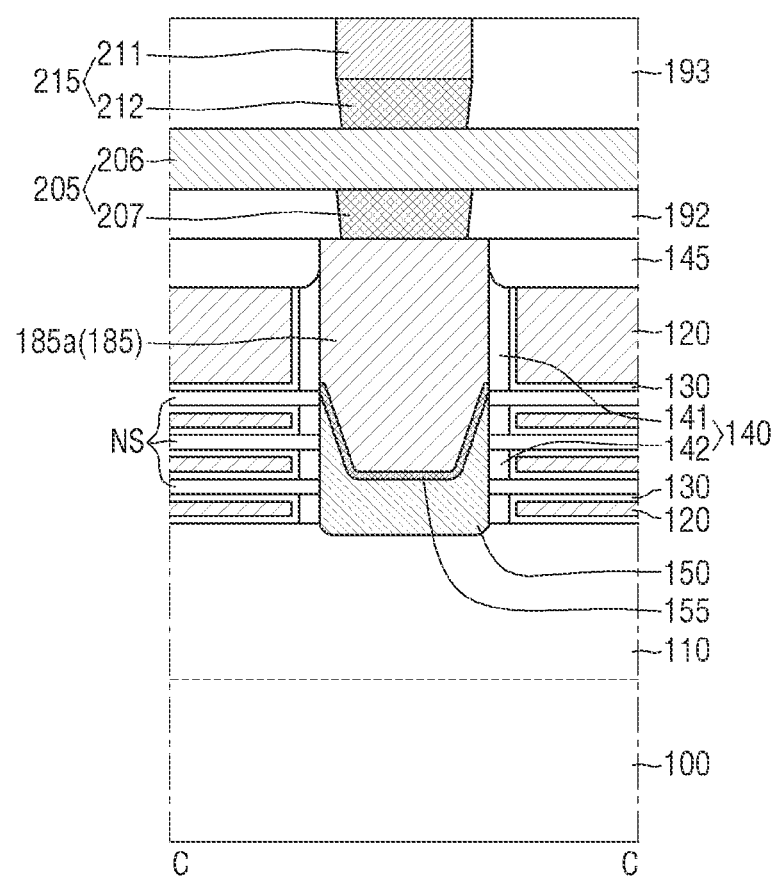
Figure 31B:
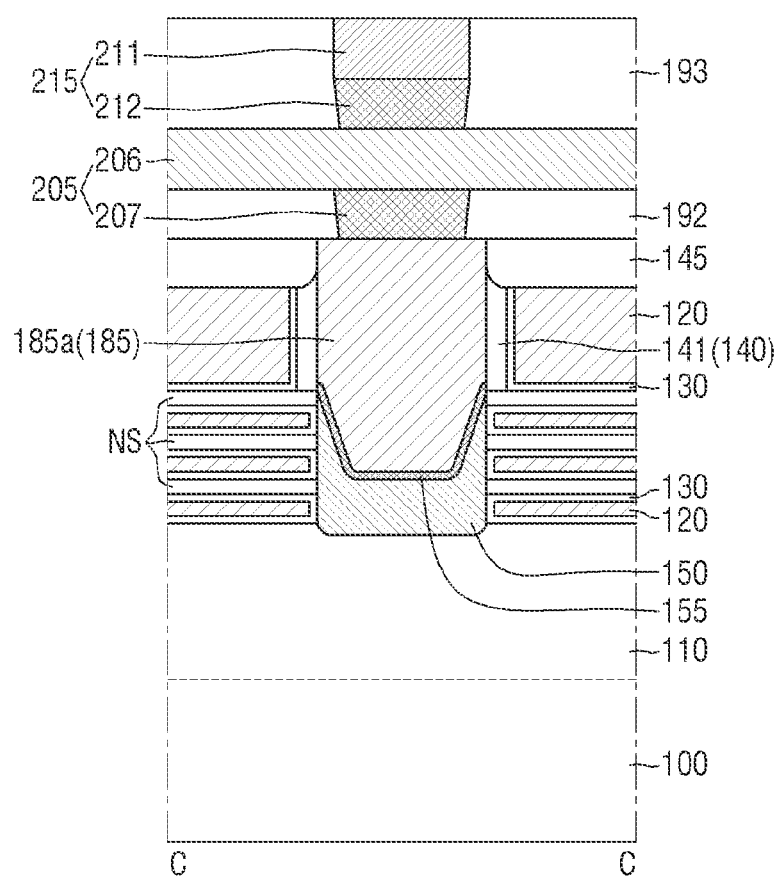

FIG. 28 to FIG. 31B are diagrams illustrating semiconductor devices according to some embodiments of the present invention. FIG. 28 is a layout diagram illustrating a semiconductor device according to some embodiments. FIG. 29 is a cross-sectional view taken along a line A-A of FIG. 28. FIG. 30 is a cross-sectional view taken along a line B-B of FIG. 28. FIG. 31A and FIG. 31B are cross-sectional views taken along a line C-C of FIG. 28. For convenience of description, following descriptions may focus on differences different from the configurations described using FIG. 1 to FIG. 6.

Referring to FIG. 28 to FIG. 31B, the semiconductor device according to some embodiments may further include a sheet pattern NS spaced apart from the first fin-type pattern 110 in the third direction D3. The first active area RX1 and the second active area RX2 may respectively correspond to the first fin-type pattern 110 and the second fin-type pattern 210. The fin trench FT may allow the first active area RX1 and the second active area RX2 to be distinguished from each other.

In some embodiments, the first active area RX1 may be an NMOS constituting area, and the second active area RX2 may be a PMOS constituting area. In some embodiments, the second active area RX2 may be an NMOS constituting area, and the first active area RX1 may be a PMOS constituting area.

The sheet pattern NS may be disposed on the first fin-type pattern 110 and may be spaced apart from the first fin-type pattern 110. The sheet pattern NS may include a plurality of sheets. Although the sheet pattern NS is shown to have three sheets, this is only for convenience of illustration. The present invention is not limited thereto. The sheet pattern NS may have a larger or smaller number of sheets (e.g., two sheets, four sheets, or five sheets).

The gate insulating film 130 may extend along and on the top surface of the first fin-type pattern 110 and the top surface 105us of the first lower field insulating film. The gate insulating film 130 may surround each of the sheets of the sheet pattern NS.

The first gate electrode 120 is disposed on the first fin-type pattern 110. The first gate electrode 120 extends so as to intersect the first fin-type pattern 110. The first gate electrode 120 may surround the gate insulating film 130 surrounding each of the sheets of the sheet pattern NS. The first gate electrode 120 may be disposed between the first fin-type pattern 110 and the sheet pattern NS and between adjacent sheets of the sheet pattern NS.

In some embodiments, the gate spacer 140 may include an outer spacer 141 and an inner spacer 142. The inner spacer 142 may be disposed between the first fin-type pattern 110 and the sheet pattern NS, and between the adjacent sheets of the sheet pattern NS as illustrated in FIG. 31A.

In some embodiments, the gate spacer 140 may include only the outer spacer 141. The inner spacer is not disposed between the first fin-type pattern 110 and the sheet pattern NS and between the adjacent sheets of the sheet pattern NS as illustrated in FIG. 31A.

The first epitaxial pattern 150 may be disposed between and be connected to sheet patterns NS adjacent to each other in the first direction D1.

Although not shown, a further sheet pattern may be spaced apart from the second fin-type pattern 210 in the third direction D3 and may be disposed on the second fin-type pattern 210. Further, description of the further sheet pattern on the second fin-type pattern 210 may be substantially the same as the description of the sheet pattern NS on the first fin-type pattern 110.

Figure 32:
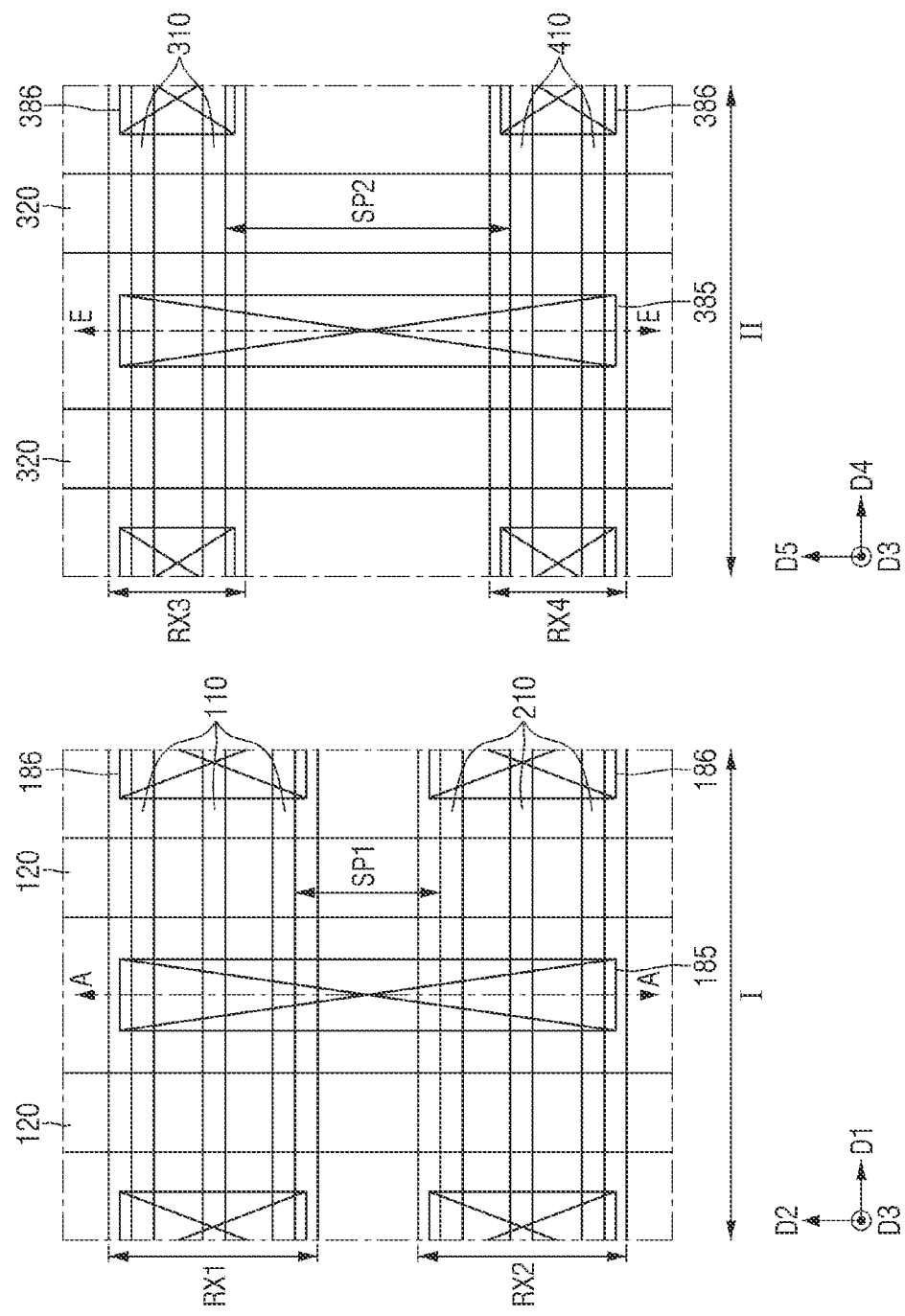
FIGS. 32, 33 and 34 are diagrams illustrating a semiconductor device according to some embodiments of the present invention.
Figure 33:
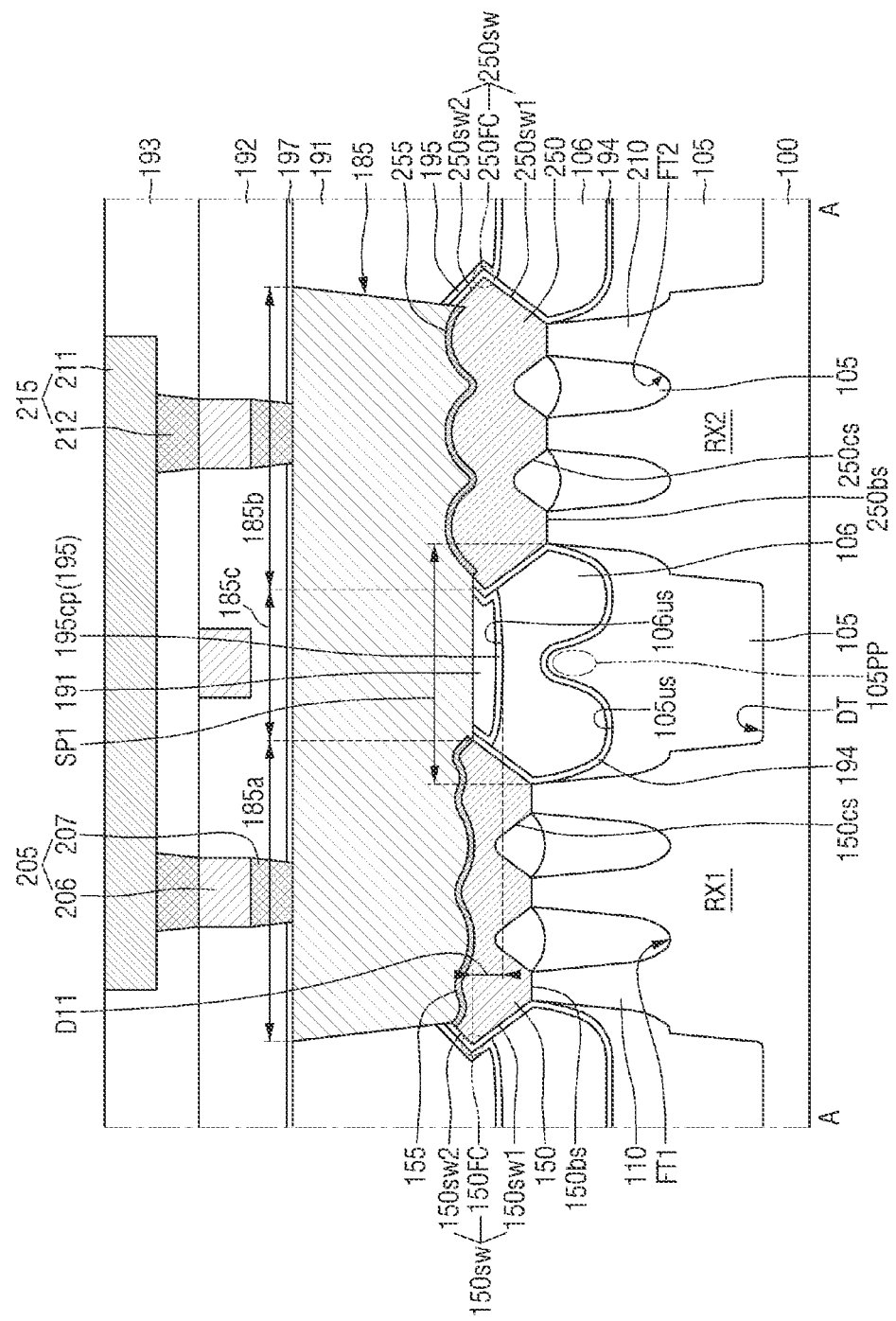
Figure 34:
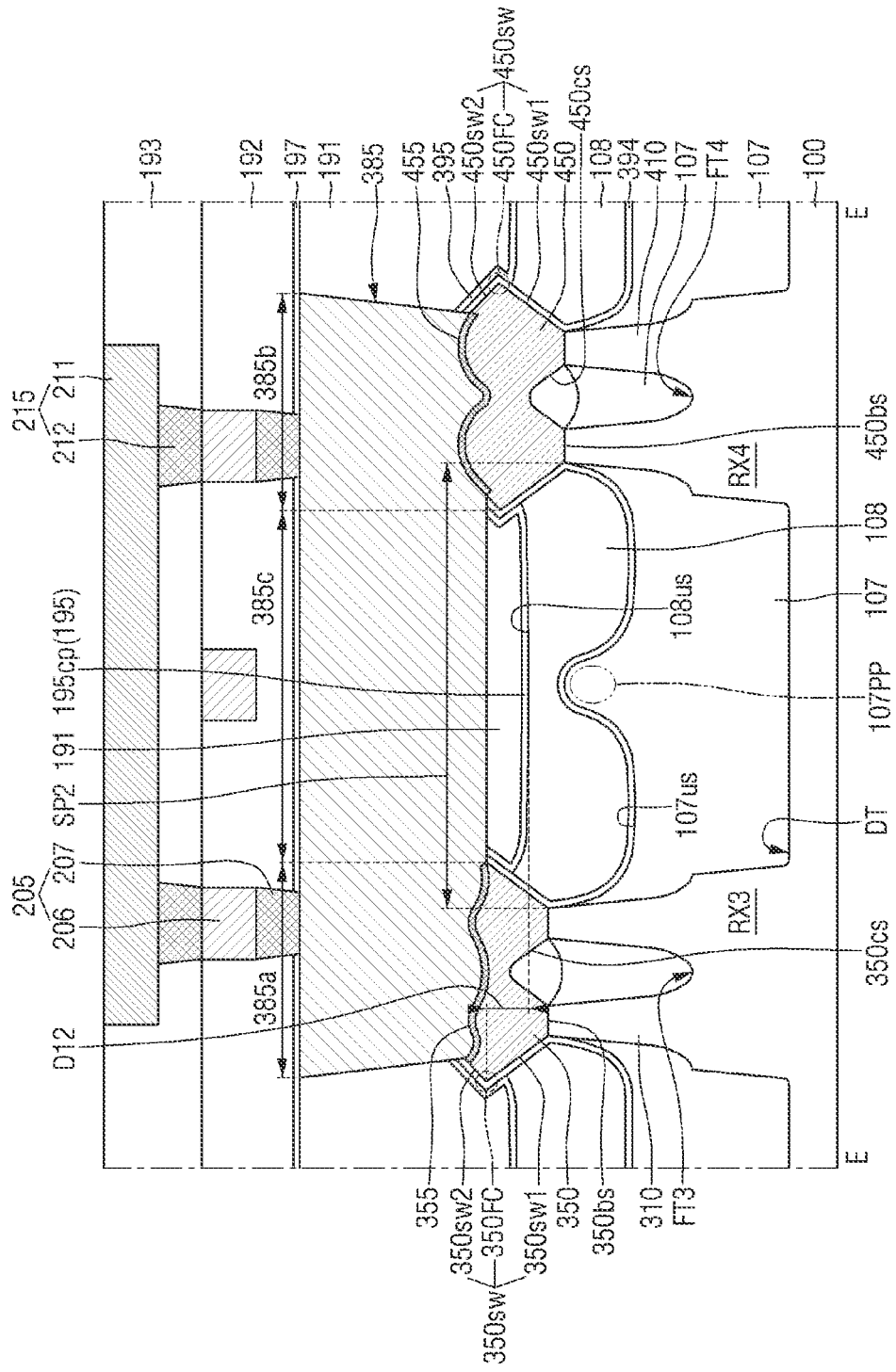

FIG. 32 to FIG. 34 are diagrams illustrating a semiconductor device according to some embodiments of the present invention. For reference, FIG. 32 are layout diagrams illustrating the semiconductor device according to some embodiments. FIG. 33 and FIG. 34 are cross-sectional views taken along lines A-A and E-E of FIG. 32, respectively. The layout diagram shown in a first area I of FIG. 32 may be substantially the same as the layout diagram of FIG. 1. Therefore, description of the first area I in FIG. 32 is mainly based on contents that are not described using FIG. 1 to FIG. 6.

Referring to FIG. 32 to FIG. 34, the semiconductor devices according to some embodiments may include the first fin-type pattern 110, the second fin-type pattern 210, a third fin-type pattern 310, a fourth fin-type pattern 410, the first lower field insulating film 105, the first upper field insulating film 106, a second lower field insulating film 107, a second upper field insulating film 108, the first gate electrode 120, a second gate electrode 320, the first epitaxial pattern 150, the second epitaxial pattern 250, a third epitaxial pattern 350, a fourth epitaxial pattern 450, the first lower epitaxial etch stop film 194, the first upper epitaxial etch stop film 195, a second lower epitaxial etch stop film 394, a second upper epitaxial etch stop film 395, the first connective source/drain contact 185, and a second connective source/drain contact 385.

The substrate 100 may include the first area I and the second area II. In some embodiments, the first area I and the second area II may be spaced apart from each other. In some embodiments, the first area I and the second area II may contact each other.

The first area I of the substrate 100 may include the first fin-type pattern 110, the second fin-type pattern 210, the first lower field insulating film 105, the first upper field insulating film 106, the first gate electrode 120, the first epitaxial pattern 150, the second epitaxial pattern 250, the first lower epitaxial etch stop film 194, the first upper epitaxial etch stop film 195, and the first connective source/drain contact 185.

In the first area I of the substrate 100, the first epitaxial pattern 150 and the second epitaxial pattern 250 may be spaced apart from each other in the second direction D2 by a first spacing SP1. The first spacing SP1 may be defined as the smallest one among spacings between the first fin-type patterns 110 and the second fin-type patterns 210. The first spacing SP1 may be a shortest distance between the first fin-type patterns 110 and the second fin-type patterns 210 in the second direction D2.

Further, a depth from the facet intersecting point 150FC of the first epitaxial pattern to the top surface 106us of the first upper field insulating film disposed between the first epitaxial pattern 150 and the second epitaxial pattern 250 may be a first depth D11.

The second area II of the substrate 100 may include the third fin-type pattern 310, the fourth fin-type pattern 410, the second lower field insulating film 107, the second upper field insulating film 108, the second gate electrode 320, the third epitaxial pattern 350, the fourth epitaxial pattern 450, the second lower epitaxial etch stop film 394, the second upper epitaxial etch stop film 395, and the second connective source/drain contact 385.

The third fin-type pattern 310 may be formed in a third active area RX3 of the substrate 100. The fourth fin-type pattern 410 may be formed in a fourth active area RX4 of the substrate 100. Each of the third fin-type patterns 310 distinguished from each other via a third fin trench FT3 may extend in an elongated manner along a fourth direction D4. Each of the fourth fin-type patterns 410 distinguished from each other via a fourth fin trench FT4 may extend in an elongated manner along the fourth direction D4. The third fin-type pattern 310 and the fourth fin-type pattern 410 may be spaced apart from each other in a fifth direction D5. The fourth direction D4 may intersect each of the fifth direction D5 and the third direction D3.

Descriptions of the third active area RX3 and the fourth active area RX4 may be substantially the same as the descriptions of the first active area RX1 and the second active area RX2. Descriptions of the third fin-type pattern 310 and the fourth fin-type pattern 410 may be substantially the same as the descriptions the first fin-type pattern 110 and the second fin-type pattern 210. Although each of the number of the third fin-type patterns 310 and the number of the fourth fin-type patterns 410 are shown as being two, the present invention is not limited thereto.

The second lower field insulating film 107 may be formed on the substrate 100. The second lower field insulating film 107 may fill the deep trench DT. The second lower field insulating film 106 may fill a portion of the third fin trench FT3 and a portion of the fourth fin trench FT4. The second lower field insulating film 107 may include a second protrusion 107PP protruding in the third direction D3.

The second protrusion 107PP of the second lower field insulating film may be disposed in an area overlapping a bottom surface of the deep trench DT in the third direction D3. The top surface 107us of the second lower field insulating film may include a portion having a concave shape and a portion having a convex shape.

The second lower epitaxial etch stop film 394 may be disposed on the second lower field insulating film 107. The second lower epitaxial etch stop film 394 may extend along and on the top surface 107us of the second lower field insulating film.

The second upper field insulating film 108 may be disposed on the second lower epitaxial etch stop film 394. The second upper field insulating film 108 may be formed on a portion of the substrate 100 between the second gate electrodes 320. However, the second upper field insulating film 108 may not be formed on a portion of the substrate 100 overlapping the second gate electrode 320 in the third direction D3.

Descriptions of the second lower field insulating film 107, the second lower epitaxial etch stop film 394 and the second upper field insulating film 108 may be substantially the same as the descriptions of the first lower field insulating film 105, the first lower epitaxial etch stop film 194 and the first upper field insulating film 106.

The second gate electrode 320 may be disposed on the second lower field insulating film 107. The second gate electrode 320 may extend so as to intersect with the third fin-type pattern 310 and the fourth fin-type pattern 410.

The third epitaxial pattern 350 may be disposed on the third fin-type pattern 310. The third epitaxial pattern 350 may be disposed between the second gate electrodes 320 adjacent to each other in the fourth direction D4. The third epitaxial pattern 350 may be connected to the third fin-type pattern 310. The third epitaxial pattern 350 may be disposed in the third active area RX3.

The fourth epitaxial pattern 450 may be disposed on the fourth fin-type pattern 410. The fourth epitaxial pattern 450 may be connected to the fourth fin-type pattern 410. The fourth epitaxial pattern 450 may be disposed in the fourth active area RX4. The fourth epitaxial pattern 450 may be spaced apart from the third epitaxial pattern 350 in the fifth direction D5. That is, the fourth epitaxial pattern 450 may not be directly connected to the third epitaxial pattern 350.

The third epitaxial pattern 350 may include a bottom surface 350bs, a sidewall 350sw, and a connective surface 350cs. The sidewall 350sw of the third epitaxial pattern may include a lower sidewall 350sw1, an upper sidewall 350sw2, and a facet intersecting point 350FC.

The fourth epitaxial pattern 450 may include a bottom surface 450bs, a sidewall 450sw, and a connective surface 450cs. The sidewall 450sw of the fourth epitaxial pattern may include a lower sidewall 450sw1, an upper sidewall 450sw2, and a facet intersecting point 450FC.

Descriptions of the third epitaxial pattern 350 and the fourth epitaxial pattern 450 may be substantially the same as the descriptions of the first epitaxial pattern 150 and the second epitaxial pattern 250, and thus will be omitted below.

A vertical level of the top surface 108us of the second upper field insulating film based on the top surface of the substrate 100 may be higher than that of each of the bottom surface 350bs of the third epitaxial pattern and the bottom surface 450sw of the fourth epitaxial pattern based on the top surface of the substrate 100. The vertical level of the top surface 108us of the second upper field insulating film may be lower than or equal to that of each of the facet intersecting point 350FC of the third epitaxial pattern and the facet intersecting point 450FC of the fourth epitaxial pattern.

In the semiconductor device according to some embodiments, a vertical dimension from a bottom surface of the third fin trench FT3 to the bottom surface 350bs of the third epitaxial pattern may be larger than a vertical dimension from a bottom surface of the fourth fin trench FT4 to the bottom surface 450bs of the fourth epitaxial pattern. A vertical dimension from the bottom surface of the third fin trench FT3 to the facet intersecting point 350FC of the third epitaxial pattern may be different from a vertical dimension from the bottom surface of the fourth fin trench FT4 to the facet intersecting point 450FC of the fourth epitaxial pattern.

In the second area II of the substrate 100, the third epitaxial pattern 350 and the fourth epitaxial pattern 450 may be spaced apart in the fifth direction D5 by a second spacing SP2. The second spacing SP2 may be defined as the smallest one among spacings between the third fin-type patterns 310 and the fourth fin-type patterns 410. The second spacing SP2 may be a shortest distance between the third fin-type patterns 310 and the fourth fin-type patterns 410 in the fifth direction D5.

Further, a depth from the facet intersecting point 350FC of the third epitaxial pattern to the top surface 108us of the second upper field insulating film disposed between the third epitaxial pattern 350 and the fourth epitaxial pattern 450 may be a second depth D12. When the top surface 108us of the second upper field insulating film disposed between the third epitaxial pattern 350 and the fourth epitaxial pattern 450 has a W-shape as shown in FIG. 18, the second depth D12 may be a depth from the facet intersecting point 350FC of the third epitaxial pattern to the bottommost portion of the top surface 108us of the second upper field insulating film.

The second lower epitaxial etch stop film 394 may extend along and on the top surface 107us of the second lower field insulating film, a portion of the sidewall 350sw of the third epitaxial pattern, and a portion of the sidewall 450sw of the fourth epitaxial pattern. The second upper field insulating film 108 may cover a portion of the sidewall 350sw of the third epitaxial pattern and a portion of the sidewall 450sw of the fourth epitaxial pattern. A vertical level of the top surface 108us of the second upper field insulating film based on the top surface of the substrate 100 may be higher than that of each of the bottom surface 350bs of the third epitaxial pattern and the bottom surface 450bs of the fourth epitaxial pattern based on the top surface of the substrate 100. The second upper epitaxial etch stop film 395 may extend along the top surface 108us of the second upper field insulating film, the sidewall 350sw of the third epitaxial pattern, and the sidewall 450sw of the fourth epitaxial pattern. The second upper epitaxial etch stop film 395 may contact the second upper field insulating film 108. The second lower epitaxial etch stop film 394 includes the same material as that of the first lower epitaxial etch stop film 194. The second upper epitaxial etch stop film 395 includes the same material as that of the first upper epitaxial etch stop film 195. Descriptions of the second lower epitaxial etch stop film 394 and the second upper epitaxial etch stop film 395 are substantially the same as the descriptions of the first lower epitaxial etch stop film 194 and the first upper epitaxial etch stop film 195, and thus will be omitted below.

The second connective source/drain contact 385 may be disposed on the third epitaxial pattern 350 and the fourth epitaxial pattern 450. The second source/drain contact 386 may be disposed on one of the third epitaxial pattern 350 and the fourth epitaxial pattern 450. A third silicide film 355 may be formed between the second connective source/drain contact 385 and the third epitaxial pattern 350. A fourth silicide film 455 may be formed between the second connective source/drain contact 385 and the fourth epitaxial pattern 450.

The second connective source/drain contact 385 may be formed on and along the third epitaxial pattern 350 and the fourth epitaxial pattern 450 and on and along a portion between the third epitaxial pattern 350 and the fourth epitaxial pattern 450. For example, the second connective source/drain contact 385 may include a third sub-contact portion 385a, a fourth sub-contact portion 385b, and a second contact connective portion 385c. Description of the second connective source/drain contact 385 is substantially the same as the description of the first connective source/drain contact 185 and is omitted below.

The first active area RX1 and the third active area RX3 may be areas in which transistors of the same conductivity-type are formed, respectively. The second active area RX2 and the fourth active area RX4 may be areas in which transistors of the same conductivity-type are formed, respectively. In the semiconductor device according to some embodiments, each of the first active area RX1 and the third active area RX3 may be a NMOS constituting area, while each of the second active area RX2 and the fourth active area RX4 may be a PMOS constituting area.

In the semiconductor device according to some embodiments, the spacing SP1 between the first epitaxial pattern 150 and the second epitaxial pattern 250 in the second direction D2 may be smaller than the spacing SP2 between the third epitaxial pattern 350 and the fourth epitaxial pattern 450 in the fifth direction D5. In this connection, the first depth D11 from the facet intersecting point 150FC of the first epitaxial pattern to the top surface 106us of the first upper field insulating film may be smaller than the second depth D12 from the facet intersecting point 350FC of the third epitaxial pattern to the top surface 108us of the second upper field insulating film.

FIG. 35 to FIG. 43 are diagrams illustrating methods of manufacturing a semiconductor device according to some embodiments of the present invention.

Figure 35:
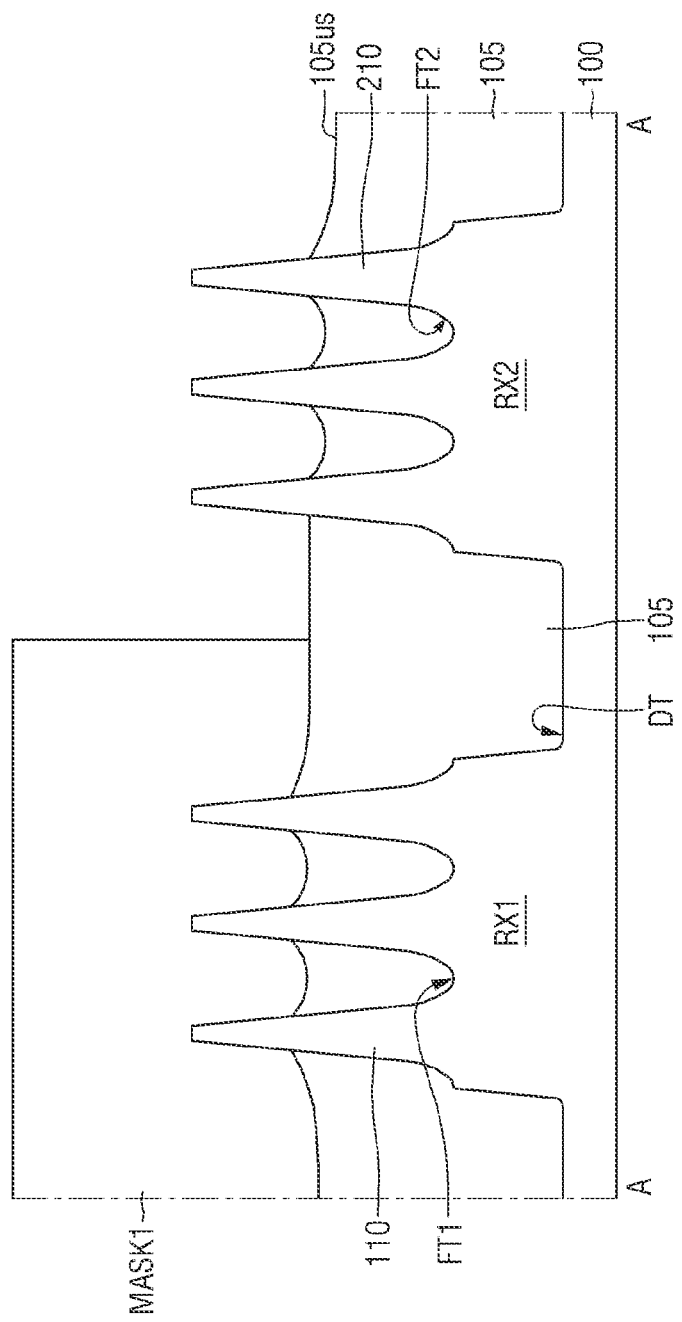
FIGS. 35, 36, 37, 38, 39, 40, 41, 42 and 43 are diagrams illustrating methods of manufacturing a semiconductor device according to some embodiments of the present invention.

Referring to FIG. 35, the first fin-type pattern 110 and the second fin-type pattern 210 protruding upward beyond the top surface 105us of the first lower field insulating film may be formed on the substrate 100. The first fin-type pattern 110 may be disposed in the first active area RX1, and the second fin-type pattern 210 may be disposed in the second active area RX2.

A first mask pattern MASK1 covering the first fin-type pattern 110 may be formed on the first lower field insulating film 105.

Figure 36:
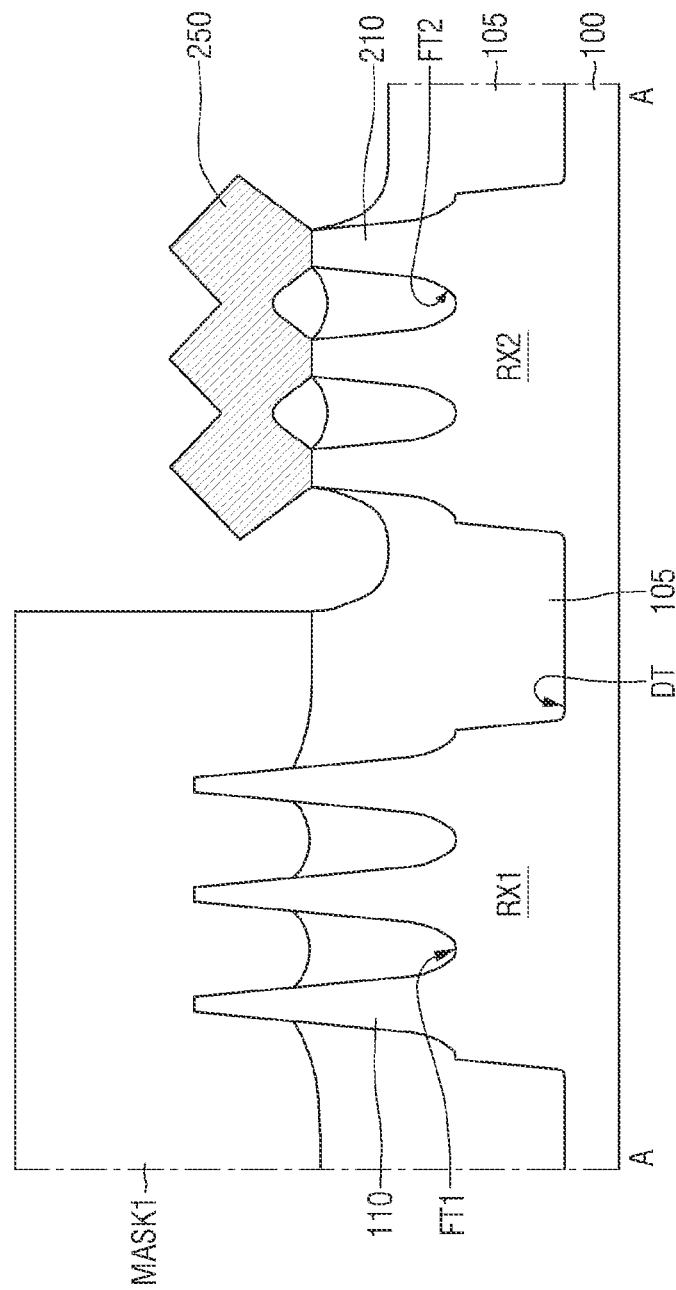

Referring to FIG. 36, using the first mask pattern MASK1 as a mask, at least a portion of the second fin-type pattern 210 that protrudes upward beyond the top surface 105us of the first lower field insulating film may be removed. While removing the at least a portion of the second fin-type pattern 210, an exposed portion of the first lower field insulating film 105 may also be etched.

Subsequently, the second epitaxial pattern 250 connected to the second fin-type pattern 210 is formed on the second fin-type pattern 210. After the second epitaxial pattern 250 is formed, the first mask pattern MASK1 may be removed. Although not shown, the second epitaxial inserted liner (e.g., 256 of FIG. 14) may be further formed on the second epitaxial pattern 250.

Figure 37:
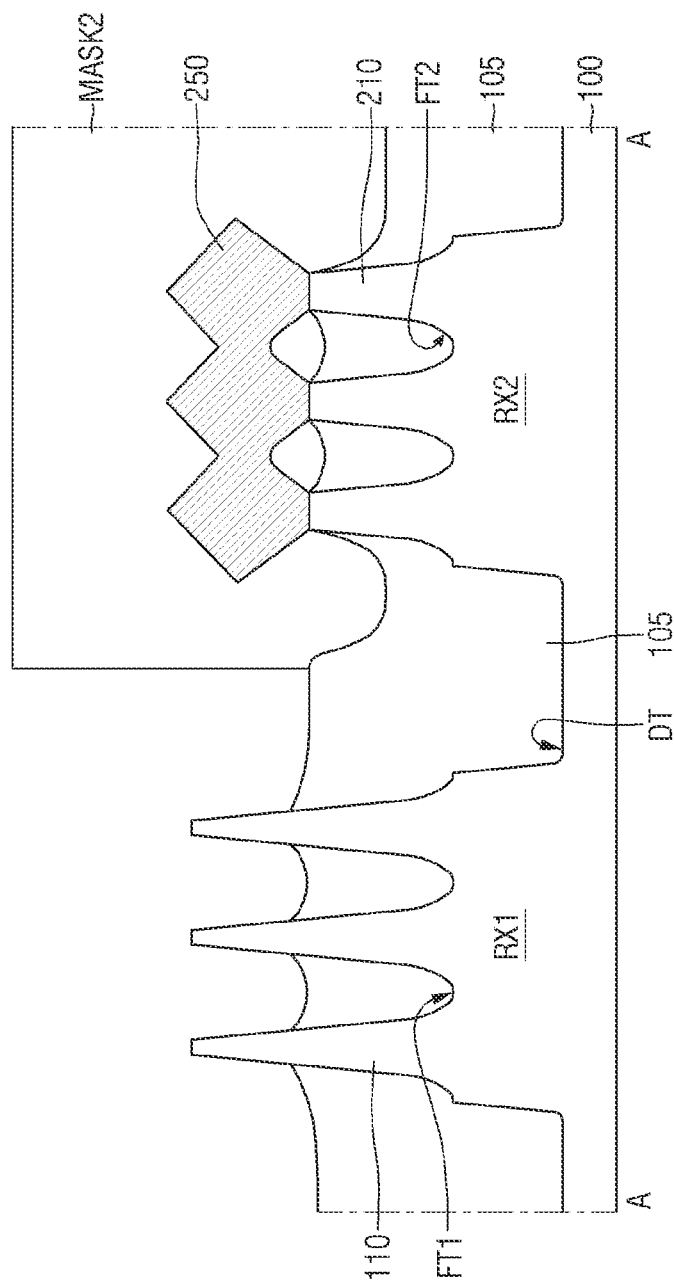

Referring to FIG. 37, the second mask pattern MASK2 covering the second epitaxial pattern 250 may be formed on the first lower field insulating film 105.

Figure 38:
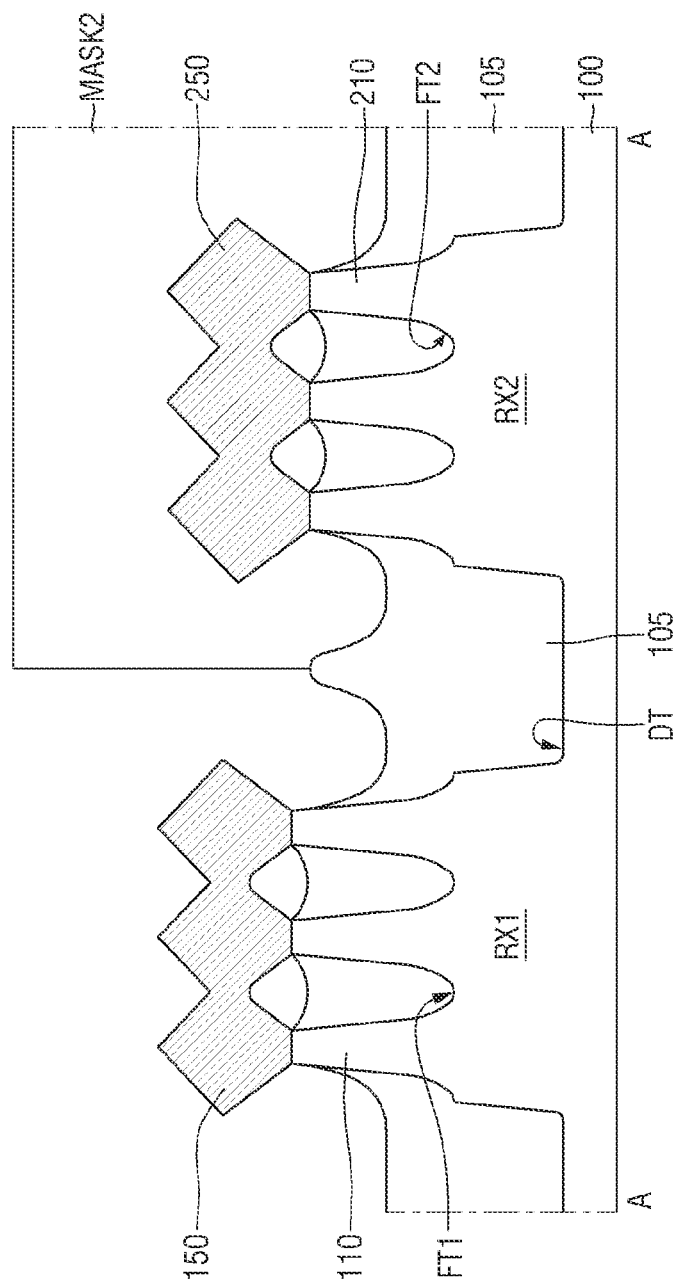
Figure 39:
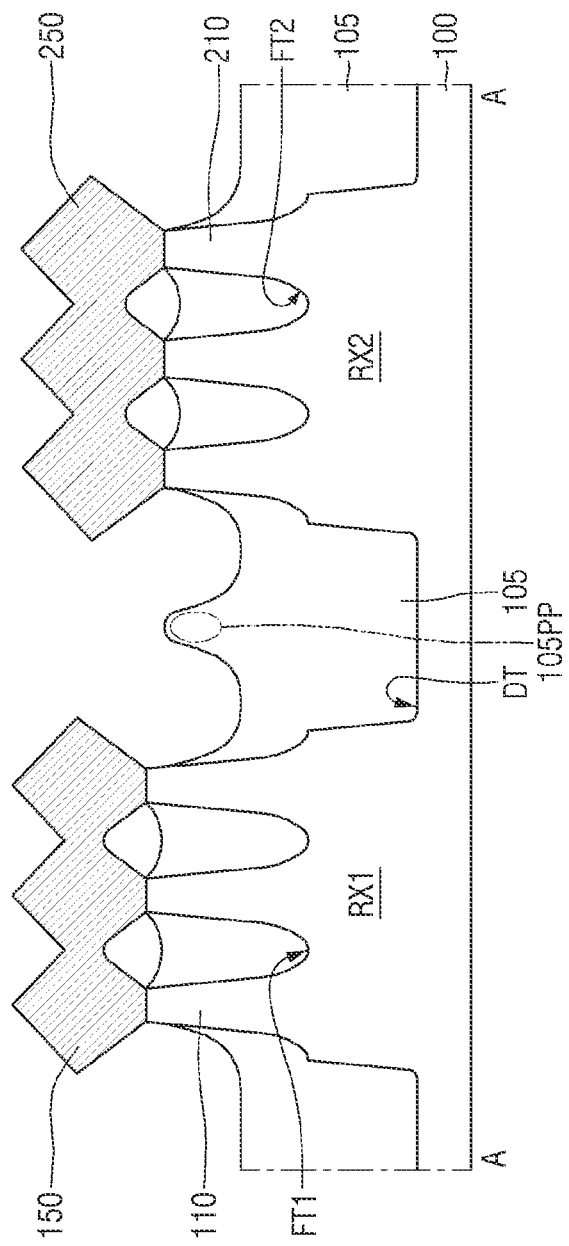

Referring to FIG. 38 and FIG. 39, using the second mask pattern MASK2 as a mask, at least a portion of the first fin-type pattern 110 protruding upward beyond the top surface 105us of the first lower field insulating film may be removed. While removing the at least a portion of the first fin-type pattern 110, an exposed portion of the first lower field insulating film 105 may also be etched.

Subsequently, the first epitaxial pattern 150 connected to the first fin-type pattern 110 is formed on the first fin-type pattern 110. After the first epitaxial pattern 150 is formed, the second mask pattern MASK2 may be removed. Although not shown, the first epitaxial inserted liner (e.g., 156 of FIG. 14) may be further formed on the first epitaxial pattern 150. Further, the first epitaxial inserted liner 156 may also be formed on the second epitaxial inserted liner (e.g., 256 in FIG. 14). In such a case, the second epitaxial inserted liner (e.g., 256 of FIG. 14) may include the first epitaxial inserted liner 156 and the second epitaxial inserted liner 256 as described in FIG. 14.

While forming the first epitaxial pattern 150 and the second epitaxial pattern 250, the first lower field insulating film 105 including the first protrusion 105PP may be formed as illustrated in FIG. 39.

Figure 40:
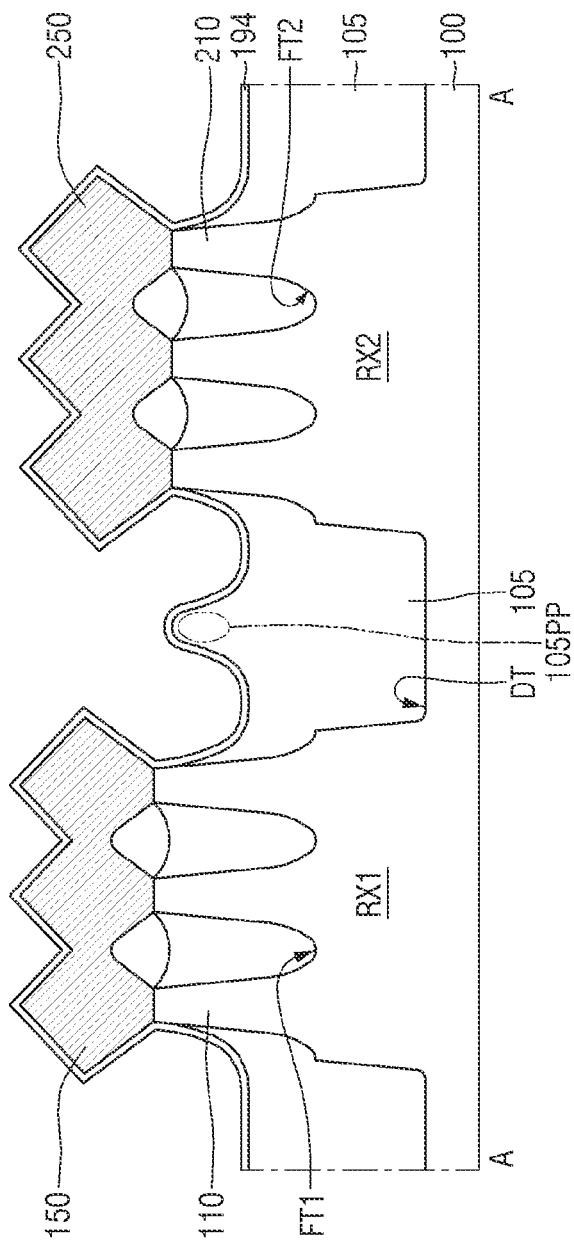

Referring to FIG. 40, the first lower epitaxial etch stop film 194 may be formed along and on the top surface 105us of the first lower field insulating film, a profile of the first epitaxial pattern 150, and a profile of the second epitaxial pattern 250.

Figure 41:
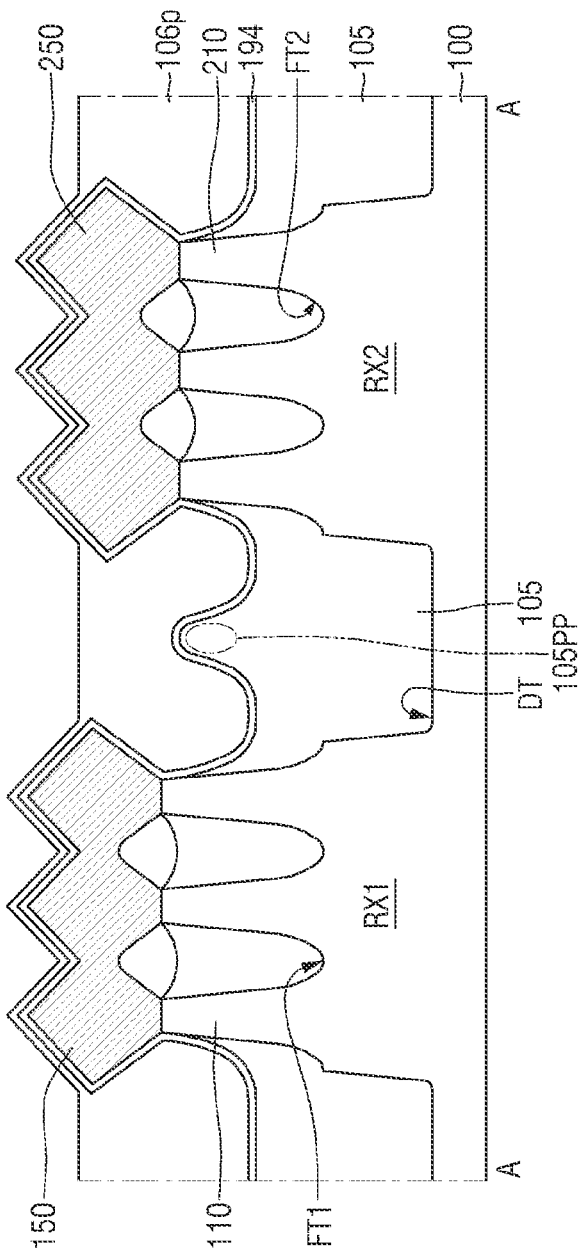

Referring to FIG. 41, a pre-upper field insulating film 106p is formed on the first lower epitaxial etch stop film 194.

The pre-upper field insulating film 106p may be formed on the first lower field insulating film 105 so as to have a large thickness. However, the pre-upper field insulating film 106p may be formed on the first epitaxial pattern 150 and the second epitaxial pattern 250 so as to have a small thickness.

In some embodiments, the pre-upper field insulating film 106p may be formed using an inhibitor containing fluorine (F) and nitrogen (N). The fluorine contained in the inhibitor may be adsorbed into the first lower epitaxial etch stop film 194. Further, the fluorine contained in the inhibitor may diffuse into the pre-upper field insulating film 106*p*. The present invention is not limited thereto.

Figure 42:
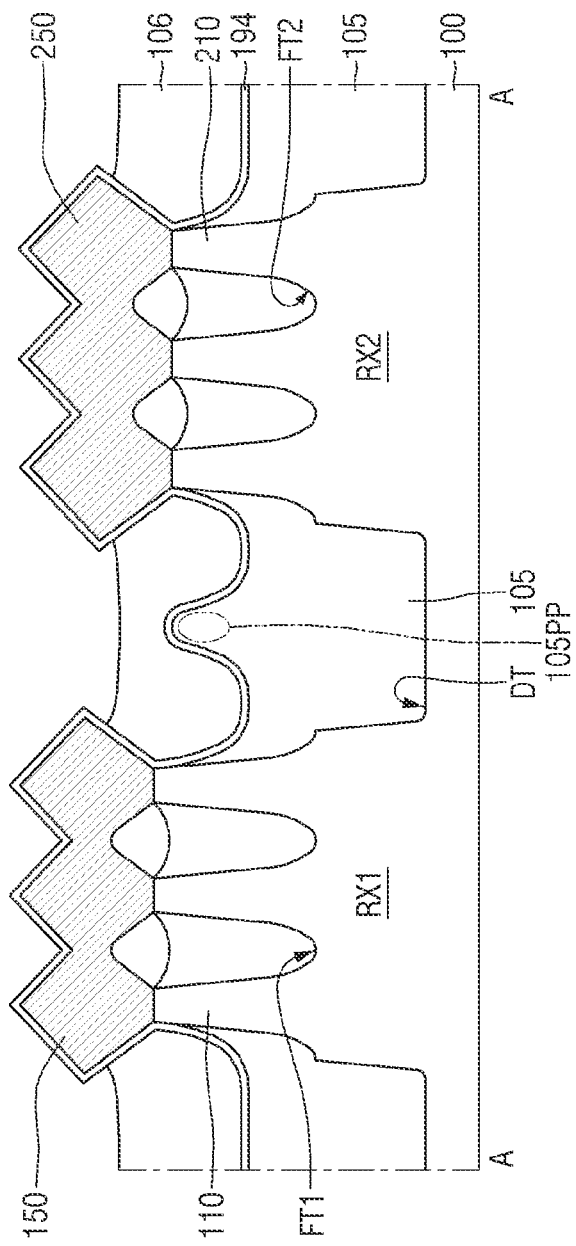

Referring to FIG. 42, the first upper field insulating film 106 may be formed on the first lower epitaxial etch stop film 194 by removing a portion of the pre-upper field insulating film 106*p*.

The first upper field insulating film 106 may cover a portion of the sidewall (e.g., 150*sw* in FIG. 2) of the first epitaxial pattern and a portion of the sidewall (e.g., 250*sw* in FIG. 2) of the second epitaxial pattern. A vertical level of the top surface of the first upper field insulating film 106 may be lower than that of each of the facet intersecting point (e.g., 150FC of FIG. 2) of the first epitaxial pattern and the facet intersecting point (e.g., 250FC of FIG. 2) of the second epitaxial pattern. The first upper field insulating film 106 may not cover the upper sidewall (e.g., 150*sw*2 in FIG. 2) of the first epitaxial pattern and the upper sidewall (e.g., 250*sw*2 in FIG. 2) of the second epitaxial pattern. The first upper field insulating film 106 may cover a portion of the first lower epitaxial etch stop film 194.

Figure 43:
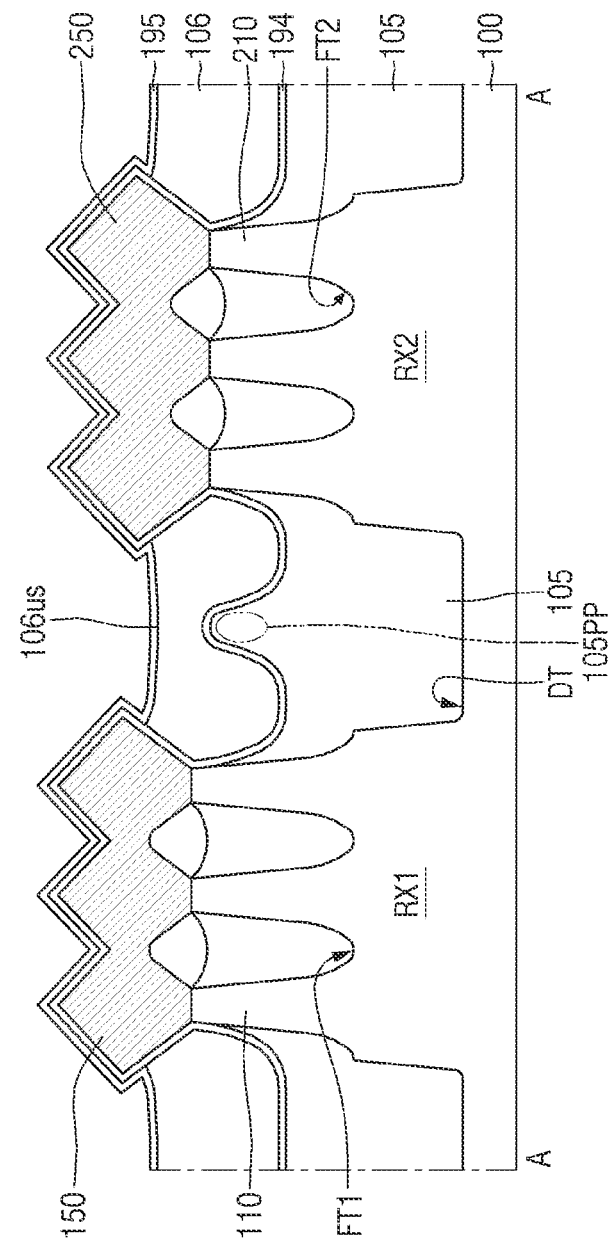

Referring to FIG. 43, the first upper epitaxial etch stop film 195 is formed on the first upper field insulating film 106 and the first lower epitaxial etch stop film 194.

The first upper epitaxial etch stop film 195 extends along and on the top surface 106*us* of the first upper field insulating film. Further, the first upper epitaxial etch stop film 195 is formed on a portion of the first lower epitaxial etch stop film 194 not covered with the first upper field insulating film 106. The first upper epitaxial etch stop film 195 may be formed along and on a profile of the portion of the first lower epitaxial etch stop film 194 not covered with the upper field insulating film 106.

Subsequently, the first interlayer insulating film (e.g., 191 of FIG. 2) may be formed and then the first connective source/drain contact (e.g., 185 of FIG. 2) may be formed. The first connective source/drain contact 185 extends through the first upper epitaxial etch stop film 195 and the first lower epitaxial etch stop film 194.

In concluding the detailed description, those skilled in the art will appreciate that many variations and modifications may be made to the embodiments described herein without substantially departing from the scope of the present invention. Therefore, the embodiments described herein are to be considered illustrative, and not restrictive, and the present invention shall not be restricted or limited by the foregoing detailed description.

What is claimed is:

1. A semiconductor device comprising:
    a first fin-type pattern on a substrate and extending in a first direction;
    a second fin-type pattern on the substrate, wherein the second fin-type pattern is spaced apart from the first fin-type pattern in a second direction and extends in the first direction;
    a first epitaxial pattern on and connected to the first fin-type pattern;
    a second epitaxial pattern on and connected to the second fin-type pattern, wherein the second epitaxial pattern is spaced apart from the first epitaxial pattern;
    a lower field insulating film on the substrate and extending on a sidewall of the first fin-type pattern and a sidewall of the second fin-type pattern, wherein the lower field insulating film includes a protrusion protruding in a third direction;
    a lower epitaxial etch stop film extending along a top surface of the lower field insulating film, a sidewall of the first epitaxial pattern, and a sidewall of the second epitaxial pattern;
    an upper field insulating film on the lower epitaxial etch stop film and extending on a portion of the sidewall of the first epitaxial pattern and a portion of the sidewall of the second epitaxial pattern;
    an upper epitaxial etch stop film extending along a top surface of the upper field insulating film; and
    a source/drain contact on and connected to the first epitaxial pattern and the second epitaxial pattern,
    wherein the protrusion of the lower field insulating film is between the first fin-type pattern and the second fin-type pattern, and
    wherein a vertical level of a top surface of the protrusion of the lower field insulating film increases and then decreases with increasing distance from the sidewall of the first fin-type pattern.

2. The semiconductor device of claim 1, wherein a vertical level of the top surface of the upper field insulating film is higher than each of a vertical level of a bottom surface of the first epitaxial pattern and a vertical level of a bottom surface of the second epitaxial pattern.

3. The semiconductor device of claim 1, wherein each of the first epitaxial pattern and the second epitaxial pattern includes a facet intersecting point at which a lower sidewall and an upper sidewall thereof converge outwardly, and
    wherein a vertical level of the top surface of the upper field insulating film is lower than or equal to a vertical level of each of the facet intersecting point of the first epitaxial pattern and the facet intersecting point of the second epitaxial pattern.

4. The semiconductor device of claim 1, further comprising a first epitaxial liner that is between the first epitaxial pattern and the lower epitaxial etch stop film,
    wherein the first epitaxial liner extends along the sidewall of the first epitaxial pattern.

5. The semiconductor device of claim 4, further comprising a second epitaxial liner that is between the second epitaxial pattern and the lower epitaxial etch stop film, and the second epitaxial liner extends along the sidewall of the second epitaxial pattern,
    wherein a thickness of the first epitaxial liner is different from a thickness of the second epitaxial liner.

6. The semiconductor device of claim 1, wherein a spacing between the sidewall of the first fin-type pattern and a width central line of the protrusion of the lower field insulating film is equal to a spacing between the sidewall of the second fin-type pattern and the width central line of the protrusion of the lower field insulating film, and the width central line of the protrusion of the lower field insulating film extends in the third direction and passes through a topmost end of the protrusion of the lower field insulating film.

7. The semiconductor device of claim 1, wherein a spacing between the sidewall of the first fin-type pattern and a width central line of the protrusion of the lower field insulating film is greater than a spacing between the sidewall of the second fin-type pattern and the width central line of the protrusion of the lower field insulating film, and the width central line of the protrusion of the lower field insulating film extends in the third direction and passes through a topmost end of the protrusion of the lower field insulating film.

8. The semiconductor device of claim 1, wherein a fluorine concentration in the lower epitaxial etch stop film is greater than a fluorine concentration in the upper field insulating film.

9. The semiconductor device of claim 1, wherein the source/drain contact comprises a portion that is between the first epitaxial pattern and the second epitaxial pattern and is in contact with the upper epitaxial etch stop film.

10. The semiconductor device of claim 1, wherein the first fin-type pattern is in a pMOS area, and the second fin-type pattern is in a nMOS area.

11. The semiconductor device of claim 1, further comprising:
a gate electrode traversing the first fin-type pattern; and
a sheet pattern spaced apart from the first fin-type pattern and surrounded by the gate electrode.

12. A semiconductor device comprising:
a first fin-type pattern on a substrate and extending in a first direction;
a second fin-type pattern on the substrate, wherein the second fin-type pattern is spaced apart from the first fin-type pattern in a second direction and extends in the first direction;
a first epitaxial pattern on and connected to the first fin-type pattern;
a second epitaxial pattern on and connected to the second fin-type pattern, wherein the second epitaxial pattern is spaced apart from the first epitaxial pattern;
a lower field insulating film on the substrate and extending on a sidewall of the first fin-type pattern and a sidewall of the second fin-type pattern;
a lower epitaxial etch stop film extending along a top surface of the lower field insulating film, a sidewall of the first epitaxial pattern, and a sidewall of the second epitaxial pattern;
a first epitaxial liner between the first epitaxial pattern and the lower epitaxial etch stop film and extending along the sidewall of the first epitaxial pattern;
a second epitaxial liner between the second epitaxial pattern and the lower epitaxial etch stop film and extending along the sidewall of the second epitaxial pattern, wherein a thickness of the second epitaxial liner is different from a thickness of the first epitaxial liner;
an upper field insulating film on the lower epitaxial etch stop film and extending on a portion of the sidewall of the first epitaxial pattern and a portion of the sidewall of the second epitaxial pattern;
an upper epitaxial etch stop film extending along a top surface of the upper field insulating film;
a first source/drain contact on and connected to the first epitaxial pattern; and
a second source/drain contact on and connected to the second epitaxial pattern.

13. The semiconductor device of claim 12, wherein the lower field insulating film includes a protrusion that is between the first fin-type pattern and the second fin-type pattern, and
wherein a vertical level of a top surface of the protrusion of the lower field insulating film increases and then decreases with increasing distance from the sidewall of the first fin-type pattern.

14. The semiconductor device of claim 13, wherein the top surface of the upper field insulating film comprises a portion that is between the first fin-type pattern and the second fin-type pattern and has a concave shape.

15. The semiconductor device of claim 13, wherein the top surface of the upper field insulating film comprises a portion that is between the first fin-type pattern and the second fin-type pattern and includes a first portion having a concave shape and a second portion having a convex shape.

16. The semiconductor device of claim 12, wherein the first source/drain contact and the second source/drain contact are directly connected to each other.

17. A semiconductor device comprising:
a first fin-type pattern in a pMOS area of a substrate and extending in a first direction, wherein the first fin-type pattern is defined by a first fin trench;
a second fin-type pattern in an nMOS area of the substrate and spaced apart from the first fin-type pattern in a second direction, wherein the second fin-type pattern extends in the first direction and is defined by a second fin trench;
a first epitaxial pattern on and connected to the first fin-type pattern;
a second epitaxial pattern on and connected to the second fin-type pattern, wherein the second epitaxial pattern is spaced apart from the first epitaxial pattern;
a lower field insulating film on the substrate and extending on a sidewall of the first fin-type pattern and a sidewall of the second fin-type pattern, wherein the lower field insulating film includes a protrusion protruding in a third direction, and wherein the protrusion of the lower field insulating film is between the first fin-type pattern and the second fin-type pattern;
a lower epitaxial etch stop film extending along a top surface of the lower field insulating film, a sidewall of the first epitaxial pattern, and a sidewall of the second epitaxial pattern;
an upper field insulating film on the lower epitaxial etch stop film and extending on a portion of the sidewall of the first epitaxial pattern and a portion of the sidewall of the second epitaxial pattern;
an upper epitaxial etch stop film extending along a top surface of the upper field insulating film; and
a source/drain contact on and connected to the first epitaxial pattern and the second epitaxial pattern,
wherein the source/drain contact includes a first portion overlapping the first fin-type pattern in the third direction and a second portion overlapping the second fin-type pattern in a vertical direction, and
wherein a distance in the third direction from a bottom surface of the first fin trench to a bottom surface of the first portion of the source/drain contact is greater than a distance in the third direction from a bottom surface of the second fin trench to a bottom surface of the second portion of the source/drain contact.

18. The semiconductor device of claim 17, wherein a vertical level of a top surface of the protrusion of the lower field insulating film increases and then decreases with increasing distance from the sidewall of the first fin-type pattern.

19. The semiconductor device of claim 17, wherein a distance in the third direction from the bottom surface of the first fin trench to a bottom surface of the first epitaxial pattern is smaller than a distance in the third direction from the bottom surface of the second fin trench to a bottom surface of the second epitaxial pattern.

20. The semiconductor device of claim 17, wherein the first epitaxial pattern includes a facet intersecting point at which a lower sidewall and an upper sidewall of the first epitaxial pattern converge outwardly, and wherein a vertical level of the top surface of the upper field insulating film is higher than a vertical level of a bottom surface of the first epitaxial pattern and is lower than a vertical level of the facet intersecting point of the first epitaxial pattern.

* * * * *